US011331900B2

(12) United States Patent
Nakamura et al.

(10) Patent No.: US 11,331,900 B2
(45) Date of Patent: May 17, 2022

(54) LITHOGRAPHIC PRINTING PLATE PRECURSOR AND METHOD FOR PRODUCING LITHOGRAPHIC PRINTING PLATE

(71) Applicant: FUJIFILM Corporation, Tokyo (JP)

(72) Inventors: Ryo Nakamura, Shizuoka (JP); Kenjiro Araki, Shizuoka (JP); Shuji Hirano, Shizuoka (JP); Koji Sonokawa, Shizuoka (JP); Yuuya Miyagawa, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 136 days.

(21) Appl. No.: 16/698,964

(22) Filed: Nov. 28, 2019

(65) Prior Publication Data

US 2020/0164629 A1 May 28, 2020

Related U.S. Application Data

(63) Continuation of application No. PCT/JP2018/020830, filed on May 30, 2018.

(30) Foreign Application Priority Data

May 31, 2017 (JP) .............................. JP2017-108565
Sep. 27, 2017 (JP) .............................. JP2017-186808

(51) Int. Cl.
G03F 7/32 (2006.01)
B41C 1/10 (2006.01)
G03F 7/029 (2006.01)
G03F 7/20 (2006.01)
G03F 7/30 (2006.01)

(52) U.S. Cl.
CPC ............ B41C 1/1008 (2013.01); G03F 7/029 (2013.01); B41C 2210/04 (2013.01); B41C 2210/06 (2013.01); B41C 2210/08 (2013.01); B41C 2210/24 (2013.01); B41C 2210/26 (2013.01); G03F 7/20 (2013.01); G03F 7/30 (2013.01)

(58) Field of Classification Search
CPC ................................................. G03F 7/0043
See application file for complete search history.

(56) References Cited

U.S. PATENT DOCUMENTS

| 6,319,660 B1 | 11/2001 | Allway et al. |
| 2002/0042033 A1 | 4/2002 | Allway et al. |
| 2003/0084806 A1 | 5/2003 | Kunita et al. |
| 2003/0170566 A1 | 9/2003 | Yamasaki et al. |
| 2005/0048399 A1 | 3/2005 | Kawauchi et al. |
| 2005/0170282 A1 | 8/2005 | Inno et al. |
| 2007/0092836 A1 | 4/2007 | Inno et al. |
| 2009/0011363 A1 | 1/2009 | Baumann et al. |
| 2009/0087790 A1 | 4/2009 | Nakamura |
| 2010/0248140 A1 | 9/2010 | Kuramoto |
| 2011/0076613 A1* | 3/2011 | Yoshida ............... C08K 5/0025 430/270.1 |
| 2012/0160118 A1 | 6/2012 | Oohashi et al. |
| 2013/0014658 A1 | 1/2013 | Sato et al. |
| 2014/0377705 A1 | 12/2014 | Koyama et al. |
| 2016/0334705 A1* | 11/2016 | Kamiya ............... B41C 1/1008 |
| 2017/0021656 A1 | 1/2017 | Ray et al. |
| 2018/0009212 A1 | 1/2018 | Saito |
| 2018/0154671 A1 | 6/2018 | Inasaki et al. |

FOREIGN PATENT DOCUMENTS

| CN | 1260514 | 7/2000 | |
| CN | 1374559 | 10/2002 | |
| CN | 1422743 | 6/2003 | |
| CN | 1519649 | 8/2004 | |
| CN | 1591183 | 3/2005 | |
| CN | 1644393 | 7/2005 | |
| CN | 101398622 | 4/2009 | |
| CN | 102529310 | 7/2012 | |
| CN | 102540730 | 7/2012 | |
| CN | 102834779 | 12/2012 | |
| CN | 104136995 | 11/2014 | |
| EP | 0950513 | 10/1999 | |
| EP | 1445120 | 8/2004 | |
| EP | 1564591 | 8/2005 | |
| EP | 1969426 | 9/2008 | |
| EP | 2339401 | 6/2011 | |
| EP | 2363748 | 9/2011 | |
| JP | 10090886 A * | 4/1998 | |
| JP | 2004098432 | 4/2004 | |
| JP | 2004294934 | 10/2004 | |
| JP | 2004294934 A * | 10/2004 | |
| JP | 2009522609 | 6/2009 | |
| JP | 2010234587 | 10/2010 | |
| JP | 2011154367 | 8/2011 | |
| JP | 2011161872 | 8/2011 | |
| JP | 2015202586 | 11/2015 | |
| WO | 2013035627 | 3/2013 | |
| WO | WO-2013035627 A1 * | 3/2013 | ............. C08J 7/046 |
| WO | 2016136655 | 9/2016 | |
| WO | 2016140820 | 9/2016 | |
| WO | 2017022465 | 2/2017 | |

OTHER PUBLICATIONS

"Office Action of China Counterpart Application", dated Sep. 30, 2020, with English translation thereof, p. 1-p. 25.
"Search Report of Europe Counterpart Application", dated May 27, 2020, p. 1-p. 7.
"Office Action of Japan Counterpart Application", dated Jan. 5, 2021, with English translation, p. 1-p. 5.

(Continued)

*Primary Examiner* — Chanceity N Robinson
(74) *Attorney, Agent, or Firm* — JCIPRNET

(57) ABSTRACT

Provided are a lithographic printing plate precursor having an image-recording layer on an aluminum support, in which the image-recording layer contains a polymerization initiator, an infrared absorber, a polymer particle, and a polymerizable compound, and the polymerizable compound has a) a molecular weight of 1,500 to 3,000, b) a double bond equivalent of 200 or less, and c) a CLog P of 9 or less and a method for producing a lithographic printing plate in which the lithographic printing plate precursor is used.

13 Claims, No Drawings

(56) References Cited

OTHER PUBLICATIONS

"International Search Report (Form PCT/ISA/210) of PCT/JP2018/020830", dated Jul. 31, 2018, with English translation thereof, pp. 1-5.
"Written Opinion of the International Searching Authority (Form PCT/ISA/237) of PCT/JP2018/020830", dated Jul. 31, 2018, with English translation thereof, pp. 1-10.
"Office Action of India Counterpart Application", dated Nov. 12, 2021, with English translation thereof, p. 1-p. 6.

* cited by examiner

LITHOGRAPHIC PRINTING PLATE PRECURSOR AND METHOD FOR PRODUCING LITHOGRAPHIC PRINTING PLATE

CROSS REFERENCE TO RELATED APPLICATION

This is a continuation of International Application No. PCT/JP2018/020830 filed on May 30, 2018, and claims priority from Japanese Patent Application No. 2017-108565 filed on May 31, 2017 and Japanese Patent Application No. 2017-186808 filed on Sep. 27, 2017, the entire disclosures of which are incorporated herein by reference.

BACKGROUND OF THE INVENTION

1. Field of the Invention

The present invention relates to a lithographic printing plate precursor and a method for producing a lithographic printing plate.

2. Description of the Related Art

Generally, a lithographic printing plate consists of a lipophilic image area that receives ink in a printing process and a hydrophilic non-image area that receives dampening water. Lithographic printing is a method in which the properties of water and oil-based ink that repel each other are used, the lipophilic image area of the lithographic printing plate is used as an ink-receiving portion, the hydrophilic non-image area is used as a dampening water-receiving portion (non-ink-receiving portion), a difference in the adhesive property of ink is caused on the surface of the lithographic printing plate, the ink is absorbed only in the image area, and then the ink is transferred to a body to be printed such as paper, thereby carrying out printing.

In a plate making step of producing a lithographic printing plate from a lithographic printing plate precursor, at the moment, image exposure is carried out using a computer to plate (CTP) technology. That is, image exposure is directly carried out on a lithographic printing plate precursor by means of scanning, exposure, or the like using a laser or a laser diode without using a lith film.

In addition, regarding the plate making of lithographic printing plate precursors, due to the intensifying interest in the global environment, an environmental issue of waste liquid generated by wet processes such as a development process has gathered attention, and accordingly, there have been attempts to simplify or remove development processes. As one of simple development processes, a method called "on-machine development" (on-press development) has been proposed. The on-machine development refers to a method in which, after the image exposure of a lithographic printing plate precursor, a development process of the related art is not carried out, and instead, the lithographic printing plate precursor is attached to a printer, and a non-image area in an image-recording layer is removed at the initial phase of an ordinary printing step.

Generally, lithographic printing plate precursors have an image-recording layer on a support such as an aluminum plate. In the case of a negative-type image-recording layer, the image-recording layer has a function of forming an image area by being cured in an exposed portion by image exposure. Therefore, the image-recording layer contains a component for forming an image by image exposure. As one component that is included in the image-recording layer, a polymerizable compound is exemplified.

As the polymerizable compound that is contained in the image-recording layer of the lithographic printing plate precursor, in addition to polymerizable monomers, polymerizable oligomers are also known. For example, JP2009-522609A describes a lithographic printing plate precursor containing a polymerizable urethane oligomer having a specific structure and having a weight-average molecular weight of 3,500 to 9,000 in an image-recording layer. In addition, JP2011-161872A describes a lithographic printing plate precursor containing a radical polymerizable urethane oligomer having a polymerizable group and a specific hydrophilic group and having a mass-average molar mass (Mw) of 1,500 to 10,000 in an image-recording layer.

SUMMARY OF THE INVENTION

Generally, the expiration date of a lithographic printing plate precursor is regulated to be reached after six months to one year from manufacturing. Therefore, lithographic printing plate precursors need to be durable enough to withstand use even after one year of natural aging (aging under conditions of a temperature of 25° C. and a humidity of 50%). However, there is an admitted tendency that, in particular, the on-machine developability or developability of lithographic printing plate precursors deteriorates over natural aging.

An object of the present invention is to provide a lithographic printing plate precursor from which a lithographic printing plate that is excellent in terms not only of on-machine developability immediately after manufacturing but also of on-machine developability after one year of natural aging and has excellent printing resistance can be produced.

Another object of the present invention is to provide a lithographic printing plate precursor from which a lithographic printing plate that is excellent in terms not only of developability immediately after manufacturing but also of developability after one year of natural aging and has excellent printing resistance can be produced.

Still another object of the present invention is to provide a method for producing a lithographic printing plate for which the lithographic printing plate precursor is used.

As a result of intensive studies, the present inventors found that, regarding a polymerizable compound that is contained in an image-recording layer of a lithographic printing plate precursor, the molecular weight, the content of a polymerizable double bond group, and the degree of hydrophilicity play a role in attaining the above-described objects and the above-described objects can be attained by appropriately adjusting the above-described causes and completed the present invention.

That is, the present invention includes the following items.

(1) A lithographic printing plate precursor comprising: an image-recording layer on an aluminum support, in which the image-recording layer contains a polymerization initiator, an infrared absorber, a polymer particle, and a polymerizable compound, and the polymerizable compound has a) a molecular weight of 1,500 to 3,000, b) a double bond equivalent of 200 or less, and c) a CLog P of 9 or less.

(2) The lithographic printing plate precursor according to (1), in which the CLog P of the polymerizable compound is 5 or less.

(3) The lithographic printing plate precursor according to (1) or (2), in which the polymerizable compound is a polymerizable compound having a urethane bond.

(4) The lithographic printing plate precursor according to any one of (1) to (3), in which the image-recording layer further includes a polymerizable compound different from the above-described polymerizable compound.

(5) The lithographic printing plate precursor according to (4), in which the polymerizable compound different from the above-described polymerizable compound is a polymerizable compound having an acrylic group or a methacrylic group.

(6) The lithographic printing plate precursor according to (4) or (5), in which a molecular weight of the polymerizable compound different from the above-described polymerizable compound is 1,500 or less.

(7) The lithographic printing plate precursor according to any one of (1) to (6), in which the polymer particle is a polymer particle including a monomer unit derived from a styrene compound and/or a monomer unit derived from a (meth)acrylonitrile compound.

(8) The lithographic printing plate precursor according to (7), in which the polymer particle further includes a monomer unit derived from a poly(ethylene glycol) alkyl ether methacrylate compound.

(9) The lithographic printing plate precursor according to any one of (1) to (8), in which the image-recording layer further contains a borate compound.

(10) The lithographic printing plate precursor according to any one of (1) to (9), in which the image-recording layer further contains an acid color developing agent.

(11) The lithographic printing plate precursor according to any one of (1) to (10) which is for on-machine development.

(12) A method for producing a lithographic printing plate comprising: a step of image-exposing the lithographic printing plate precursor according to any one of (1) to (11); and a step of removing a non-exposed portion of the image-recording layer of the lithographic printing plate precursor using at least any of printing ink or dampening water.

(13) A method for producing a lithographic printing plate comprising: a step of image-exposing the lithographic printing plate precursor according to any one of (1) to (10); and a step of removing a non-exposed portion of the image-recording layer of the lithographic printing plate precursor using a developer having a pH of 2 to 11.

According to the present invention, it is possible to provide a lithographic printing plate precursor from which a lithographic printing plate that is excellent in terms not only of on-machine developability immediately after manufacturing but also of on-machine developability after one year of natural aging and has excellent printing resistance can be produced.

In addition, according to the present invention, it is possible to provide a lithographic printing plate precursor from which a lithographic printing plate that is excellent in terms not only of developability immediately after manufacturing but also of developability after one year of natural aging and has excellent printing resistance can be produced.

Furthermore, according to the present invention, it is possible to provide a method for producing a lithographic printing plate for which the lithographic printing plate precursor is used.

DESCRIPTION OF THE PREFERRED EMBODIMENTS

Hereinafter, the present invention will be described in detail.

In the present specification, regarding the expression of a group in a compound represented by a formula, in a case in which the group is not expressed to be substituted or not substituted and is capable of further having a substituent, unless particularly otherwise described, the group refers not only to an unsubstituted group but also to a group having a substituent. For example, in a case in which there is a description of "R represents an alkyl group, an aryl group, or a heterocyclic group" in a formula, it means that "R represents an unsubstituted alkyl group, a substituted alkyl group, an unsubstituted aryl group, a substituted aryl group, an unsubstituted heterocyclic group, or a substituted heterocyclic group".

In the present specification, "(meth)acryl" refers to both or any one of acryl and methacryl, and "(meth)acrylate" refers to both or any one of acrylate and methacrylate.

[Lithographic Printing Plate Precursor]

A lithographic printing plate precursor of an embodiment of the present invention has an image-recording layer on an aluminum support, the image-recording layer contains a polymerization initiator, an infrared absorber, a polymer particle, and a polymerizable compound, and the polymerizable compound has a) a molecular weight of 1,500 to 3,000, b) a double bond equivalent of 200 or less, and c) a CLog P of 9 or less (hereinafter, also referred to as specific polymerizable compound).

Hereinafter, an on-machine development-type lithographic printing plate precursor from which the characteristics of the present invention are significantly developed will be described as an example, and a development process-type lithographic printing plate precursor from which a lithographic printing plate is produced by a development process will also be appropriately described.

[Image-Recording Layer]

The image-recording layer of the lithographic printing plate precursor of the embodiment of the present invention contains a polymerization initiator, an infrared absorber, a polymer particle, and a specific polymerizable compound.

(Specific Polymerizable Compound)

The specific polymerizable compound that is contained in the image-recording layer of the lithographic printing plate precursor of the embodiment of the present invention has a characteristic of satisfying three requirements of a) a molecular weight of 1,500 to 3,000, b) a double bond equivalent of 200 or less, and c) a CLog P of 9 or less. The use of the specific polymerizable compound having the above-described characteristics in the image-recording layer of the lithographic printing plate precursor enables the provision of a lithographic printing plate precursor from which a lithographic printing plate that is excellent in terms not only of on-machine developability immediately after manufacturing but also of on-machine developability after one year of natural aging and has excellent printing resistance can be produced. In addition, the use of the specific polymerizable compound having the above-described characteristics in the image-recording layer of the lithographic printing plate precursor enables the provision of a lithographic printing plate precursor from which a lithographic printing plate that is excellent in terms not only of developability immediately after manufacturing but also of developability after one year of natural aging and has excellent printing resistance can be produced. Particularly, the fact that the on-machine developability or developability of a lithographic printing plate precursor after one year of natural aging can be favorably maintained by controlling the above-described three requirements is an unexpected effect.

The molecular weight of the specific polymerizable compound that is contained in the image-recording layer is 1,500 to 3,000. The molecular weight of the specific polymerizable compound is computed from a chemical formula of the specific polymerizable compound using an ordinary method.

In a case in which the molecular weight of the specific polymerizable compound is less than 1,500, the printing resistance of a lithographic printing plate degrades. Furthermore, there is a case in which a defect of the transfer of the polymerizable compound to a roll of a manufacturing device or the like during the manufacturing of the lithographic printing plate precursor is also caused. In a case in which the molecular weight of the specific polymerizable compound exceeds 3,000, not only on-machine developability immediately after manufacturing but also on-machine developability after one year of natural aging degrade, and not only developability immediately after manufacturing but also developability after one year of natural aging degrade. Therefore, it is important that the molecular weight of the specific polymerizable compound is 1,500 to 3,000.

The molecular weight of the specific polymerizable compound is preferably 1,600 to 2,800 and more preferably 1,800 to 2,500.

The double bond equivalent of the specific polymerizable compound that is contained in the image-recording layer is 200 or less. The double bond equivalent of the specific polymerizable compound is a numerical value obtained by dividing the molecular weight of the specific polymerizable compound by the number of polymerizable double bond groups included in the specific polymerizable compound. The number of polymerizable double bond groups included in the specific polymerizable compound is obtained by the structural analysis of the specific polymerizable compound. Therefore, the double bond equivalent of the specific polymerizable compound can be computed from the molecular weight of the specific polymerizable compound and the number of polymerizable double bond groups included in the specific polymerizable compound.

In a case in which the double bond equivalent of the specific polymerizable compound exceeds 200, the printing resistance of a lithographic printing plate degrades. Therefore, it is important that the double bond equivalent of the specific polymerizable compound is 200 or less.

The double bond equivalent of the specific polymerizable compound is preferably 50 to 180 and more preferably 50 to 150.

The CLog P of the specific polymerizable compound that is contained in the image-recording layer is 9 or less. The CLog P value of the specific polymerizable compound can be computed from the chemical structural formula of the specific polymerizable compound using CS Chem Draw (version 14.0.0.117).

In a case in which the molecular weight of the specific polymerizable compound is large, and it is not possible to compute the CLog P value, the CLog P value can be computed by computing the CLog P values of individual polymerization units, multiplying the CLog P values of the individual polymerization units by the mass percentages of the individual polymerization units, and summing the multiplication results. For example, in the case of a specific polymerizable compound containing 50% by mass of a polymerization unit A having a CLog P value of Pa, 30% by mass of a polymerization unit B having a CLog P value of Pb, and 20% by mass of a polymerization unit C having a CLog P value of Pc, the CLog P value can be computed according to a numerical expression described below. Meanwhile, the individual polymerization units refer to the maximum unit from which CLog P can be computed using CS Chem Draw (version 14.0.0.117).

$$C\text{ Log }P\text{ value}=Pa\times0.50+Pb\times0.30+Pc\times0.20$$

In a case in which the CLog P value of the specific polymerizable compound exceeds 9, not only on-machine developability immediately after manufacturing but also on-machine developability after one year of natural aging degrade, and not only developability immediately after manufacturing but also developability after one year of natural aging degrade. Therefore, it is important that the CLog P value of the specific polymerizable compound is 9 or less.

The double bond equivalent of the specific polymerizable compound is preferably 5 or less and more preferably 4 or less.

It is essential that the specific polymerizable compound that is contained in the image-recording layer satisfies the above-described three requirements, and, as long as the three requirements are satisfied, the structure is not particularly limited.

As the specific polymerizable compound, an ester compound, an amide compound, a urethane compound, a urea compound, and the like are preferred.

The double bond equivalent of the specific polymerizable compound can be adjusted by introducing a polymerizable group. As the polymerizable group, an ethylenically unsaturated group is preferably used. Specifically, a methacrylic group, an acrylic group, an allyl group, a styryl group, a vinyl group, and the like are preferred, and a methacrylic group, an acrylic group, and a styryl group are more preferred.

The CLog P value of the specific polymerizable compound can be adjusted by introducing a hydrophilic group. As the hydrophilic group, a sulfo group (including a sulfonate group), a group having a polyoxyalkylene chain, a hydroxy group, an amide group, an ammonium group, a group having a betaine structure, and the like are preferred, and a group having a polyoxyalkylene chain and a hydroxy group are more preferred.

The specific polymerizable compound is preferably a polymerizable compound having a urethane bond. The polymerizable compound having a urethane bond preferably has one or more polymerizable groups and one or more hydrophilic groups. Regarding the polymerizable group and the hydrophilic group, the above description can be employed.

As the polymerizable compound having a urethane bond, for example, a urethane compound synthesized from an isocyanate compound and an alcohol compound is exemplified.

The isocyanate compound may be a monofunctional isocyanate or a polyfunctional (di- or higher-functional) isocyanate. As the monofunctional isocyanate, isocyanates having an alkyl group or aryl group having 1 to 20 carbon atoms are exemplified. The monofunctional isocyanate may have a substituent such as a halogen atom, an alkoxy group, or an alkylthio group. As specific examples of the monofunctional isocyanate, phenyl isocyanate, m-toluene isocyanate, ethyl isocyanate, n-propyl isocyanate, and the like are exemplified.

The isocyanate compound is preferably a polyfunctional (di- or higher-functional) isocyanate. As the difunctional isocyanate, any well-known difunctional isocyanate of the related art can be used, as aromatic diisocyanates, for example, 4,4'-diphenylmethane diisocyanate (MDI), 2,4- or 2,6-tolylene diisocyanate (TDI), m- or p-phenylene diisocyanate, 1,3- or 1,4-xylene diisocyanate (XDI), 1,5-naphthalene diisocyanate (NDI), 3,3'-dimethyl-4,4'-biphenylene diisocyanate (TODI), and the like are exemplified, and, as aliphatic diisocyanates, for example, hexamethylene diisocyanate (HDI), hydrogenated MDI (H12MDI), isophorone diisocyanate (IPDI), and the like are exemplified.

As a triisocyanate compound and a tetraisocyanate compound, a compound represented by Formula (I) or (II) is exemplified.

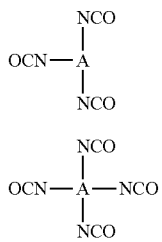

(I)

(II)

In Formulae (I) and (II), A represents a tri- or tetravalent organic residue constituted of a non-metallic atom, and organic residues constituted of one element selected from 3 to 30 carbon atoms, up to 10 nitrogen atoms, up to 10 oxygen atoms, up to 10 halogen atoms, up to 10 silicon atoms, 3 to 100 hydrogen atoms, up to 10 phosphorus atoms, and up to 10 sulfur atoms are exemplified. Among these, a combination of 2 to 30 carbon atoms, up to 5 nitrogen atoms, up to 8 oxygen atoms, and 3 to 50 hydrogen atoms is preferred.

The structures in atoms and a group of linking groups illustrated below and a tri- or tetravalent organic residue that is a combination thereof are more preferred.

(Atoms and Group of Linking Groups)

Specific examples of the above-described A will be illustrated below, but the present invention is not limited thereto.

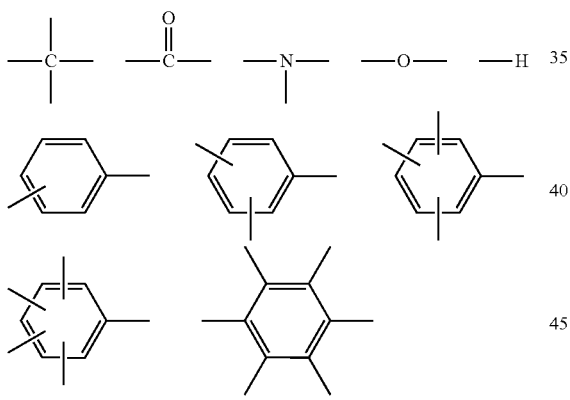

(A-1)

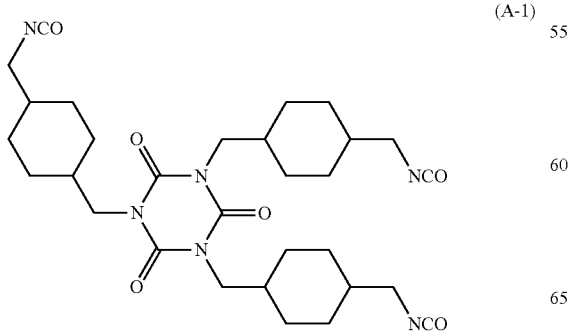

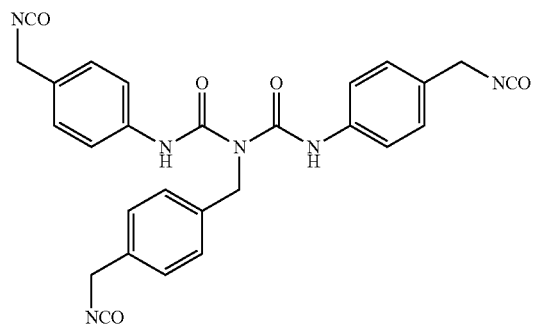

(A-3)

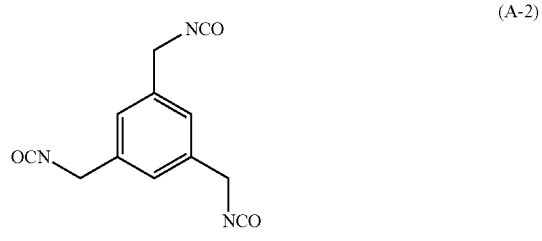

(A-2)

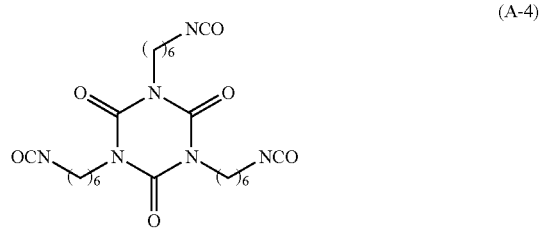

(A-4)

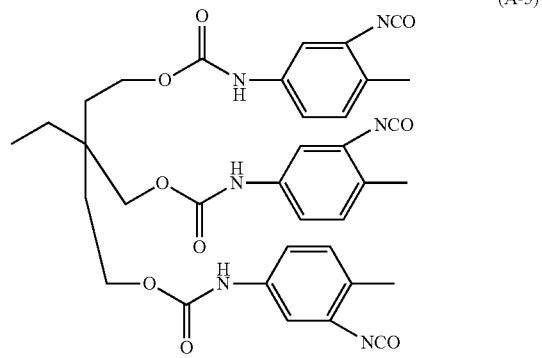

(A-5)

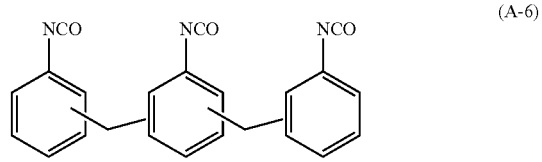

(A-6)

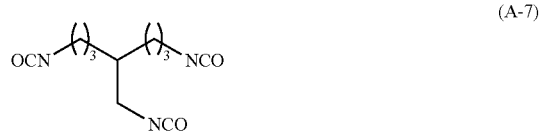

(A-7)

(A-8)

-continued

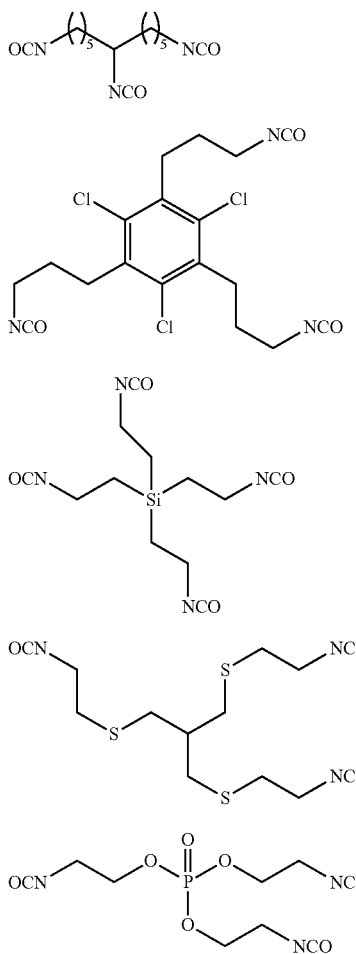

As an alcohol compound, a compound having a polymerizable group and a hydroxy group is preferably used. The number of the hydroxy groups is preferably 1 to 4, more preferably 1 to 3, and particularly preferably 1 or 2. The number of the polymerizable groups is preferably 1 or more, more preferably 2 to 50, still more preferably 2 to 40, and particularly preferably 3 to 30.

As the compound having a polymerizable group and a hydroxy group, compounds represented by Formulae (III) to (V) are exemplified.

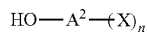

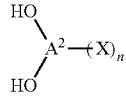

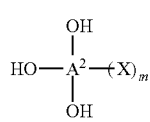

In Formulae (III) to (V), X represents a methacrylic group, an acrylic group, an allyl group, a styryl group, or a vinyl group and is preferably a methacrylic group, an acrylic group, or a styryl group. n represents an integer of 1 to 12 and is preferably 2 to 8 and more preferably 3 to 6.

$A^2$ represents a tri- to tetradecavalent organic residue constituted of a non-metallic atom, and organic residues constituted of at least one element selected from 2 to 30 carbon atoms, up to 10 nitrogen atoms, up to 10 oxygen atoms, up to 10 halogen atoms, up to 10 silicon atoms, 2 to 100 hydrogen atoms, up to 10 phosphorus atoms, and up to 10 sulfur atoms are exemplified. Among these, a combination of 3 to 20 carbon atoms, up to 5 nitrogen atoms, up to 10 oxygen atoms, and 2 to 40 hydrogen atoms is preferred. The structures in the above-described atoms and the above-described group of linking groups and a tri- to tetradecavalent organic residue that is a combination thereof are more preferred.

Specific examples of the compound having a polymerizable group and a hydroxy group will be illustrated below, but the present invention is not limited thereto.

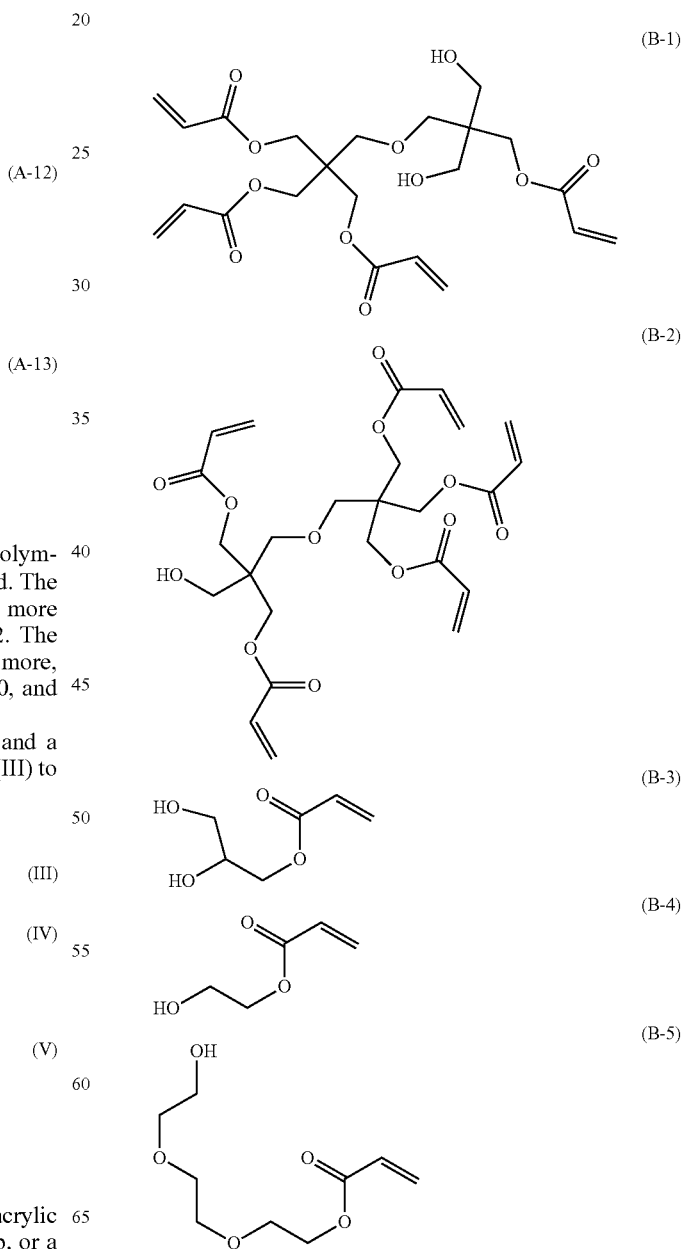

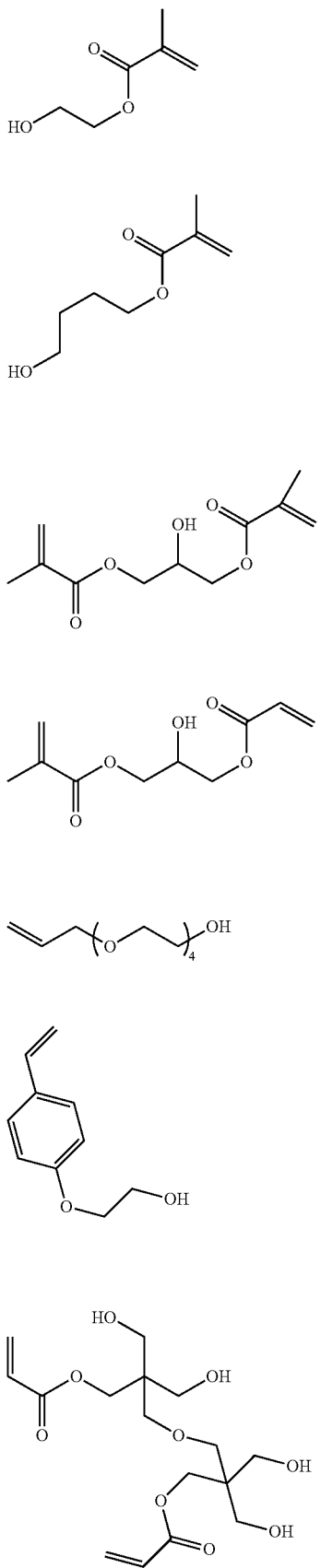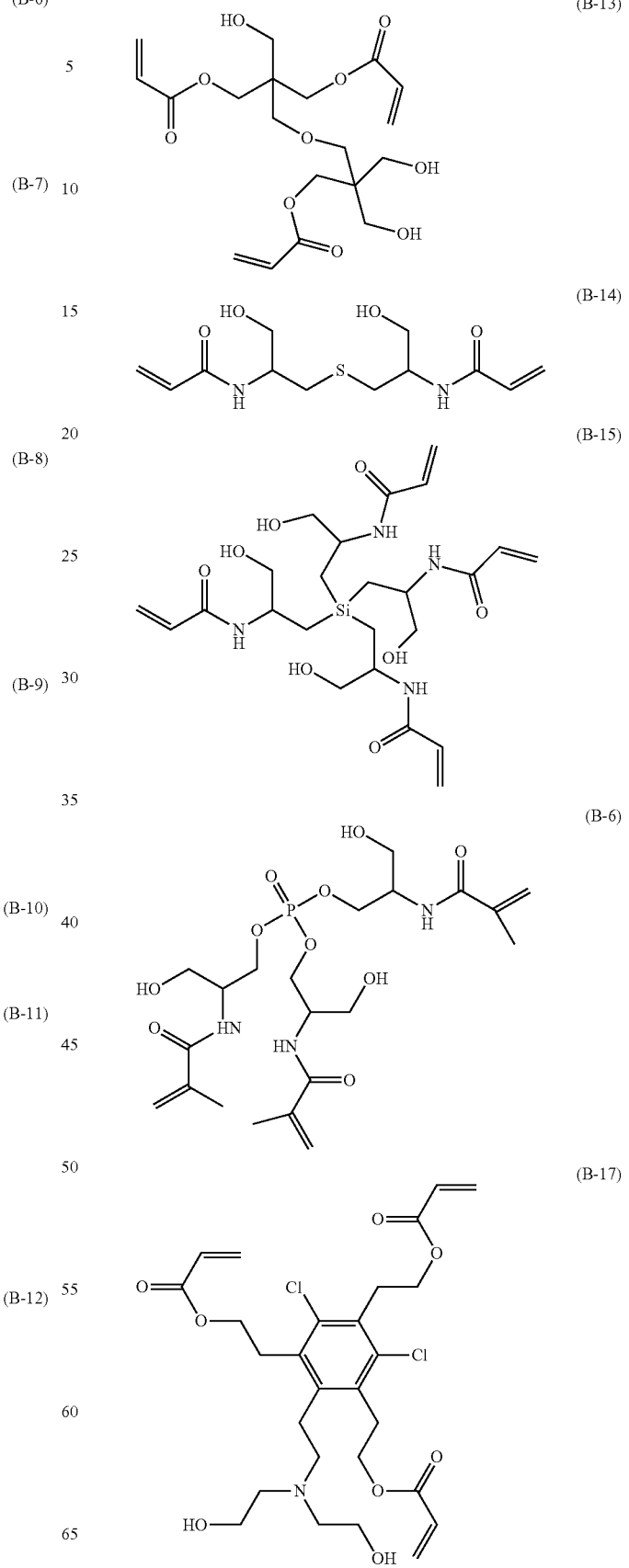

(B-18)

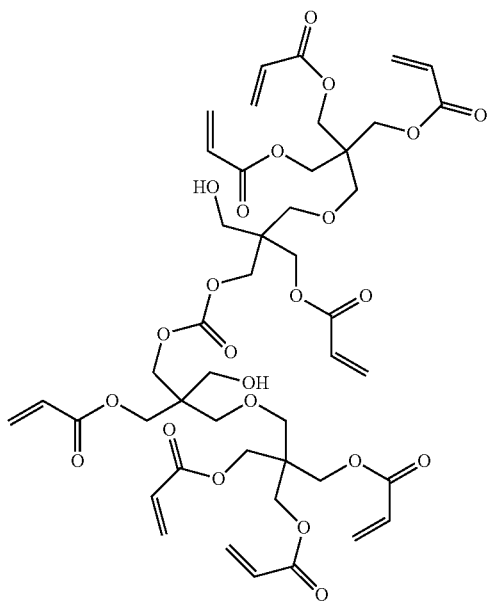

(B-19)

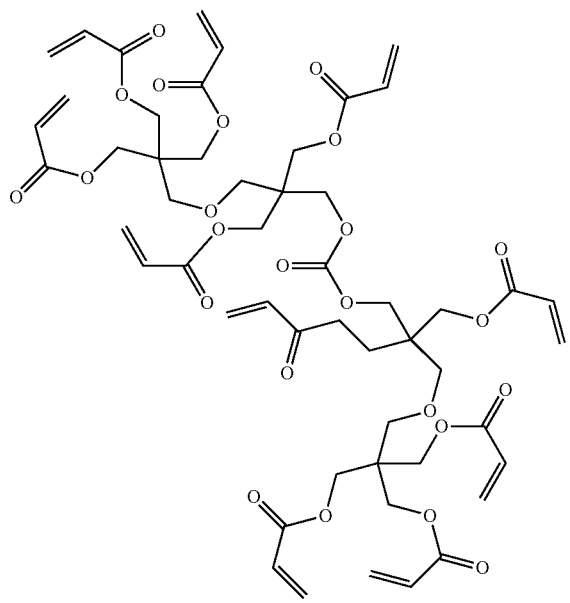

As the alcohol compound, additionally, compounds represented by Formulae (VI) to (IX) are exemplified.

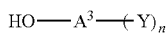  (VI)

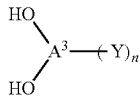  (VII)

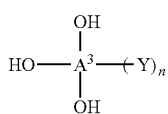  (VIII)

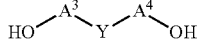  (IX)

In Formulae (VI) to (IX), n represents an integer of 1 to 12 and is preferably 1 to 8 and more preferably 1 to 6.

$A^3$ and $A^4$ each independently represent a di- to tetradecavalent organic residue constituted of a non-metallic atom, and organic residues constituted of at least one element selected from 3 to 30 carbon atoms, up to 10 nitrogen atoms, up to 10 oxygen atoms, up to 10 halogen atoms, up to 10 silicon atoms, 3 to 100 hydrogen atoms, up to 10 phosphorus atoms, and up to 10 sulfur atoms are exemplified. Among these, a combination of 3 to 20 carbon atoms, up to 5 nitrogen atoms, up to 10 oxygen atoms, and 2 to 50 hydrogen atoms is preferred. The structures in the above-described atoms and the above-described group of linking groups and a di- to tetradecavalent organic residue that is a combination thereof are more preferred.

Y represents a hydrophilic group selected from a sulfo group, a sulfonate group, a group having a polyoxyalkylene chain, a hydroxy group, an amide group, an ammonium group, and a group having a betaine structure. A group having a polyoxyalkylene chain, a hydroxy group, an amide group, or a group having a betaine structure is preferred, and a polyoxyalkylene group, an amide group, or a group having a betaine structure is particularly preferred.

As the polyoxyalkylene group, a polyoxyethylene group and a polyoxypropylene group are preferred, and a polyoxyethylene group is particularly preferred. The number of times of repetition of oxyethylene is preferably 2 to 100, more preferably 2 to 50, and particularly preferably 2 to 20.

As the amide group, an unsubstituted amide or a 1 substituted amide group having a substituent on a nitrogen atom is preferred. As the substituent, an alkyl group having 1 to 10 carbon atoms or a hydroxy alkyl group is preferred, an alkyl group having 1 to 8 carbon atoms or a hydroxyalkyl group is more preferred, and an alkyl group having 1 to 6 carbon atoms or a hydroxyalkyl group is particularly preferred.

As the betaine structure, sulfobetaine, phosphobetaine, or carbobetaine is preferred, sulfobetaine or phosphobetaine is more preferred, and sulfobetaine is particularly preferred.

Specific examples of the compounds represented by Formulae (VI) to (IX) will be illustrated below, but the present invention is not limited thereto.

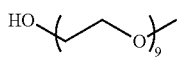  (C-1)

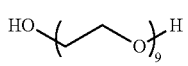  (C-2)

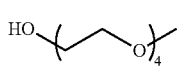  (C-3)

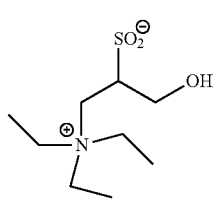  (C-4)

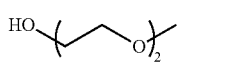 (C-5)

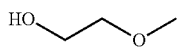 (C-6)

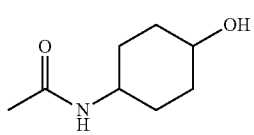 (C-7)

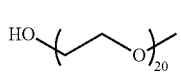 (C-8)

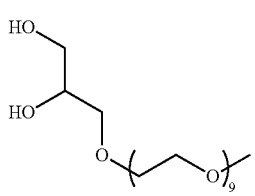 (C-9)

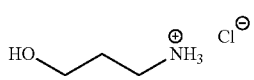 (C-10)

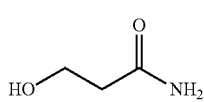 (C-11)

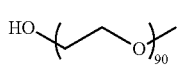 (C-12)

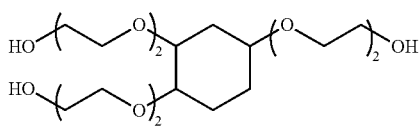 (C-13)

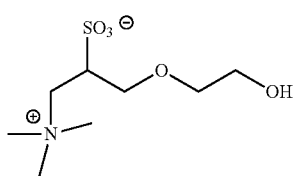 (C-14)

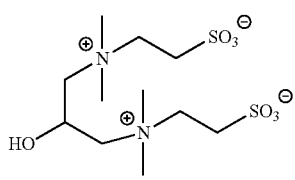 (C-15)

 (C-16)

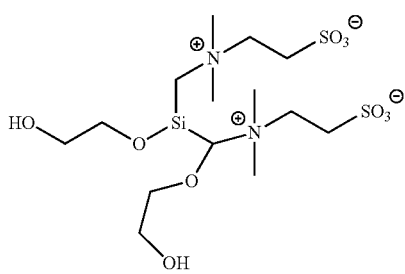 (C-17)

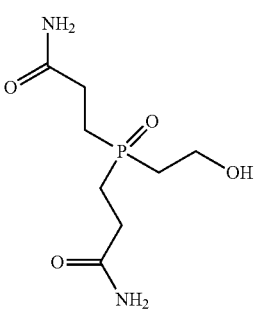 (C-18)

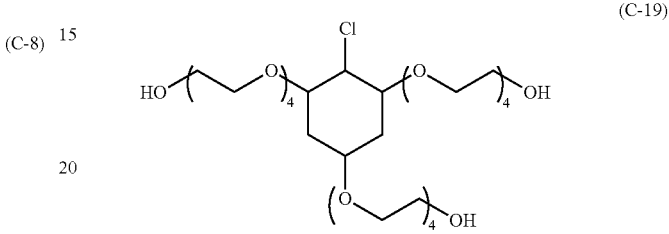 (C-19)

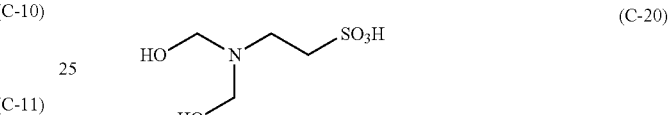 (C-20)

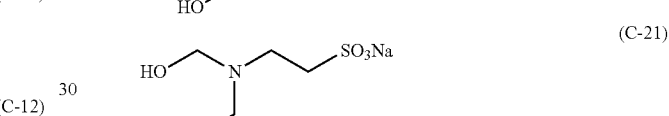 (C-21)

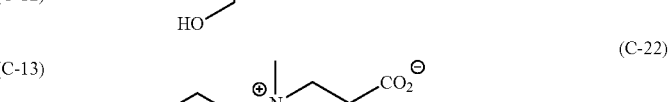 (C-22)

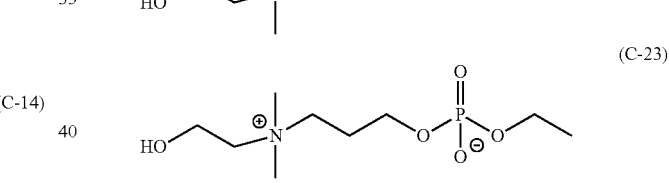 (C-23)

As the compound having a polyoxyalkylene group, in addition to the above-described compounds, polypropylene glycol, polyethylene glycol, polytetramethylene glycol, ethylene oxide-propylene oxide copolymers, tetrahydrofuran-ethylene oxide copolymers, tetrahydrofuran-propylene oxide copolymers, polyester diol (for example, polyethylene adipate, polydiethylene adipate, polypropylene adipate, polyhexamethylene adipate, polyneopentyl adipate, polyhexamethylene neopentyl adipate, polyethylene diethylene adipate, polyethylene hexamethylene adipate, and the like), poly-s-caprolactone diol, polyhexamethylene carbonate diol, polytetramethylene adipate; and the like), and the like can be exemplified.

As the alcohol compound, additionally, a polyhydric alcohol can also be used. As the polyhydric alcohol, propanediol, butanediol, pentanediol, pentanetriol, hexanediol, hexanetriol, glycerin, diglycerin, triglycerin, cyclohexanediol, cyclohexanetriol, pentaerythritol, trimethylolpropane, furthermore, sugar alcohols such as sorbitol or mannitol, and the like can be exemplified. The polyhydric alcohol may be substituted with a halogen atom, an alkoxy group, an amino group, a substituted amino group, a substituted carbonyl group, a hydroxy group, a substituted oxy group, a mercapto group, a substituted thio group, a silyl group, a nitro group, a cyano group, an alkyl group, an alkenyl group, an alkynyl group, an aryl group, a heterocyclic group, or the like.

The synthesis of the specific polymerizable compound having a urethane bond is not particularly limited and can be carried out according to an ordinary method. For example, the specific polymerizable compound having a urethane bond can be synthesized by, for example, dissolving a diol compound in an appropriate solvent, adding an isocyanate compound dropwise to this solution, and causing a reaction at a high temperature.

The content of the specific polymerizable compound is preferably 3% to 90% by mass, more preferably 5% to 80% by mass, and still more preferably 10% to 75% by mass of the total solid content of the image-recording layer.

(Polymerization Initiator)

The image-recording layer of the lithographic printing plate precursor of the embodiment of the present invention contains a polymerization initiator. The polymerization initiator that is used in the image-recording layer is a compound that generates a polymerization-initiating species such as a radical or a cation with the energy of heat, light, or both, and it is possible to appropriately select from a well-known thennopolymerization initiator, a compound having a bond with a small bond dissociation energy, a photopolymerization initiator, and the like and use it.

The polymerization initiator is preferably an infrared-sensitive polymerization initiator. In addition, the polymerization initiator is preferably a radical polymerization initiator.

Examples of the radical polymerization initiator include an organic halide, a carbonyl compound, an azo compound, an organic peroxide, a metallocene compound, an azide compound, a hexaarylbiimidazole compound, a disulfone compound, an oxime ester compound, and an onium salt compound.

As the organic halide, for example, a compound described in Paragraphs 0022 and 0023 of JP2008-195018A is preferred.

As the carbonyl compound, for example, a compound described in Paragraph 0024 of JP2008-195018A is preferred.

As the azo compound, for example, an azo compound described in JP1996-108621A (JP-H08-108621A) is exemplified.

As the organic peroxide, for example, a compound described in Paragraph 0025 of JP2008-195018A is preferred.

As the metallocene compound, for example, a compound described in Paragraph 0026 of JP2008-195018A is preferred.

As the azide compound, for example, a compound such as 2,6-bis(4-azidobenzylidene)-4-methylcyclohexanone is exemplified.

As the hexaarylbiimidazole compound, for example, a compound described in Paragraph 0027 of JP2008-195018A is preferred.

As the disulfone compound, for example, a compound described in each of JP1986-166544A (1P-S61-166544A) and JP2002-328465A is exemplified.

As the oxime ester compound, for example, a compound described in Paragraphs 0028 to 0030 of JP2008-195018A is preferred.

As the polymerization initiators, from the viewpoint of the curing property, an oxime ester and an onium salt are more preferably exemplified, and onium salts such as an iodonium salt, a sulfonium salt, and an azinium salt are still more preferably exemplified. In the case of applying the composition of the embodiment of the present invention to a lithographic printing plate precursor, an iodonium salt and a sulfonium salt are particularly preferred. Specific examples of the iodonium salt and the sulfonium salt will be described below, but the present invention is not limited thereto.

An example of the iodonium salt is preferably a diphenyl iodonium salt, particularly, preferably a diphenyl iodonium salt having an electron-donating group as a substituent, for example, a diphenyl iodonium salt substituted with an alkyl group or an alkoxyl group, and preferably an asymmetric diphenyl iodonium salt. Specific examples thereof include diphenyliodonium=hexafluorophosphate, 4-methoxyphenyl-4-(2-methylpropyl) phenyliodonium=hexafluorophosphate, 4-(2-methylpropyl)phenyl-p-tolyliodonium=hexafluorophosphate, 4-hexyloxyphenyl-2,4,6-trimethoxyphenyl iodonium=hexafluorophosphate, 4-hexyloxyphenyl-2,4-diethoxyphenyl iodonium=tetrafluoroborate, 4-octyloxyphenyl-2,4,6-trimethoxyphenyl iodonium=1-perfluorobutane sulfonate, 4-octyloxyphenyl-2,4,6-trimethoxyphenyliodonium=hexafluorophosphate, and bis(4-t-butylphenyl)iodonium=hexafluorophosphate.

The sulfonium salts are preferably triarylsulfonium salts, particularly preferably triarylsulfonium salts having an electron-attracting group as a substituent, for example, triarylsulfonium salts in which at least some of groups on the aromatic ring are substituted with a halogen atom, and still more preferably triarylsulfonium salts in which the total number of substituting halogen atoms on the aromatic ring is four or greater. Specific examples thereof include triphenylsulfonium=hexafluorophosphate, triphenylsulfonium=benzoyl formate, bis(4-chlorophenyl)phenylsulfonium=benzoyl formate, bis(4-chlorophenyl)-4-methylphenylsulfonium=tetrafluoroborate, tris(4-chlorophenyl)sulfonium=3,5-bis(methoxycarbonyl)benzenesulfonate, tris(4-chlorophenyl)sulfonium=hexafluorophosphate, and tris(2,4-dichlorophenyl)sulfonium=hexafluorophosphate.

The polymerization initiator may be used singly or two or more polymerization initiators may be jointly used.

The content of the polymerization initiator is preferably 0.1% to 50% by mass, more preferably 0.5% to 30% by mass, and still more preferably 0.8% to 20% by mass of the total solid content of the image-recording layer.

(Infrared Absorber)

The image-recording layer of the lithographic printing plate precursor of the embodiment of the present invention contains an infrared absorber. The infrared absorber is a compound having a function of converting absorbed infrared rays to heat. In addition, the infrared absorber may be excited by infrared rays and have a function of migrating electrons and/or energy to a polymerization initiator.

The infrared absorber preferably has the maximum absorption in a wavelength range of 750 to 1,400 nm. As the infrared absorber, a dye or a pigment is preferably used.

As the dye, it is possible to use a commercially available dye and a well-known dye described in publications, for example, "Dye Handbooks" (edited by the Society of Synthetic Organic Chemistry, Japan and published on 1970). Specific examples thereof include dyes such as an azo dye, a metal complex azo dye, a pyrazolone azo dye, a naphthoquinone dye, an anthraquinone dye, a phthalocyanine dye, a carbonium dye, a quinoneimine dye, a methine dye, a cyanine dye, a squarylium colorant, a pyrylium salt, and a metal thiolate complex.

Among these dyes, as preferred dyes, a cyanine colorant, a squarylium colorant, and a pyrylium salt are exemplified. Among these, a cyanine colorant is preferred, and an indolenine cyanine colorant is particularly preferred.

As the cyanine colorant, for example, a cyanine colorant represented by General Formula (a) is exemplified.

General Formula (a)

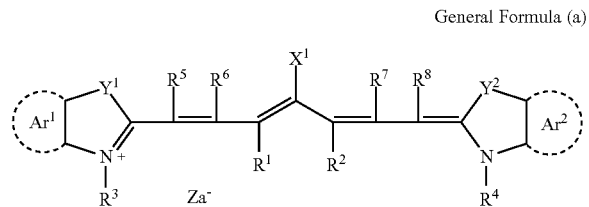

In General Formula (a), $X^1$ represents a hydrogen atom, a halogen atom, $-N(R^9)(R^{10})$, $-X^2-L^1$, or a group illustrated below. Here, $R^9$ and $R^{10}$ may be identical to or different from each other and each independently represent an aromatic hydrocarbon group having 6 to 10 carbon atoms, an alkyl group having 1 to 8 carbon atoms, or a hydrogen atom or $R^9$ and $R^{10}$ may bond to each other to form a ring. The aromatic hydrocarbon group having 6 to 10 carbon atoms or the alkyl group having 1 to 8 carbon atoms may have a substituent. $R^9$ and $R^{10}$ are both preferably a phenyl group. $X^2$ represents an oxygen atom or a sulfur atom, and $L^1$ represents a hydrocarbon group having 1 to 12 carbon atoms or a hydrocarbon group having 1 to 12 carbon atoms which includes a hetero atom. Here, the hetero atom represents N, S, O, a halogen atom, or Se. In the group illustrated below, $Xa^-$ is the same as $Za^-$ described below, and Ra represents a hydrogen atom or a substituent selected from an alkyl group, an aryl group, a substituted or unsubstituted amino group, and a halogen atom.

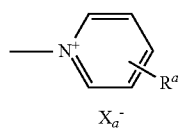

In General Formula (a), $R^1$ and $R^2$ each independently represent a hydrocarbon group having 1 to 12 carbon atoms. From the viewpoint of the storage stability of a coating fluid for an image-recording layer, $R^1$ and $R^2$ are preferably a hydrocarbon group having 2 or more carbon atoms, and, furthermore, $R^1$ and $R^2$ particularly preferably bond to each other to form a five-membered ring or a six-membered ring.

In General Formula (a), $Ar^1$ and $Ar^1$ may be identical to or different from each other and each represent an aromatic hydrocarbon group. The aromatic hydrocarbon group may have a substituent. As a preferred aromatic hydrocarbon group, a benzene ring group and a naphthalene ring group are exemplified. In addition, as a preferred substituent, a hydrocarbon group having 12 or less carbon atoms, a halogen atom, and an alkoxy group having 12 or less carbon atoms are exemplified. $Y^1$ and $Y^2$ may be identical to or different from each other and each represent a sulfur atom or a dialkyl methylene group having 12 or less carbon atoms. $R^3$ and $R^4$ may be identical to or different from each other and each represent a hydrocarbon group having 20 or less carbon atoms. The hydrocarbon group having 20 or less carbon atoms may also have a substituent. As a preferred substituent, an alkoxy group having 12 or less carbon atoms, a carboxy group, and a sulfo group are exemplified. $R^5$, $R^6$, $R^7$, and $R^8$ may be identical to or different from each other and each represent a hydrogen atom or a hydrocarbon group having 12 or less carbon atoms. From the viewpoint of the easiness in the procurement of a raw material, a hydrogen atom is preferred. In addition, $Za^-$ represents a counter anion. Here, the cyanine colorant represented by General Formula (a) has an anionic substituent in the structure, and, in a case in which the neutralization of a charge is not required, $Za^-$ is not necessary. From the viewpoint of the storage stability of the coating fluid for an image-recording layer, $Za^-$ is preferably a halide ion, a perchlorate ion, a tetrafluoroborate ion, a hexafluorophosphate ion, or a sulfonate ion and more preferably a perchlorate ion, a hexafluorophosphate ion, or an aryl sulfonate ion.

In the cyanine colorant represented by General Formula (a), $X^1$ is more preferably a diphenylamino group. In addition, it is more preferred that $X^1$ is a diphenylamino group and $Y^1$ and $Y^2$ are both a dimethylmethylene group.

Specific examples of the cyanine colorant include a compound described in Paragraphs 0017 to 0019 of JP2001-133969A, a compound described in Paragraphs 0016 to 0021 of JP2002-023360A and Paragraphs 0012 to 0037 of JP2002-040638A, preferably a compound described in Paragraphs 0034 to 0041 of JP2002-278057A and Paragraphs 0080 to 0086 of JP2008-195018A, particularly preferably a compound described in Paragraphs 0035 to 0043 of JP2007-090850A.

In addition, it is also possible to preferably use a compound described in Paragraphs 0008 and 0009 of JP1993-005005A (JP-H05-005005A) and Paragraphs 0022 to 0025 of JP2001-222101A.

As the pigment, a compound described in Paragraphs 0072 to 0076 of JP2008-195018A is preferred.

The infrared absorber may be singly used or two or more infrared absorbers may be jointly used. In addition, a pigment and a dye may be jointly used as the infrared absorber.

The content of an infrared absorber is preferably 0.05% to 30% by mass, more preferably 0.1% to 20% by mass, and still more preferably 0.2% to 10% by mass of the total solid content of the image-recording layer.

(Polymer Particle)

The image-recording layer of the lithographic printing plate precursor of the embodiment of the present invention contains a polymer particle. The polymer particle contributes to the improvement of the on-machine developability or developability of the lithographic printing plate precursor. The polymer particle is preferably a polymer particle capable of converting the image-recording layer to be hydrophobic in the case of being irradiated with heat. The polymer particle is preferably at least one selected from a hydrophobic thermoplastic polymer particle, a thermally reactive polymer particle, a polymer particle having a polymerizable group, a microcapsule including a hydrophobic compound, or a micro gel (crosslinking polymer particle). Among these, a polymer particle having a polymerizable group and a micro gel are preferred.

As the hydrophobic thermoplastic polymer particle, hydrophobic thermoplastic polymer particles described in Research Disclosure No. 33303 of January 1992 and the specifications of JP1997-123387A (JP-H09-123387A), JP1997-131850A (JP-H09-131850A), JP1997-171249A (JP-H09-171249A), JP1997-171250A (JP-H09-171250A), EP931647B, and the like are preferably exemplified.

Specific examples of a polymer constituting the hydrophobic thermoplastic polymer particle include homopolymers or copolymers of monomers of ethylene, styrene, vinyl chloride, methyl acrylate, ethyl acrylate, methyl methacrylate, ethyl methacrylate, vinylidene chloride, acrylonitrile, vinylcarbazole, acrylates or methacrylates having polyalkylene structures, and the like and mixtures thereof. Preferred examples thereof include copolymers having polystyrene, styrene, and acrylonitrile and polymethyl methacrylate. The average particle diameter of the hydrophobic thermoplastic polymer particle is preferably in a range of 0.01 to 2.0 µm.

Examples of the thermally reactive polymer particle include a polymer particle having a thermally reactive group. The polymer particle having a thermally reactive group forms a hydrophobilized region through crosslinking by a thermal reaction and a change in a functional group at this time.

The thermally reactive group in the polymer particle having a thermally reactive group may be a functional group that causes any reactions as long as chemical bonds are formed, but is preferably a polymerizable group. Preferred examples thereof include ethylenically unsaturated groups that cause radical polymerization reactions (for example, acryloyl groups, methacryloyl groups, vinyl groups, allyl groups, and the like), cationic polymerizable groups (for example, vinyl groups, vinyloxy groups, epoxy groups, oxetanyl groups, and the like), isocyanato groups that cause addition reactions or blocked bodies thereof, epoxy groups, vinyloxy groups, functional groups having active hydrogen atoms that are reaction partners thereof (for example, amino groups, hydroxy groups, carboxy groups, and the like), carboxy groups that cause condensation reactions, hydroxy groups or amino groups that are reaction partners, acid anhydrides that cause ring-opening addition reactions, amino groups or hydroxy groups which are reaction partners, and the like.

Examples of the microcapsules include microcapsules including all or part of the constituent components of the image-recording layer as described in JP2001-277740A and JP2001-277742A. The constituent components of the image-recording layer can also be added outside the microcapsules. A preferred aspect of the image-recording layer including the microcapsules is an image-recording layer including hydrophobic constituent components in the microcapsules and including hydrophilic constituent components outside the microcapsules.

Micro gels (crosslinking polymer particles) are capable of containing some of the constituent components of the image-recording layer at least one of in the inside or on the surface thereof. Particularly, an aspect of micro capsules that have radical polymerizable groups on the surfaces and thus turn into reactive micro gels is preferred from the viewpoint of image-forming sensitivity or printing resistance.

In order to put the constituent components of the image-recording layer into microcapsules or micro gels, well-known methods can be used.

The average particle diameter of the microcapsules or the micro gels is preferably in a range of 0.01 to 3.0 µm, more preferably in a range of 0.05 to 2.0 µm, and particularly preferably in a range of 0.10 to 1.0 µm. Within this range, favorable resolution and temporal stability can be obtained.

From the viewpoint of contribution to on-machine developability or developability, the polymer particle is preferably the particle of a polymer including a monomer unit derived from a styrene compound and/or a monomer unit derived from a (meth)acrylonitrile compound. In addition, the particle of a polymer further including a monomer unit derived from a poly(ethylene glycol) alkyl ether methacrylate compound is preferred.

One kind of polymer particle may be singly used or two or more kinds of polymer particles may be jointly used.

The content of the polymer particle is preferably 5% to 90% by mass, more preferably 5% to 80% by mass, and still more preferably 10% to 75% by mass of the total solid content of the image-recording layer.

(Polymerizable Compound Different from Specific Polymerizable Compound)

The image-recording layer of the lithographic printing plate precursor of the embodiment of the present invention is capable of containing a polymerizable compound different from the specific polymerizable compound as long as the effect of the specific polymerizable compound is not impaired. As the polymerizable compound different from the specific polymerizable compound for the additional improvement of on-machine developability or developability and the printing resistance of a lithographic printing plate, a well-known radical polymerizable compound can be used. As such a radical polymerizable compound, for example, radical polymerizable compounds described in JP2002-287334A and JP2005-329708A can be exemplified. Specifically, polymerizable compounds having an isocyanuric acid skeleton such as an ester of a polyhydric alcohol and an acrylic acid, an amide of a polyhydric amine and an acrylic acid, and isocyanurate ethylene oxide-modified acrylate and the like are exemplified.

The polymerizable compound different from the specific polymerizable compound which is contained in the image-recording layer is preferably a polymerizable compound having an acrylic group or a methacrylic group. In addition, the molecular weight of the polymerizable compound different from the specific polymerizable compound which is contained in the image-recording layer is preferably 1,500 or less. In the case of a polymer or the like, the molecular weight of the polymerizable compound different from the specific polymerizable compound is a standard polystyrene-equivalent mass average molecular weight measured by gel permeation chromatography (GPC).

(Binder Polymer)

The image-recording layer of the lithographic printing plate precursor of the embodiment of the present invention is capable of containing a binder polymer. The binder polymer contributes to the improvement of the film hardness of the image-recording layer. The binder polymer that is used in the image-recording layer is preferably a polymer having a film property, and it is possible to preferably use well-known binder polymers that are used in the image-recording layer of the lithographic printing plate precursor. Among them, as the binder polymer, a (meth)acrylic resin, a polyvinyl acetal resin, and a polyurethane resin are preferred.

As an example, a binder polymer that is used for an on-machine development-type lithographic printing plate precursor (hereinafter, also referred to as the binder polymer for on-machine development) will be described.

As the binder polymer for on-machine development, a binder polymer having an alkylene oxide chain is preferred. The binder polymer having an alkylene oxide chain may have a poly(alkylene oxide) portion in a main chain or in a side chain. In addition, the binder polymer may be a graft polymer having poly(alkylene oxide) in a side chain or a block copolymer of a block constituted of a poly(alkylene oxide)-containing repeating unit and a block constituted of an (alkylene oxide)-non-containing repeating unit.

In the case of having a poly(alkylene oxide) portion in the main chain, the binder polymer is preferably a polyurethane resin. As a polymer in the main chain in a case in which the binder polymer has a poly(alkylene oxide) portion in the side chain, a (meth)acrylic resin, a polyvinyl acetal resin, a polyurethane resin, a polyurea resin, a polyimide resin, a polyamide resin, an epoxy resin, a polystyrene resin, a novolac-type phenol resin, a polyester resin, synthetic rubber, and natural rubber are exemplified, and, particularly, a (meth)acrylic resin is preferred.

The alkylene oxide is preferably alkylene oxide having 2 to 6 carbon atoms and particularly preferably ethylene oxide or propylene oxide.

The number of times of repetition of the alkylene oxide in the poly(alkylene oxide) portion is preferably 2 to 120, more preferably 2 to 70, and still more preferably 2 to 50.

In a case in which the number of times of repetition of the alkylene oxide is 120 or less, neither the printing resistance against wear nor the printing resistance against the ink-receiving property degrades, which is preferable.

The poly(alkylene oxide) portion is preferably contained in a form of a structure represented by Formula (AO) as the side chain of the binder polymer and more preferably contained in a form of the structure represented by Formula (AO) as the side chain of the (meth)acrylic resin.

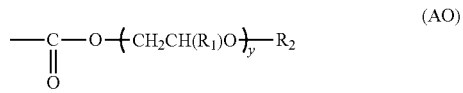

(AO)

In Formula (AO), y represents 2 to 120, $R_1$ represents a hydrogen atom or an alkyl group, and $R_2$ represents a hydrogen atom or a monovalent organic group.

The monovalent organic group is preferably an alkyl group having 1 to 6 carbon atoms, and a methyl group, an ethyl group, an n-propyl group, an isopropyl group, an n-butyl group, a sec-butyl group, an isobutyl group, a tert-butyl group, an n-pentyl group, an isopentyl group, a neopentyl group, an n-hexyl group, an isohexyl group, a 1,1-dimethylbutyl group, a 2,2-dimethylbutyl group, a cyclopentyl group, and a cyclohexyl group are exemplified.

In Formula (AO), y is preferably 2 to 70 and more preferably 2 to 50. $R_1$ is preferably a hydrogen atom or a methyl group and particularly preferably a hydrogen atom. $R_2$ is particularly preferably a hydrogen atom or a methyl group.

The binder polymer may have a crosslinking property in order to improve the membrane hardness of an image area. In order to provide a crosslinking property to the polymer, a crosslinking functional group such as an ethylenically unsaturated bond may be introduced to a main chain or a side chain of a polymer. The crosslinking functional group may be introduced by copolymerization or may be introduced by a polymer reaction.

Examples of a polymer having an ethylenically unsaturated bond in the main chain of the molecule include poly-1,4-butadiene, poly-1,4-isoprene, and the like.

Examples of a polymer having an ethylenically unsaturated bond in the side chain of the molecule include polymers that are an ester or an amide of acrylic acid or methacrylic acid and in which a residue (R in —COOR or —CONHR) of the ester or the amide is a polymer having an ethylenically unsaturated bond.

Examples of the residue (the R) having an ethylenically unsaturated bond can include —$(CH_2)_n CR^{1A}$=$CR^{2A}R^{3A}$, $(CH_2O)_n CH_2 CR^{1A}$=$CR^{2A}R^{3A}$, —$(CH_2CH_2O)_n CH_2 CR^{1A}$=$CR^{2A}R^{3A}$, —$(CH_2)_n NH$—CO—O—$CH_2 CR^{1A}$=$CR^{2A}R^{3A}$, —$(CH_2)_n$—O—CO—$CR^{1A}$=$CR^{2A}R^{3A}$, and —$(CH_2CH_2O)_2$—X (in the formulae, $R^{A1}$ to $R^{A3}$ each independently represent a hydrogen atom, a halogen atom, an alkyl group having 1 to 20 carbon atoms, an aryl group, an alkoxy group, or an aryloxy group, and $R^{A1}$ and $R^{A2}$ or $R^{A3}$ may be bonded to each other to form a ring. n represents an integer of 1 to 10. X represents a dicyclopentadienyl residue).

Specific examples of an ester residue include —$CH_2CH$=$CH_2$, —$CH_2CH_2O$—$CH_2CH$=$CH_2$, —$CH_2C(CH_3)$=$CH_2$, —$CH_2CH$=$CH$—$C_6H_5$, —$CH_2CH_2OCOCH$=$CH$—$C_6H_5$, —$CH_2CH_2$—$NHCOO$—$CH_2CH$=$CH_2$, and —$CH_2CH_2O$—X (in the formula, X represents a dicyclopentadienyl residue).

Specific examples of an amide residue include —$CH_2CH$=$CH_2$, —$CH_2CH_2$—Y (in the formula, Y represents a cyclohexene residue), and —$CH_2CH_2$—OCO—$CH$=$CH_2$.

The binder polymer having a crosslinking property is cured as follows: for example, a free radical (a polymerization initiation radical or a growth radical in a polymerization process of a polymerizable compound) is added to the crosslinking functional group, addition polymerization occurs between polymers directly or through the polymerization chain of the polymerizable compound, and a crosslink is formed between the polymer molecules, whereby the polymer is cured. Alternatively, an atom in the polymer (for example, a hydrogen atom on a carbon atom adjacent to the crosslinking functional group) is pulled off by a free radical, polymer radicals are generated, and the polymer radicals are bonded to each other, whereby a crosslink is formed between the polymer molecules, and the polymer is cured.

The content of the crosslinking group in the binder polymer (the content of an unsaturated double bond that is radical polymerizable by iodimetry) is preferably 0.1 to 10.0 mmol, more preferably 1.0 to 7.0 mmol, and particularly preferably 2.0 to 5.5 mmol per gram of the binder polymer from the viewpoint of a favorable sensitivity and a favorable storage stability.

Hereinafter, specific examples 1 to 11 of the binder polymer for on-machine development will be illustrated, but the present invention is not limited thereto. In the following exemplary compounds, numerical values described together with individual repeating units (numerical values described together with main chain repeating units) represent the molar percentages of the repeating units. Numerical values described together with side chain repeating units represent the number of times of repetition of the repeating portions. In addition, Me represents a methyl group, Et represents an ethyl group, and Ph represents a phenyl group.

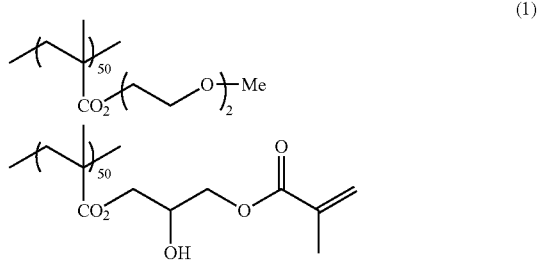

(1)

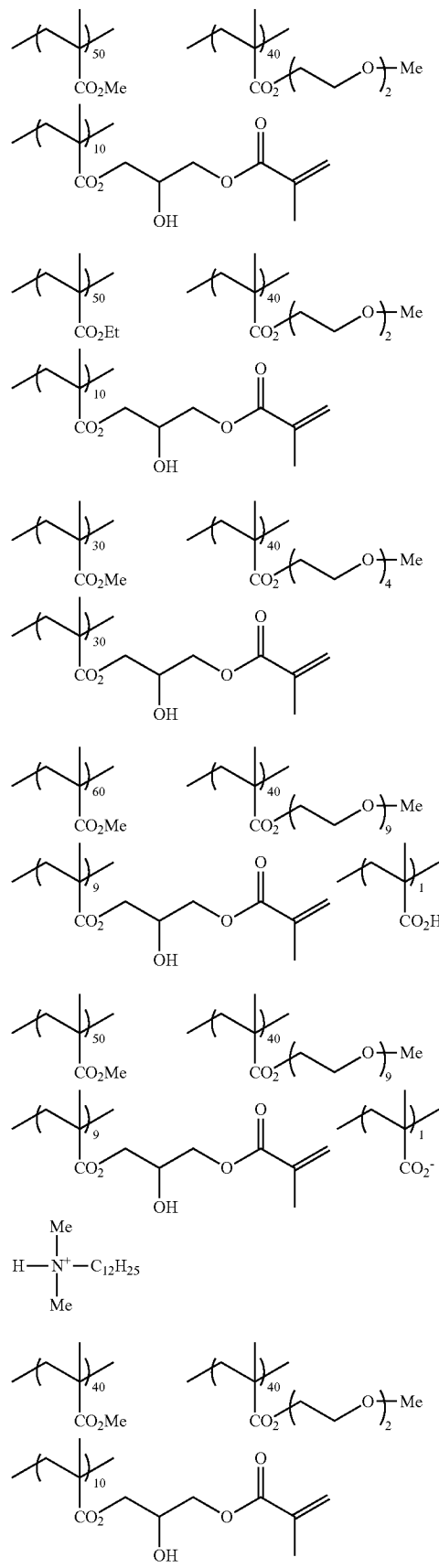
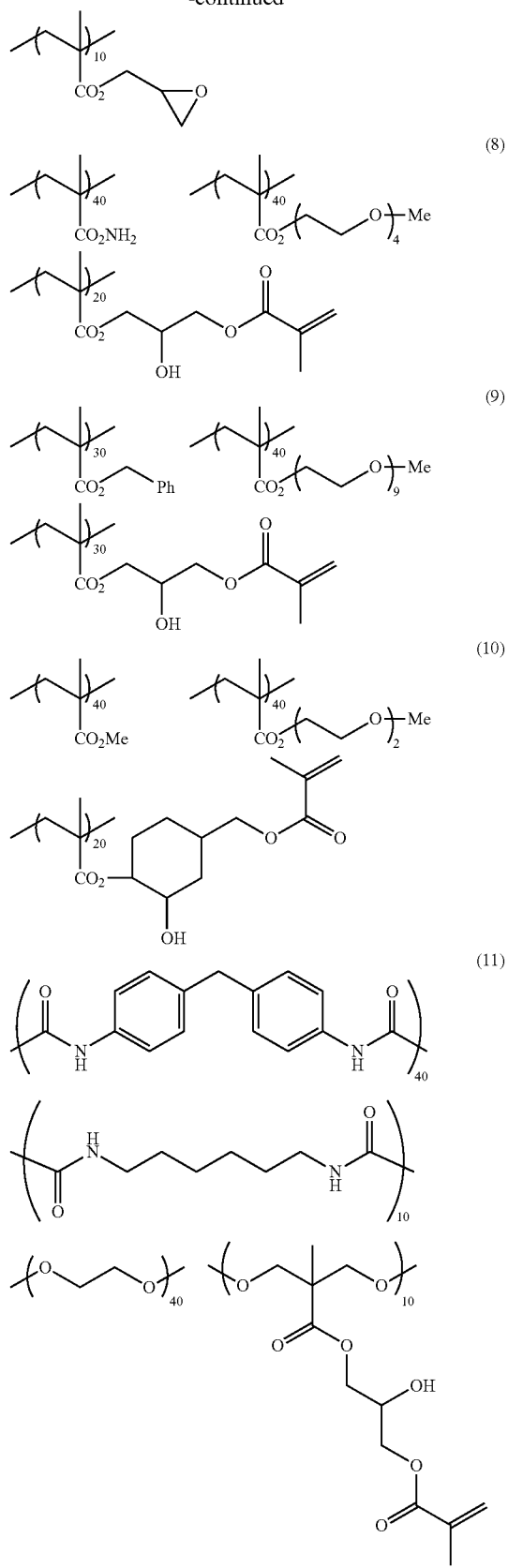
Regarding the molecular weight of the binder polymer, the mass average molecular weight (Mw) as a polystyrene equivalent value by a GPC method is preferably 2,000 or more, more preferably 5,000 or more, and still more preferably 10,000 to 300,000.

If necessary, it is possible to jointly use a hydrophilic polymer such as a polyacrylic acid, a polyvinyl alcohol, and the like described in JP2008-195018A. In addition, it is also possible to jointly use a lipophilic polymer and a hydrophilic polymer.

The binder polymer may be singly used or two or more binder polymers may be jointly used.

The content of the binder polymer is preferably 1% to 90% by mass, more preferably 5% to 80% by mass, and still more preferably 10% to 75% by mass of the total solid content of the image-recording layer.

(Radical Production Aid)

The image-recording layer of the lithographic printing plate precursor of the embodiment of the present invention is capable of containing a radical production aid. The radical production aid contributes to the improvement of the printing resistance of lithographic printing plates. Examples of the radical production aid include five kinds of radical production aids described below.

(i) Alkyl or acrylate complexes: It is considered that carbon-hetero bonds are oxidatively cleaved and active radicals are generated. Specific examples thereof include borate compounds and the like.

(ii) Amino acetate compounds: It is considered that C—X bonds on carbon adjacent to nitrogen are cleaved due to oxidation and active radicals are generated. X is preferably a hydrogen atom, a carboxy group, a trimethylsilyl group, or a benzyl group. Specific examples thereof include N-phenylglycines (which may have a substituent in a phenyl group), N-phenyl iminodiacetic acids (which may have a substituent in a phenyl group), and the like.

(iii) Sulfur-containing compounds: The above-described amino acetate compounds in which a nitrogen atom is substituted with a sulfur atom are capable of generating active radicals by means of the same action. Specific examples thereof include phenylthioacetic acids (which may have a substituent in a phenyl group) and the like.

(iv) Tin-containing compounds: The above-described amino acetate compounds in which a nitrogen atom is substituted with a tin atom are capable of generating active radicals by means of the same action.

(v) Sulfinates: Active radicals can be generated by means of oxidation. Specific examples thereof include sodium aryl sulfinate and the like.

Among these radical production aids, the image-recording layer of the lithographic printing plate precursor preferably contains a borate compound. The borate compound is preferably a tetraaryl borate compound or a monoalkyltriaryl borate compound, more preferably a tetraaryl borate compound from the viewpoint of the stability of the compound and a potential difference described below, and particularly preferably a tetraaryl borate compound having one or more aryl groups having an electron-attracting group from the viewpoint of the potential difference described below.

The electron-attracting group is preferably a group having a positive Hammett σ value and more preferably a group having a Hammett σ value of 0 to 1.2. Hammett σ values (a σp value and a σm value) are described in detail in Hansch, C.; Leo, A.; Taft, R. W., Chem. Rev., 1991, 91, 165-195.

The electron-attracting group is preferably a halogen atom, a trifluoromethyl group, or a cyano group and more preferably a fluorine atom, a chlorine atom, a trifluoromethyl group, or a cyano group.

A counter cation in the borate compound is preferably an alkali metal ion or a tetraalkyl ammonium ion and more preferably a sodium ion, a potassium ion, or a tetrabutylammonium ion.

Specific examples of the borate compound include compounds illustrated below. Here, $X_c^+$ represents a monovalent cation and is preferably an alkali metal ion or a tetraalkyl ammonium ion and more preferably an alkali metal ion or a tetrabutylammonium ion. In addition, Bu represents an n-butyl group.

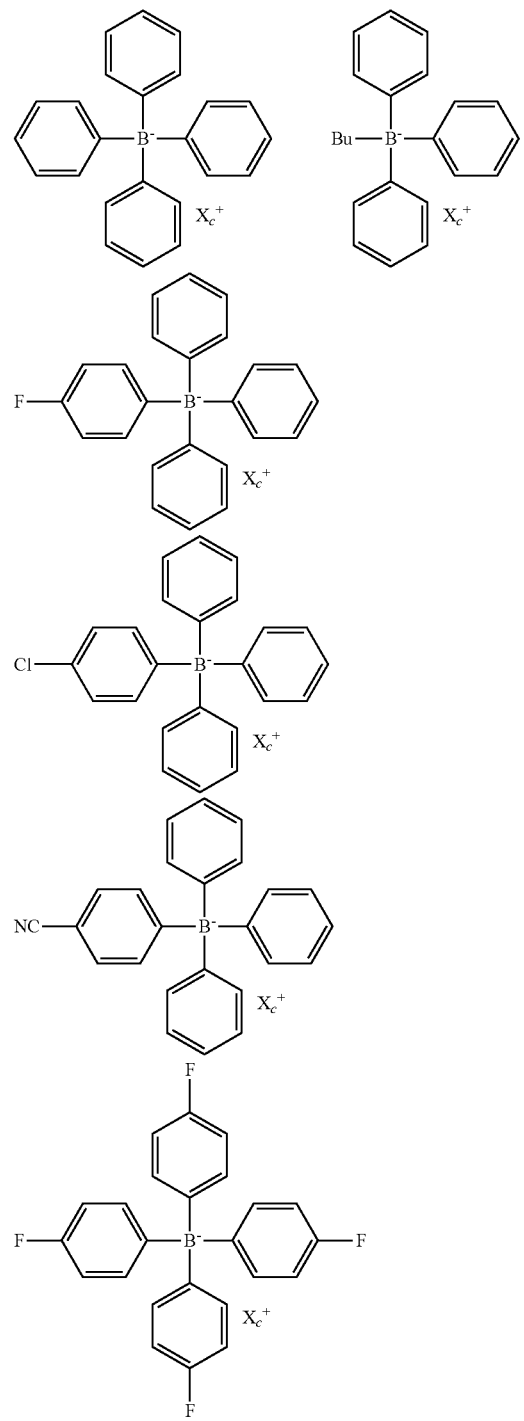

-continued
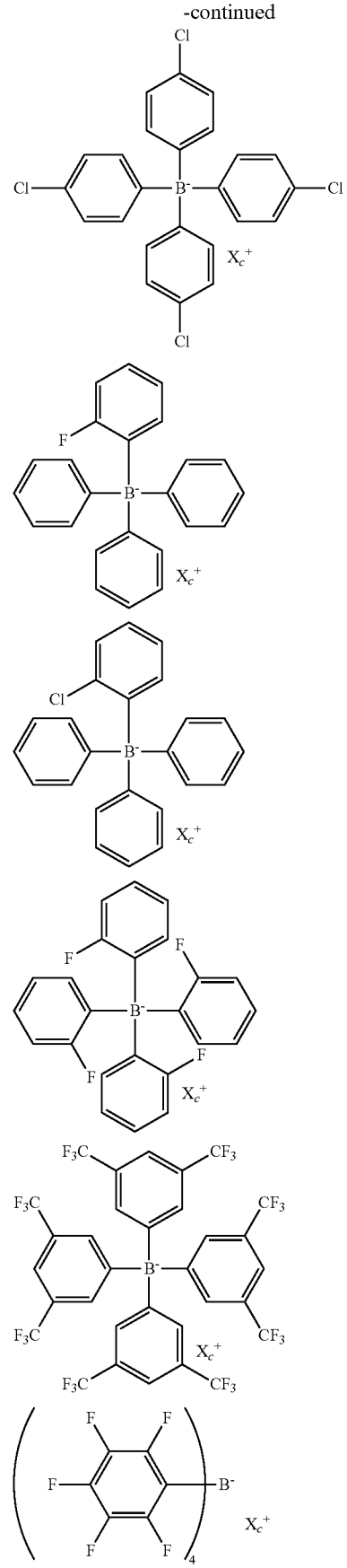
-continued
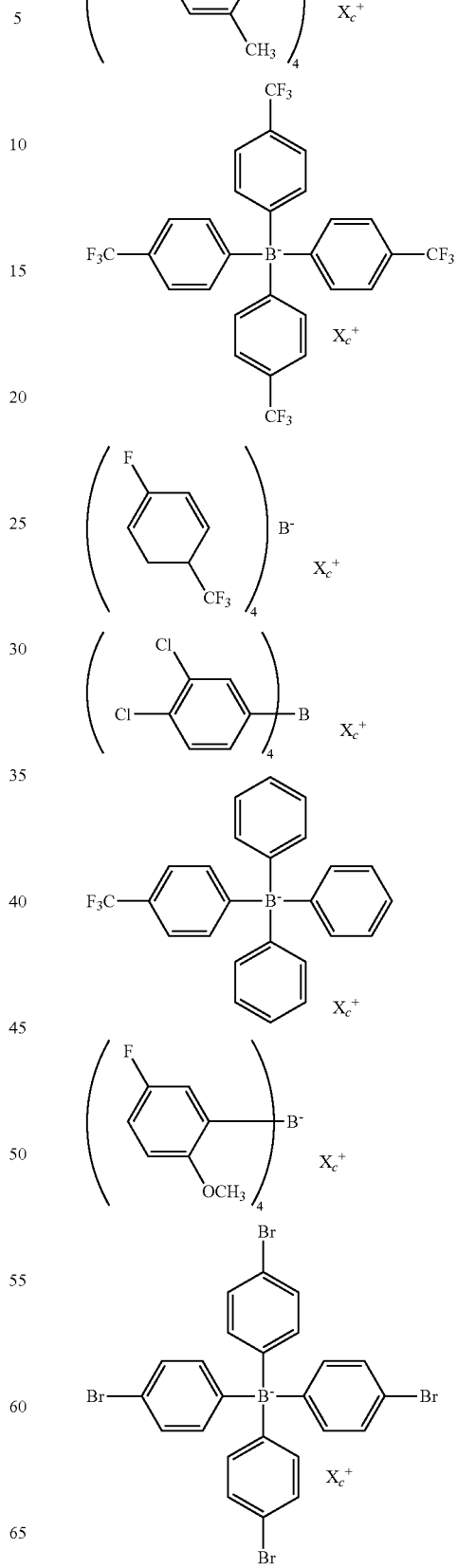

-continued

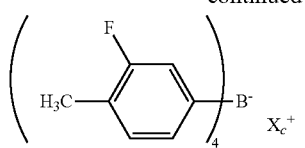

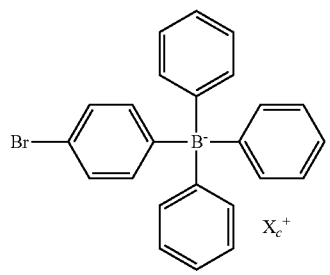

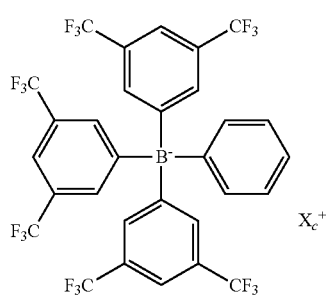

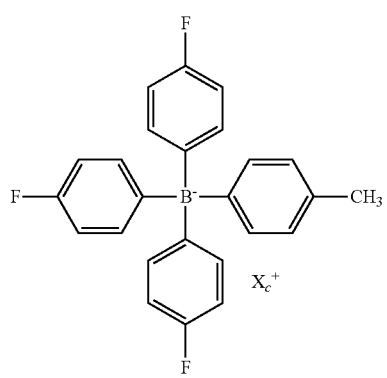

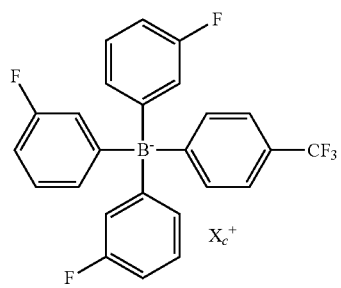

-continued

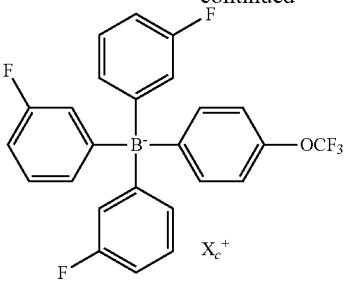

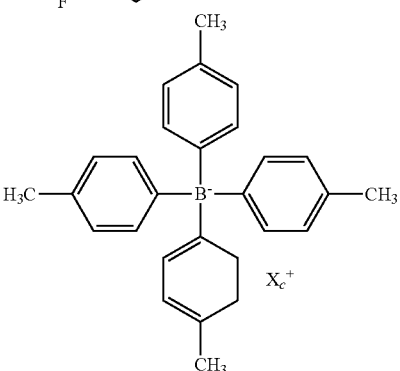

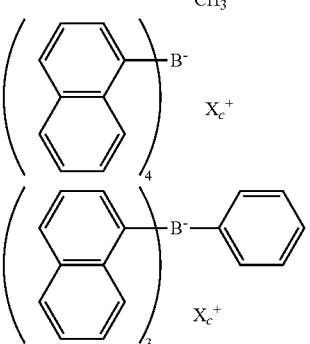

The radical production aid may be singly used or two or more radical production aids may be jointly used.

The content of the radical production aid is preferably 0.01% to 30% by mass, more preferably 0.05% to 25% by mass, and still more preferably 0.1% to 20% by mass of the total solid content of the image-recording layer.

<Chain Transfer Agent>

The image-recording layer of the lithographic printing plate precursor of the embodiment of the present invention is capable of containing a chain transfer agent. The chain transfer agent contributes to the improvement of the printing resistance in lithographic printing plates.

The chain transfer agent is preferably a thiol compound, more preferably a thiol having 7 or more carbon atoms from the viewpoint of the boiling point (difficulty of being volatilized), and still more preferably a compound having a mercapto group on an aromatic ring (aromatic thiol compound). The thiol compound is preferably a monofunctional thiol compound.

Specifically, as the chain transfer agent, the following compounds are exemplified.

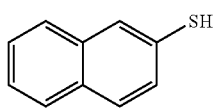 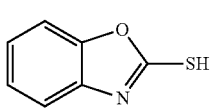 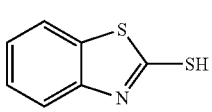 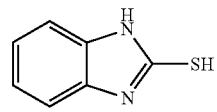

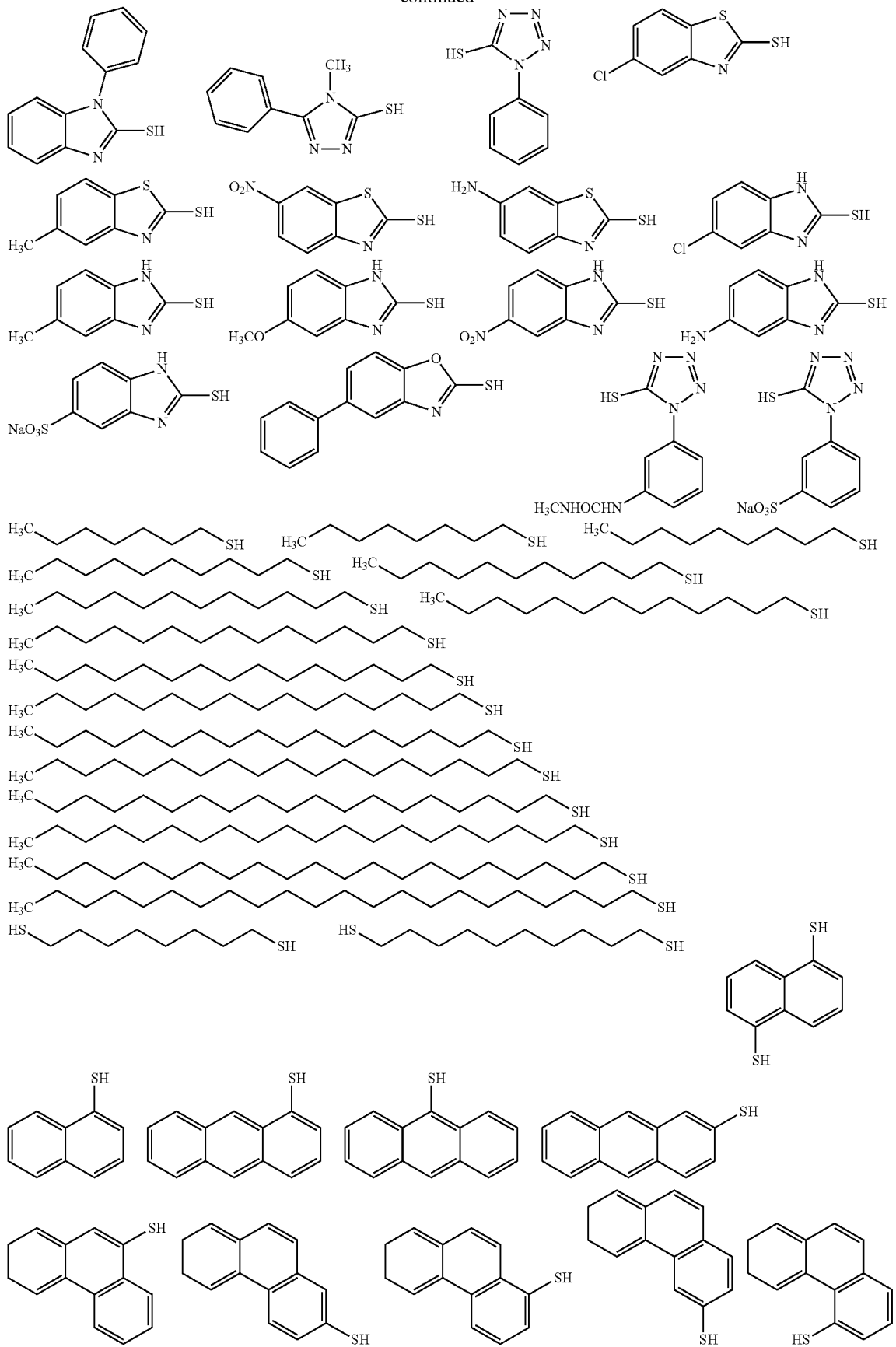

The chain transfer agent may be singly used or two or more chain transfer agents may be jointly used.

The content of the chain transfer agent is preferably 0.01% to 50% by mass, more preferably 0.05% to 40% by mass, and still more preferably 0.1% to 30% by mass of the total solid content of the image-recording layer.

The image-recording layer of the lithographic printing plate precursor of the embodiment of the present invention is capable of containing an acid color developing agent. The acid color developing agent contributes to the formation of a print-out image. The acid color developing agent refers to a compound having a property of developing color by being heated in a state of receiving an electron-receiving compound (for example, a proton such as an acid). The acid color developing agent is particularly preferably a colorless compound which has a partial skeleton such as lactone, lactam, sultone, spiropyran, an ester, or an amide and in which the partial skeleton rapidly ring-opens or cleavages in the case of coming into contact with the electron-receiving compound.

Examples of the acid color developing agent include phthalides such as 3,3-bis(4-dimethylaminophenyl)-6-dimethylaminophthalide (referred to as "crystal violet lactone"), 3,3-bis(4-dimethylaminophenyl)phthalide, 3-(4-dimethylaminophenyl)-3-(4-diethylamino-2-methylphenyl)-6-dimethylaminophthalide, 3-(4-dimethylaminophenyl)-3-(1,2-dimethylindol-3-yl)phthalide, 3-(4-dimethylaminophenyl)-3-(2-methylindol-3-yl)phthalide, 3,3-bis(1,2-dimethylindol-3-yl)-5-dimethylaminophthalide, 3,3-bis(1,2-dimethylindol-3-yl)-6-dimethylaminophthalide, 3,3-bis(9-ethylcarbazole-3-yl)-6-dimethylaminophthalide, 3,3-bis(2-phenylindol-3-yl)-6-dimethylaminophthalide, 3-(4-dimethylaminophenyl)-3-(1-methylpyrrole-3-yl)-6-dimethylaminophthalide, 3,3-bis[1,1-bis(4-dimethylaminophenyl)ethylene-2-yl]-4,5,6,7-tetrachlorophthalide, 3,3-bis[1,1-bis(4-pyrrolidinophenyl)ethylene-2-yl]-4,5,6,7-tetrabromophthalide, 3,3-bis[1-(4-dimethylaminophenyl)-1-(4-methoxyphenyl)ethylene-2-yl]-4,5,6,7-tetrachlorophthalide, 3,3-bis[1-(4-pyrrolidinophenyl)-1-(4-methoxyphenyl)ethylene-2-yl]-4,5,6,7-tetrachlorophthalide, 3-[1,1-di(1-ethyl-2-methylindol-3-yl)ethylene-2-yl]-3-(4-diethylaminophenyl)phthalide, 3-[1,1-di(1-ethyl-2-methylindol-3-yl)ethylene-2-yl]-3-(4-N-ethyl-N-phenylaminophenyl)phthalide, 3-(2-ethoxy-4-diethylamino)-3-(1-n-octyl-2-methylindol-3-yl)-phthalide, 3,3-bis(1-n-octyl-2-methylindol-3-yl)-phthalide, and 3-(2-methyl-4-diethylaminophenyl)-3-(1-n-octyl-2-methylindol-3-yl)-phthalide, fluoranthenes such as 4,4-bis-dimethylaminobenzhydryl benzyl ether, N-halophenyl-leucoauramine, N-2,4,5-trichlorophenyl leucoauramine, rhodamine-B-anilinolactam, rhodamine-(4-nitroanilino) lactam, rhodamine-B-(4-chloroanilino) lactam, 3,7-bis(diethylamino)-10-benzoylphenoxazine, benzoyl leuco methylene blue, 4-nitrobenzoylmethylene blue, 3,6-dimethoxyfluoran, 3-dimethylamino-7-methoxyfluoran, 3-diethylamino-6-methoxyfluoran, 3-diethylamino-7-methoxyfluoran, 3-diethylamino-7-chlorofluoran, 3-diethylamino-6-methyl-7-chlorofluoran, 3-diethylamino-6,7-dimethylfluoran, 3-N-cyclohexyl-N-n-butylamino-7-methylfluoran, 3-diethylamino-7-dibenzylaminofluoran, 3-diethylamino-7-octylaminofluoran, 3-diethylamino-7-di-n-hexylaminofluoran, 3-diethylamino-7-anilinofluoran, 3-diethylamino-7-(2'-fluorophenylamino)fluoran, 3-diethylamino-7-(2'-chlorophenylamino)fluoran, 3-diethylamino-7-(3'-chlorophenylamino)fluoran, 3-diethylamino-7-(2',3'-dichlorophenylamino)fluoran, 3-diethylamino-7-(3'-trifluoromethylphenylamino)fluorane, 3-di-n-butylamino-7-(2'-fluorophenylamino)fluoran, 3-di-n-butylamino-7-(2'-chlorophenylamino)fluoran, 3-N-isopentyl-N-ethylamino-7-(2'-chlorophenylamino)fluorane, 3-N-n-hexyl-N-ethylamino-7-(2'-chlorophenylamino)fluoran, 3-diethylamino-6-chloro-7-anilinofluoran, 3-di-n-butylamino-6-chloro-7-anilinofluoran, 3-diethylamino-6-methoxy-7-anilinofluoran, 3-di-n-butylamino-6-ethoxy-7-anilinofluoran, 3-pyrrolidino-6-methyl-7-anilinofluoran, 3-piperidino-6-methyl-7-anilinofluoran, 3-morpholino-6-methyl-7-anilinofluoran, 3-dimethylamino-6-methyl-7-anilinofluoran, 3-diethylamino-6-methyl-7-anilinofluoran, 3-di-n-butylamino-6-methyl-7-anilinofluoran, 3-di-n-pentylamino-6-methyl-7-anilinofluoran, 3-N-ethyl-N-methylamino-6-methyl-7-anilinofluoran, 3-N-n-propyl-N-methylamino-6-methyl-7-anilinofluoran, 3-N-n-propyl-N-ethylamino-6-methyl-7-anilinofluoran, 3-N-n-butyl-N-ethylamino-6-methyl-7-anilinofluoran, 3-N-isobutyl-N-ethylamino-6-methyl-7-anilinofluoran, 3-N-isopentyl-N-ethylamino-6-methyl-7-anilinofluoran, 3-N-n-hexyl-N-methylamino-6-methyl-7-anilinofluoran, 3-N-cyclohexyl-N-ethylamino-6-methyl-7-anilinofluoran, 3-N-cyclohexyl-N-n-propylamino-6-methyl-7-anilinofluoran, 3-N-cyclohexyl-N-n-butylamino-6-methyl-7-anilinofluoran, 3-N-cyclohexyl-N-n-hexylamino-6-methyl-7-anilinofluoran, 3-N-cyclohexyl-N-n-octylamino-6-methyl-7-anilinofluoran, 3-N-(2'-methoxyethyl)-N-methylamino-6-methyl-7-anilinofluoran, 3-N-(2'-methoxyethyl)-N-ethylamino-6-methyl-7-anilinofluoran, 3-N-(2'-methoxyethyl)-N-isobutylamino-6-methyl-7-anilinofluoran, 3-N-(2'-ethoxyethyl)-N-methylamino-6-methyl-7-anilinofluoran, 3-N-(2'-ethoxyethyl)-N-ethylamino-6-methyl-7-anilinofluoran, 3-N-(3'-methoxypropyl)-N-methylamino-6-methyl-7-anilinofluoran, 3-N-(3'-methoxypropyl)-N-ethylamino-6-methyl-7-anilinofluoran, 3-N-(3'-ethoxypropyl)-N-ethylamino-6-methyl-7-anilinofluoran, 3-N-(3'-ethoxypropyl)-N-methylamino-6-methyl-7-anilinofluoran, 3-N-(2'-tetrahydrofurfuryl)-N-ethylamino-6-methyl-7-anilinofluoran, 3-N-(4'-methylphenyl)-N-ethylamino-6-methyl-7-anilinofluoran, 3-diethylamino-6-methyl-7-anilinofluran, 3-diethylamino-6-methyl-7-(3'-methylphenylamino)fluoran, 3-diethylamino-6-methyl-7-(2',6'-methylphenylamino)fluoran, 3-di-n-butylamino-6-methyl-7-(2',6'-methylphenylamino)fluoran, 3-di-n-butylamino-7-(2',6'-dimethylphenylamino)fluoran, 2,2-bis[4'-(3-N-cyclohexyl-N-methylamino-6-methylfluoran)-7-ylaminophenyl]propane, 3-[4'-(4-phenylaminophenyl)aminophenyl]amino-6-methyl-7-chlorofluoran, and 3-[4'-(dimethylaminophenyl)] amino-5,7-dimethylfluoran, phthalides such as 3-(2-methyl-4-diethylaminophenyl)-3-(1-ethyl-2-methylindol-3-yl)-4-azaphthalide, 3-(2-n-propoxycarbonylamino-4-di-n-propylaminophenyl)-3-(1-ethyl-2-methylindol-3-yl)-4-azaphthalide, 3-(2-methylamino-4-di-n-propylaminophenyl)-3-(1-ethyl-2-methylindol-3-yl)-4-azaphthalide, 3-(2-methyl-4-di-n-hexylaminophenyl)-3-(1-n-octyl-2-methylindol-3-yl)-4,7-diazaphthalide, 3,3-bis(2-ethoxy-4-diethylaminophenyl)-4-azaphthalide, 3,3-bis(1-n-octyl-2-methylindol-3-yl)-4-azaphthalide, 3-(2-ethoxy-4-diethylaminophenyl)-3-(1-ethyl-2-methylindol-3-yl)-4-azaphthalide, 3-(2-ethoxy-4-diethylaminophenyl)-3-(1-octyl-2-methylindol-3-yl)-4 or 7-azaphthalide, 3-(2-ethoxy-4-diethylaminophenyl)-3-(1-ethyl-2-methylindol-3-yl)-4 or 7-azaphthalide, 3-(2-hexyloxy-4-diethylaminophenyl)-3-(1-ethyl-2-methylindol-3-yl)-4 or 7-azaphthalide, 3-(2-ethoxy-4-diethylaminophenyl)-3-(1-ethyl-2-phenylindol-3-yl)-4 or 7-azaphthalide, 3-(2-butoxy-4-diethylaminophenyl)-3-(1- ethyl-2-phenylindol-3-yl)-4 or 7-azaphthalide, 3-methyl-spiro-dinaphthopyran, 3-ethyl-spiro-dinaphthopyran, 3-phenyl-spiro-dinaphthopyran, 3-benzyl-spiro-dinaphthopyran, 3-methyl-naphtho-(3-methoxybenzo)spiropyran, 3-propyl-spiro-dibenzopyran-3,6-bis(dimethylamino)fluorene-9-spiro-3'-(6'-dimethylamino)phthalide, and 3,6-bis(diethylamino)fluorene-9-spiro-3'-(6'-dimethylamino)phthalide, additionally, 2'-anilino-6'-(N-ethyl-N-isopentyl)amino-3'-methylspiro[isobenzofuran-(3H), 9'-(9H) xanthene]-3-one, 2'-anilino-6'-(N-ethyl-N-(4-methylphenyl))amino-3'-methylspiro [isobenzofuran-1 (3H), 9'-(9H) xanthene]-3-one, 3'-N,N-dibenzylamino-6'-N,N-diethylaminospiro[isobenzofuran-1 (3H), 9'-(9H) xanthene]-3-one, 2'-(N-methyl-N-phenyl)amino-6'-(N-ethyl-N-(4-methylphenyl)) aminospiro [isobenzofuran-1 (3H), 9'-(9H) xanthene]-3-one, and the like.

Among these, the acid color developing agent is preferably a compound selected from a spiropyran compound, a spirooxazine compound, a spirolactone compound, and a spirolactam compound.

The hue of the colorant after color development is preferably green, blue, or black from the viewpoint of visibility.

As the acid color developing agent, it is also possible to use commercially available products, and examples thereof include ETAC, RED 500, RED 520, CVL, S-205, BLACK 305, BLACK 400, BLACK 100, BLACK 500, H-7001, GREEN 300, NIRBLACK 78, BLUE 220, H-3035, BLUE 203, ATP, H-1046, H-2114 (all manufactured by Fukui Yamada Chemical Co., Ltd.), ORANGE-DCF, Vermilion-DCF, PINK-DCF, RED-DCF, BLMB, CVL, GREEN-DCF, TH-107 (all manufactured by Hodogaya Chemical Co., Ltd.), ODB, ODB-2, ODB-4, ODB-250, ODB-Black XV, Blue-63, Blue-502, GN-169, GN-2, Green-118, Red-40, Red-8 (all manufactured by Yamamoto Chemicals Inc.), crystal violet lactone (manufactured by Tokyo Chemical Industry Co., Ltd.), and the like. Among these commercially available products, ETAC, S-205, BLACK 305, BLACK 400, BLACK 100, BLACK 500, H-7001, GREEN 300, NIRBLACK 78, H-3035, ATP, H-1046, H-2114, GREEN-DCF, Blue-63, GN-169, and crystal violet lactone are preferred since the visible light absorbance of films to be formed is favorable.

The acid color developing agent may be singly used, or two or more acid color developing agents may be jointly used.

The content of the acid color developing agent is preferably 0.1% to 20% by mass, more preferably 1% to 15% by mass, and still more preferably 2% to 10% by mass of the total solid content of the image-recording layer.

(Low-Molecular-Weight Hydrophilic Compound)

The image-recording layer of the lithographic printing plate precursor of the embodiment of the present invention is capable of containing a low-molecular-weight hydrophilic compound. The low-molecular-weight hydrophilic compound contributes to the improvement of on-machine developability or developability without degrading printing resistance. The low-molecular-weight hydrophilic compound is preferably a compound having a molecular weight of smaller than 1,000, more preferably a compound having a molecular weight of smaller than 800, and still more preferably a compound having a molecular weight of smaller than 500.

As the low-molecular-weight hydrophilic compound, examples of water-soluble organic compounds include glycols such as ethylene glycol, diethylene glycol, triethylene glycol, propylene glycol, dipropylene glycol, and tripropylene glycol and ethers or ester derivative thereof, polyols such as glycerin, pentaerythritol, and tris(2-hydroxyethyl) isocyanurate, organic amines such as triethanolamine, diethanolamine, and monoethanolamine and salts thereof, organic sulfonic acids such as alkyl sulfonic acid, toluenesulfonic acid, and benzenesulfonic acid and salts thereof, organic sulfamic acids such as alkyl sulfamate and salts thereof, organic sulfuric acids such as alkyl sulfates and alkyl ether sulfates and salts thereof, organic phosphonic acids such as phenylphosphonic acid and salts thereof, organic carboxylic acids such as tartaric acid, oxalic acid, citric acid, malic acid, lactic acid, gluconic acid, and amino acid and salts thereof, betaines, and the like.

As the low-molecular-weight hydrophilic compound, at least one selected from polyols, organic sulfates, organic sulfonates, or betaines is preferably contained.

Specific examples of the organic sulfonates include alkyl sulfonates such as sodium n-butyl sulfonate, sodium n-hexyl sulfonate, sodium 2-ethylhexyl sulfonate, sodium cyclohexyl sulfonate, and sodium n-octyl sulfonate; alkyl sulfonates having ethylene oxide chains such as sodium 5,8,11-trioxapentadecane-1-sulfonate, sodium 5,8,11-trioxaheptadecane-1-sulfonate, sodium 13-ethyl-5,8,11-trioxaheptadecane-1-sulfonate, sodium 5,8,11,14-tetraoxatetracosane-1-sulfonate; aryl sulfonates such as sodium benzene sulfonate, sodium p-toluenesulfonate, sodium p-hydroxybenzene sulfonate, sodium p-styrene sulfonate, sodium dimethyl isophthalate-5-sulfonate, sodium 1-naphthyl sulfonate, sodium 4-hydroxynaphthylsulfonate, sodium 1,5-naphthalene disulfonate, and trisodium 1,3,6-naphthalene trisulfonate; compounds described in Paragraphs 0026 to 0031 of JP2007-276454A and Paragraphs 0020 to 0047 of JP2009-154525A; and the like. The salts may be potassium salts or lithium salts.

Examples of the organic sulfates include sulfates of alkyls, alkenyls, alkynyls, aryls, or heterocyclic monoethers of polyethylene oxides. The number of ethylene oxide units is preferably in a range of 1 to 4, and the salts are preferably sodium salts, potassium salts, or lithium salts. Specific examples thereof include compounds described in Paragraphs 0034 to 0038 of JP2007-276454A.

The betaines are preferably compounds in which the number of carbon atoms in hydrocarbon substituents into nitrogen atoms is in a range of 1 to 5, and specific examples thereof include trimethyl ammonium acetate, dimethyl propyl ammonium acetate, 3-hydroxy-4-trimethyl ammonio butyrate, 4-(1-pyridinio) butyrate, 1-hydroxyethyl-1-imidazolio acetate, trimethyl ammonium methanesulfonate, dimethyl propyl ammonium methanesulfonate, 3-trimethylammonio-1-propane sulfonate, 3-(1-pyridinio)-1-propane sulfonate, and the like.

Since the low-molecular-weight hydrophilic compound has a small structure in hydrophobic portions and barely has surfactant actions, there are no cases in which dampening water permeates exposed portions (image areas) in the image-recording layer and thus the hydrophobic properties or membrane hardness of the image areas degrade, and it is possible to favorably maintain the ink-receiving properties or printing resistance of the image-recording layer.

The low-molecular-weight hydrophilic compound may be singly used or two or more low-molecular-weight hydrophilic compounds may be jointly used.

The content of the low-molecular-weight hydrophilic compound is preferably in a range of 0.5% to 20% by mass, more preferably in a range of 1% to 15% by mass, and still more preferably in a range of 2% to 10% by mass of the total solid content of the image-recording layer.

(Sensitization Agent)

The image-recording layer of the lithographic printing plate precursor of the embodiment of the present invention is capable of containing a sensitization agent such as a phosphonium compound, a nitrogen-containing low-molecular-weight compound, or an ammonium group-containing polymer. The sensitization agent contributes to the improvement of the ink-absorbing properties in the lithographic printing plate. Particularly, in a case in which a protective layer is provided on the image-recording layer, and an inorganic lamellar compound is contained in the protective layer, these compounds function as surface coating agents for the inorganic lamellar compound and are capable of suppressing the ink-absorbing properties from being degraded in the middle of printing due to the inorganic lamellar compound.

Among these, a phosphonium compound, a nitrogen-containing low-molecular-weight compound, and an ammonium group-containing polymer are preferably jointly used as the sensitization agent, and a phosphonium compound, quaternary ammonium salts, and an ammonium group-containing polymer are more preferably jointly used.

Examples of a phosphonium compound include phosphonium compounds described in JP2006-297907A and JP2007-050660A. Specific examples thereof include tetrabutylphosphonium iodide, butyltriphenylphosphonium bromide, tetraphenylphosphonium bromide, 1,4-bis(triphenylphosphonio)butane=di(hexafluorophosphate), 1,7-bis(triphenylphosphonio)heptane=sulfate, 1,9-bis(triphenylphosphonio)nonane=naphthalene-2,7-disulfonate, and the like.

Examples of the nitrogen-containing low-molecular-weight compound include amine salts and quaternary ammonium salts. In addition, examples thereof include imidazolinium salts, benzo imidazolinium salts, pyridinium salts, and quinolinium salts. Among these, quaternary ammonium salts and pyridinium salts are preferred. Specific examples thereof include tetramethylammonium=hexafluorophosphate, tetrabutylammonium=hexafluorophosphate, dodecyltrimethylammonium=p-toluene sulfonate, benzyltriethylammonium=hexafluorophosphate, benzyldimethyloctylammonium=hexafluorophosphate, benzyldimethyldodecylammonium=hexafluorophosphate, compounds described in Paragraphs 0021 to 0037 of JP2008-284858A and Paragraphs 0030 to 0057 of JP2009-090645A, and the like.

The ammonium group-containing polymer needs to have an ammonium group in the structure, and polymers including 5% to 80% by mol of (meth)acrylate having ammonium groups in side chains as copolymerization components are preferred. Specific examples thereof include polymers described in Paragraphs 0089 to 0105 of JP2009-208458A.

In the ammonium group-containing polymer, the value of the reducing specific viscosity (unit: ml/g) obtained according to the measurement method described in JP2009-208458A is preferably in a range of 5 to 120, more preferably in a range of 10 to 110, and particularly preferably in a range of 15 to 100. In a case in which the reducing specific viscosity is converted to the mass average molecular weight (Mw), the weight-average molecular weight is preferably in a range of 10,000 to 150,000, more preferably in a range of 17,000 to 140,000, and particularly preferably in a range of 20,000 to 130,000.

Hereinafter, specific examples of the ammonium group-containing polymer will be described.

(1) 2-(Trimethylammonio)ethyl methacrylate=p-toluene-sulfonate/3,6-dioxaheptyl methacrylate copolymer (molar ratio: 10/90, Mw: 45,000)

(2) 2-(Trimethylammonio)ethyl methacrylate=hexafluorophosphate/3,6-dioxaheptyl methacrylate copolymer (molar ratio: 20/80, Mw: 60,000)

(3) 2-(Ethyldimethylammonio)ethyl methacrylate=p-toluenesulfonate/hexyl methacrylate copolymer (molar ratio: 30/70, Mw: 45,000)

(4) 2-(Trimethylammonio)ethyl methacrylate=hexafluorophosphate/2-ethylhexyl methacrylate copolymer (molar ratio: 20/80, Mw: 60,000)

(5) 2-(Trimethylammonio)ethyl methacrylate=methylsulfate/hexyl methacrylate copolymer (molar ratio: 40/60, Mw: 70,000)

(6) 2-(Butyldimethylammonio)ethyl methacrylate=hexafluorophosphate/3,6-dioxaheptyl methacrylate copolymer (molar ratio: 25/75, Mw: 65,000)

(7) 2-(Butyldimethylammonio)ethyl acrylate=haxafluorophosphate/3,6-dioxaheptyl methacrylate copolymer (molar ratio: 20/80, Mw: 65,000)

(8) 2-(Butyldimethylammonio)ethyl methacrylate=13-ethyl-5,8,11-trioxa-1-heptadecanesulfonate/3,6-dioxaheptyl methacrylate copolymer (molar ratio: 20/80, Mw: 75,000)

(9) 2-(Butyldimethylammonio)ethyl methacrylate=haxafluorophosphate/3,6-dioxaheptyl methacrylate/2-hydroxy-3-methacryloyloxypropyl methacrylate copolymer (molar ratio: 15/80/5, Mw: 65,000)

The content of the sensitization agent is preferably in a range of 0.01% to 30.0% by mass, more preferably in a range of 0.1% to 15.0% by mass, and still more preferably in a range of 1% to 10% by mass of the total solid content of the image-recording layer.

(Coloring Agent)

The image-recording layer in the lithographic printing plate precursor of the embodiment of the present invention may contain a dye having a high absorption in the visible light range as a coloring agent of images. Specific examples thereof include OIL YELLOW #101, OIL YELLOW #103, OIL PINK #312, OIL GREEN BG, OIL BLUE BOS, OIL BLUE #603, OIL BLACK BY, OIL BLACK BS, OIL BLACK T-505 (all manufactured by Orient Chemical Industries, Ltd.), VICTORIA PURE BLUE, CRYSTAL VIOLET (CI42555), METHYL VIOLET (CI42535), ETHYL VIOLET, ETHYL VIOLET 6HNAPS, RHODAMINE B (CI145170B), MALACHITE GREEN (CI42000), METHYLENE BLUE (CI52015), and dyes described in JP1987-293247A (JP-S62-293247A). In addition, pigments such as phthalocyanine-based pigment, azo-based pigments, carbon black, and titanium oxide can also be preferably used. The image-recording layer preferably contains a coloring agent since it becomes easy to differentiate an image area and a non-image area after the formation of an image in the case of containing the coloring agent.

The amount of the coloring agent added is preferably 0.005% to 10% by mass of the total solid content of the image-recording layer.

(Other Components)

The image-recording layer of the lithographic printing plate precursor of the embodiment of the present invention is capable of containing, as other components, a surfactant, a polymerization inhibitor, a higher-fatty acid derivative, a plasticizer, inorganic particles, an inorganic lamellar compound, or the like. Specifically, the composition may contain individual components described in Paragraphs 0114 to 0159 of JP2008-284817A.

(Formation of Image-Recording Layer)

The image-recording layer of the lithographic printing plate precursor according to the embodiment of the present invention can be formed by, for example, as described in Paragraphs 0142 and 0143 of JP2008-195018A, preparing a coating fluid by dispersing or dissolving the respective necessary components described above in a well-known solvent, applying the coating fluid onto a support using a well-known method such as bar coater coating, and drying the coating fluid. The coating amount (solid content) of the image-recording layer applied after application and drying varies depending on applications; however, is, generally, preferably 0.3 to 3.0 g/m². Within this range, a favorable sensitivity and favorable membrane characteristics of the image-recording layer can be obtained.

[Undercoat Layer]

The lithographic printing plate precursor according to the embodiment of the present invention preferably has an undercoat layer (in some cases, referred to as the interlayer) between the image-recording layer and the support. The undercoat layer strengthens adhesiveness between the support and the image-recording layer in exposed portions and facilitates peeling the support and the image-recording layer in non-exposed portions, and thus the undercoat layer contributes to improving developability without impairing printing resistance. In addition, in the case of exposure using infrared lasers, the undercoat layer functions as an adiabatic layer and thus has an effect of preventing the sensitivity from being degraded due to the diffusion of heat generated by exposure in the support.

Examples of compounds that can be used for the undercoat layer include polymers having adsorbent groups that can be adsorbed to the surface of the support and hydrophilic groups. In order to improve adhesiveness to the image-recording layer, polymers having adsorbent groups and hydrophilic groups and further having crosslinking groups are preferred. The compounds that can be used for the undercoat layer may be low-molecular-weight compounds or polymers. The compounds that can be used for the undercoat layer may be used in a mixed form of two or more kinds as necessary.

In a case in which the compounds that are used for the undercoat layer are polymers, copolymers of monomers having adsorbent groups, monomers having hydrophilic groups, and monomers having crosslinking groups are preferred.

The adsorbent groups that can be adsorbed to the surface of the support are preferably phenolic hydroxy groups, carboxy groups, —PO$_3$H$_2$, —OPO$_3$H$_2$, —CONHSO$_2$—, —SO$_2$NHSO$_2$—, —COCH$_2$COCH$_3$. The hydrophilic groups are preferably sulfo groups or salts thereof and salts of carboxy groups. The crosslinking groups are preferably acrylic groups, methacryl groups, acrylamide groups, methacrylamide groups, allyl groups, and the like.

The polymers may have crosslinking groups introduced due to the formation of salts between polar substituents of the polymers and compounds having substituents having the polar substituents and opposite charges of the above-described polar substituents and ethylenically unsaturated bonds and may be further copolymerized with monomers other than the above-described monomers, preferably, hydrophilic monomers.

Specifically, preferred examples thereof include silane coupling agents having ethylenic double bond reactive groups that are capable of addition polymerization described in JP1998-282679A (JP-H10-282679A) and phosphorus compounds having ethylenic double bond reactive groups described in JP1990-304441A (JP-H02-304441A). Low-molecular-weight or high-molecular-weight compounds having crosslinking groups (preferably ethylenically unsaturated bond groups), functional groups that interact with the surface of the support, and hydrophilic groups described in JP2005-238816A, JP2005-125749A, JP2006-239867A, and JP2006-215263A are also preferably used.

More preferred examples thereof include high-molecular-weight polymers having adsorbent groups that can be adsorbed to the surface of the support, hydrophilic groups, and crosslinking groups described in JP2005-125749A and JP2006-188038A.

The content of ethylenically unsaturated bond groups in the polymer that is used in the undercoat layer is preferably in a range of 0.1 to 10.0 mmol and more preferably in a range of 0.2 to 5.5 mmol per gram of the polymer.

The mass average molecular weight (Mw) of the polymer that is used in the undercoat layer is preferably 5,000 or higher and more preferably in a range of 10,000 to 300,000.

In addition to the above-described compounds for the undercoat layer, the undercoat layer may also include a chelating agent, secondary or tertiary amines, a polymerization inhibitor, compounds having amino groups or functional groups having a polymerization-inhibiting function and groups that interact with the surfaces of supports (for example, 1,4-diazabicyclo[2.2.2]octane (DABCO), 2,3,5,6-tetrahydroxy-p-quinone, chloranil, sulfophthalic acid, hydroxyethyl ethylene diamine triacetic acid, dihydroxyethyl ethylenediamine diacetic acid, hydroxyethyl iminodiacetic acid, and the like), and the like in order to prevent contamination over time.

The undercoat layer is formed using well-known coating methods. The coating amount (solid content) of the undercoat layer is preferably in a range of 0.1 to 100 mg/m² and more preferably in a range of 1 to 30 mg/m².

[Protective Layer]

The lithographic printing plate precursor according to the embodiment of the present invention may have a protective layer (in some cases, also referred to as the overcoat layer) on the image-recording layer. The protective layer has a function of suppressing image formation-inhibiting reactions caused by the shielding of oxygen and additionally has a function of preventing the generation of damage in the image-recording layer and abrasion prevention during exposure using high-illuminance lasers.

Protective layers having the above-described characteristics are described in, for example, the specification of U.S. Pat. No. 3,458,311A and JP1980-049729B (JP-S55-049729B). As poor oxygen-transmissible polymers that can be used for the protective layer, it is possible to appropriately select and use any one of water-soluble polymers and water-insoluble polymers, and, if necessary, it is also possible to use two or more polymers in a mixed form. Specific examples thereof include polyvinyl alcohols, modified polyvinyl alcohols, polyvinyl pyrrolidone, water-soluble cellulose derivatives, poly(meth)acrylonitrile, and the like.

As the modified polyvinyl alcohols, acid-modified polyvinyl alcohols having carboxy groups or sulfo groups are preferably used. Specific examples thereof include modified-polyvinyl alcohols described in JP2005-250216A and JP2006-259137A.

The protective layer preferably includes inorganic lamellar compounds in order to enhance oxygen-shielding properties. The inorganic lamellar compounds refer to particles having thin flat plate shapes, and examples thereof include mica groups such as natural mica and synthetic mica, talc represented by Formula 3MgO.4SiO.H$_2$O, taeniolite, montmorillonite, saponite, hectorite, zirconium phosphate, and the like.

The inorganic lamellar compounds that can be preferably used are mica compounds. Examples of mica compounds include mica groups such as natural mica and synthetic mica represented by Formula: A(B, C)$_{2-5}$D$_4$O$_{10}$(OH, F, O)$_2$ [here, A is any of K, Na, or Ca, B and C are any of Fe (II), Fe (III), Mn, Al, Mg, and V, and D is Si or Al.].

In the mica groups, examples of natural mica include white mica, soda mica, gold mica, black mica, and lepidolite. Examples of synthetic mica include non-swelling mica such as fluorphlogopite KMg$_3$(AlSi$_3$O$_{10}$)F$_2$, potassium tetrasilic mica KMg$_{2.5}$(Si$_4$O$_{10}$)F$_2$, and, Na tetrasilylic mica NaMg$_{2.5}$(Si$_4$O$_{10}$)F$_2$, swelling mica such as Na or Li taeniolite (Na, Li)Mg$_2$Li(Si$_4$O$_{10}$)F$_2$, montmorillonite-based Na or Li hectorite (Na, Li)$_{1/8}$Mg$_{2/5}$Li$_{1/8}$(Si$_4$O$_{10}$)F$_2$, and the like. Furthermore, synthetic smectite is also useful.

Among the mica compounds, fluorine-based swelling mica is particularly useful. That is, swelling synthetic mica has a laminate structure consisting of unit crystal lattice layers having a thickness in a range of approximately 10 to 15A, and metal atoms in lattices are more actively substituted than in any other clay minerals. As a result, positive charges are deficient in the lattice layers, and positive ions such as Li$^+$, Na$^+$, Ca$^{2+}$, and Mg$^{2+}$ are adsorbed between the layers in order to compensate for the deficiency. Positive ions interposed between the layers are referred to as exchangeable positive ions and are exchangeable with various positive ions. Particularly, in a case in which the positive ions between the layers are Li$^+$ and Na$^+$, the ionic radii are small, and thus the bonds between lamellar crystal lattices are weak, and mica is significantly swollen by water. In a case in which shear is applied in this state, mica easily cleavages and forms a stable sol in water. The above-described tendency of swelling synthetic mica is strong, and the swelling synthetic mica is particularly preferably used.

From the viewpoint of diffusion control, regarding the shapes of the mica compounds, the thickness is preferably thin, and the planar size is preferably large as long as the smoothness and active light ray-transmitting properties of coated surfaces are not impaired. Therefore, the aspect ratio is preferably 20 or higher, more preferably 100 or higher, and particularly preferably 200 or higher. The aspect ratio is the ratio of the long diameter to the thickness of a particle and can be measured from projection views obtained from the microphotograph of the particle. As the aspect ratio increases, the obtained effect becomes stronger.

Regarding the particle diameters of the mica compound, the average long diameter thereof is preferably in a range of 0.3 to 20 µm, more preferably in a range of 0.5 to 10 µm, and particularly preferably in a range of 1 to 5 µm. The average thickness of the particles is preferably 0.1 µm or smaller, more preferably 0.05 µm or smaller, and particularly preferably 0.01 µm or smaller. Specifically, for example, in the case of swelling synthetic mica which is a typical compound, a preferred aspect has a thickness in a range of approximately 1 to 50 nm and a surface size (long diameter) in a range of approximately 1 to 20 µm.

The content of the inorganic lamellar compound is preferably in a range of 0% to 60% by mass and more preferably in a range of 3% to 50% by mass of the total solid content of the protective layer. Even in a case in which multiple kinds of inorganic lamellar compounds are jointly used, the total amount of the inorganic lamellar compounds is preferably the above-described content. Within the above-described range, the oxygen-shielding properties improve, and a favorable sensitivity can be obtained. In addition, the degradation of the ink-absorbing properties can be prevented.

The protective layer may include well-known additives such as a plasticizer for imparting flexibility, a surfactant for improving coating properties, and inorganic fine particles for controlling sliding properties on the surface. In addition, the sensitization agent described in the section of the image-recording layer may be added to the protective layer.

The protective layer is formed using a well-known coating method. The coating amount of the protective layer (solid content) is preferably in a range of 0.01 to 10 g/m$^2$, more preferably in a range of 0.02 to 3 g/m$^2$, and particularly preferably in a range of 0.02 to 1 g/m$^2$.

[Support]

An aluminum support in the lithographic printing plate precursor according to the embodiment of the present invention can be appropriately selected from well-known aluminum supports for a lithographic printing plate precursor and used. The aluminum support is preferably an aluminum plate which has been roughened using a well-known method and anodized.

On the aluminum plate, as necessary, enlargement processes or sealing processes of micropores in anodized films described in JP2001-253181A and JP2001-322365A, surface hydrophilization processes using alkali metal silicate as described in the specifications of U.S. Pat. Nos. 2,714,066A, 3,181,461A, 3,280,734A, and 3,902,734A, and surface hydrophilization processes using polyvinyl phosphate or the like as described in the specifications of U.S. Pat. Nos. 3,276,868A, 4,153,461A, and 4,689,272A may be appropriately selected and carried out.

In the aluminum support, the center line average roughness is preferably in a range of 0.10 to 1.2 µm.

The aluminum support may have, as necessary, a backcoat layer including an organic polymer compound described in JP1993-045885A (JP-H05-045885A) or an alkoxy compound of silicon described in JP1994-035174A (JP-H06-035174A) on the surface opposite to the image-recording layer.

[Method for Producing Lithographic Printing Plate]

A method for producing a lithographic printing plate according to the embodiment of the present invention preferably includes a step of image-exposing the lithographic printing plate precursor according to the embodiment of the present invention (exposure step) and a step of removing a non-exposed portion of the image-recording layer of the image-exposed lithographic printing plate precursor using at least any of printing ink or dampening water on a printer (on-machine development step).

In addition, the method for producing a lithographic printing plate according to the embodiment of the present invention preferably includes a step of image-exposing the lithographic printing plate precursor of the embodiment of the present invention (exposure step) and a step of removing a non-exposed portion of the image-recording layer from the image-exposed lithographic printing plate precursor using a developer having a pH of 2 to 11 (development process step).

[Exposure Step]

Image exposure is preferably carried out using a method in which digital data are scanned and exposed using an infrared laser or the like.

The wavelength of the exposure light source is preferably in a range of 750 nm to 1,400 nm. The light source having a wavelength in a range of 750 nm to 1,400 nm is preferably a solid-state laser or a semiconductor laser that radiates infrared rays. The exposure mechanism may be any one of in-plane drum methods, external surface drum methods, flat head methods, and the like.

The exposure step can be carried out using platesetters or the like and well-known methods. In addition, in the case of including the on-machine development step, exposure may be carried out on a printer using a printer comprising an exposure device after the lithographic printing plate precursor is mounted on the printer.

[On-Machine Development Step]

In the on-machine development step, in a case in which printing is initiated by supplying printing ink and dampening water on the printer without carrying out any development processes on the image-exposed lithographic printing plate precursor, non-exposed portions on the lithographic printing plate precursor are removed at the initial stage of printing, and accordingly, the hydrophilic surface of the support is exposed, and non-image areas are formed. As the printing ink and the dampening water, well-known printing ink and dampening water for lithographic printing are used. Any of printing ink and dampening water may be first supplied to the surface of the lithographic printing plate precursor, but it is preferable to first supply printing ink from the viewpoint of preventing contamination by the components of the image-recording layer from which dampening water is removed.

In the above-described manner, the lithographic printing plate precursor is on-machine-developed on an off-set printer and is used as it is for printing a number of pieces of paper.

The method for producing a lithographic printing plate according to the embodiment of the present invention may also include other well-known steps in addition to the above-described steps. Examples of other steps include a plate inspection step of checking a position, a direction, or the like of a lithographic printing plate precursor before each step, or a checking step of checking a printed image after an on-machine development step.

[Development Process Step]

The lithographic printing plate precursor according to the embodiment of the present invention can be used to produce lithographic printing plates by means of a development process in which a developer is used by appropriately selecting the binder polymer and the like which are the constituent components of the image-recording layer. Examples of the development process in which a developer is used include an aspect in which a developer having a high pH of 14 or lower which includes an alkali agent is used (also referred to as alkali development process) and an aspect in which a developer having a pH of 2 to 11 which may contain at least one compound selected from a surfactant or a water-soluble polymer compound is used (also referred to as simple development process).

In the alkali development process using an alkali developer having a high pH, for example, the protective layer is removed by a pre-water washing step, next, alkali development is carried out, an alkali is removed by water washing in a post water washing step, a gum liquid process is carried out, and the image-recording layer is dried in the drying step.

In contrast, in the simple development process, in a case in which the protective layer is provided, the protective layer is also removed at the same time, and thus it becomes possible to omit the pre-water washing step. In addition, in a case in which a water-soluble polymer compound is added to the developer as necessary, it is possible to carry out development and the gum liquid process step at the same time. Therefore, the post water washing step is not particularly necessary, and it is possible to carry out the drying step after carrying out development and the gum liquid process in a single step using a single liquid. Therefore, the development process in which a developer is used is preferably a method for producing a lithographic printing plate including a step of developing the image-exposed lithographic printing plate precursor using a developer having a pH of 2 to 11. After the development process, it is preferable to remove the excess developer using a squeeze roller and then dry the lithographic printing plate precursor.

That is, in the development process step of the method for producing a lithographic printing plate according to the embodiment of the present invention, it is preferable to carry out the development process and the gum liquid process in a single step using a single liquid.

Carrying out the development process and the gum liquid process in a single step using a single liquid means that the development process and the gum liquid process are not carried out as separate steps, but the development process and the gum liquid process are carried out in a single step using a single liquid by adding a water-soluble polymer compound in the developer.

The development process can be preferably carried out using means for supplying the developer and an automatic development processor comprising a rubbing member. The rubbing member is particularly preferably an automatic development processor in which a rotary brush roll is used.

The number of the rotary brush rolls is preferably two or more. Furthermore, the automatic development processor preferably comprises, after the development process means, means for removing an excess developer such as a squeeze roller or drying means such as a hot air device. In addition, the automatic development processor may comprise, before the development process means, preheating means for heating the image-exposed lithographic printing plate precursor.

A process in the above-described automatic development processor has an advantage that there is no need for coping with development scum derived from the protective layer/a photosensitive layer that is generated in the case of so-called on-machine development process.

In the development step, in the case of a manual process, as a development process method, for example, a method in which an aqueous solution is soaked into a sponge or an absorbent cotton, the lithographic printing plate precursor is processed while rubbing the entire surface of the plate with the sponge or the absorbent cotton, and, after the end of the process, the lithographic printing plate precursor is dried is preferably exemplified. In the case of an immersion process, for example, a method in which the lithographic printing plate precursor is immersed in a pad or a deep tank filled with an aqueous solution and stirred for approximately 60 seconds and then dried while being rubbed with an absorbent cotton, a sponge, or the like is preferably exemplified.

In the development process, a device having a simplified structure and a simplified step is preferably used.

In the alkali development process, the protective layer is removed by the prior water washing step, next, development is carried out using an alkaline developer having a high pH, after that, an alkali is removed in the post water washing step, a gum process is carried out in a gum-pulling step, and the lithographic printing plate precursor is dried in the drying step.

In the simple development process, it is possible to carry out development and gum pulling at the same time using a single liquid. Therefore, it becomes possible not to provide the post water washing step and the gum process step, and it is preferable to carry out development and gum pulling (gum liquid process) using a single liquid and then cavy out the drying step as necessary.

Furthermore, it is preferable to carry out the removal of the protective layer, development, and gum pulling at the same time using a single liquid without carrying out the prior water washing step. In addition, it is preferable to, after development and gum pulling, remove the excess developer using a squeeze roller and then dry the lithographic printing plate precursor.

In the development process step, a method in which the lithographic printing plate precursor is immersed in the developer once or a method in which the lithographic printing plate precursor is immersed in the developer twice or more may be used. Among these, a method in which the lithographic printing plate precursor is immersed in the developer once or twice is preferred.

For the immersion, the exposed lithographic printing plate precursor may be immersed in a developer tank filled with the developer or the developer may be blown onto the plate surface of the exposed lithographic printing plate precursor by means of spraying or the like.

Meanwhile, even in the case of immersing the lithographic printing plate precursor in the developer twice or more, a case in which the lithographic printing plate precursor is immersed twice or more in the same developer or a developer and another developer (tired liquid) in which the components of the image-recording layer are dissolved or dispersed due to the development process is regarded as the development process using a single liquid (single liquid process).

In the development process, a rubbing member is preferably used, and, in a development bath for removing the non-image area of the image-recording layer, the rubbing member such as a brush is preferably installed.

The development process can be carried out according to an ordinary method at a temperature of preferably 0° C. to 60° C. and more preferably 15° C. to 40° C. by, for example, immersing the exposed lithographic printing plate precursor in the developer and rubbing the lithographic printing plate precursor with a brush or drawing a process liquid prepared in an external tank using a pump, blowing the process liquid to the lithographic printing plate precursor from a spray nozzle, and rubbing the lithographic printing plate precursor with a brush. This development process can be continuously carried out a plurality of times. For example, after a developer prepared in an external tank is drawn using a pump and blown to the lithographic printing plate precursor from a spray nozzle, and the lithographic printing plate precursor is rubbed with a brush, again, it is possible to blow the developer from the spray nozzle and rub the lithographic printing plate precursor with the brush. In the case of carrying out the development process using an automatic developing machine, the developer becomes more tired due to an increase in the process amount, and thus it is preferable to restore the process capability using a supplementary liquid or a fresh developer.

In the development process, it is also possible to use a gum coater or an automatic developing machine that has been known in the related art for presensitized plates (PS plates) and computer to plates (CTP). In the case of using an automatic developing machine, for example, it is possible to apply any method of a method in which a developer prepared in a development tank or a developer prepared in an external tank is drawn using a pump and blown to a lithographic printing plate precursor from a spray nozzle, a method in which a printing plate is immersed and transported in a liquid in a tank filled with a developer using a guide roll or the like, or a so-called single-use process method in which only a necessary amount of a substantially unused developer is supplied to each plate and is processed. In any of the methods, a rubbing mechanism such as a brush or a moulton roller is more preferably provided. For example, it is possible to use commercially available automatic developing machines (Clean Out Unit C85/C125, Clean-Out Unit+C85/120, FCF 85V, FCF 125V, FCF News (manufactured by Glunz & Jensen), AZURA CX85, AZURA CX125, AZURA CX150 (manufactured by AGFA GRAPHICS). In addition, it is also possible to use a device into which a laser-exposed portion and an automatic developing machine portion are integrally combined.

The details of components and the like of the developer that is used in the development process step will be described below.

[pH]

The pH of the developer is preferably 2 to 11, more preferably 5 to 9, and still more preferably 7 to 9. From the viewpoint of developability or the dispersibility of the image-recording layer, it is advantageous to set the value of pH to be high; however, regarding a printing property, particularly, the suppression of stain, it is effective to set the value of pH to be low.

Here, the pH is a value that is measured at 25° C. using a pH meter (model No.: HM-31, manufactured by DKK-Toa Corporation).

[Surfactant]

The developer may contain a surfactant such as an anionic surfactant, a nonionic surfactant, a cationic surfactant, or an amphoteric surfactant.

From the viewpoint of a blanket stain property, the developer preferably includes at least one selected from an anionic surfactant and an amphoteric surfactant.

In addition, the developer preferably includes a nonionic surfactant and more preferably includes a nonionic surfactant and at least one selected from an anionic surfactant and an amphoteric surfactant.

As the anionic surfactant, a compound represented by Formula (I) is preferably exemplified.

$$R^1\text{—}Y^1\text{—}X^1 \qquad (I)$$

In Formula (I), $R^1$ represents an alkyl group, a cycloalkyl group, an alkenyl group, an aralkyl group, or an aryl group which may have a substituent.

As the alkyl group, for example, an alkyl group having 1 to 20 carbon atoms is preferred, and, specifically, a methyl group, an ethyl group, a propyl group, an n-butyl group, a sec-butyl group, a hexyl group, a 2-ethylhexyl group, an octyl group, a decyl group, a dodecyl group, a hexadecyl group, a stearyl group, and the like can be preferably exemplified.

The cycloalkyl group may be a monocyclic cycloalkyl group or a polycyclic cycloalkyl group. As the monocyclic cycloalkyl group, a monocyclic cycloalkyl group having 3 to 8 carbon atoms is preferred, and a cyclopropyl group, a cyclopentyl group, a cyclohexyl group, or a cyclooctyl group is more preferred. As the polycyclic cycloalkyl group, for example, an adamantyl group, a norbornyl group, an isobornyl group, a camphanyl group, a dicyclopentyl group, an α-pinel group, a tricyclodecanyl group, and the like can be preferably exemplified.

As the alkenyl group, for example, an alkenyl group having 2 to 20 carbon atoms is preferred, and, specifically, a vinyl group, an allyl group, a butenyl group, a cyclohexenyl group, and the like can be preferably exemplified.

As the aralkyl group, for example, an aralkyl group having 7 to 12 carbon atoms is preferred, and, specifically, a benzyl group, a phenethyl group, a naphthylmethyl group, and the like can be preferably exemplified.

As the aryl group, for example, an aryl group having 6 to 15 carbon atoms is preferred, and, specifically, a phenyl group, a tolyl group, a dimethylphenyl group, a 2,4,6-trimethylphenyl group, a naphthyl group, an anthryl group, a 9,10-dimethoxyanthryl group, and the like can be preferably exemplified.

As the substituent, monovalent non-metal atomic groups excluding a hydrogen atom are used, and preferred examples thereof include a halogen atom (F, Cl, Br, or I), a hydroxy group, an alkoxy group, an aryloxy group, an acyl group, an amide group, an ester group, an acyloxy group, a carboxy group, a carboxylic acid anion group, a sulfonic acid anion group, and the like.

As specific examples of the alkoxy group in the substituent, alkoxy groups preferably having 1 to 40 carbon atoms and more preferably having 1 to 20 carbon atoms such as a methoxy group, an ethoxy group, a propyloxy group, an isopropyloxy group, a butyloxy group, a pentyloxy group, a hexyloxy group, a dodecyloxy group, a stearyloxy group, a methoxyethoxy group, a poly(ethyleneoxy) group, and a poly(propyleneoxy) group are exemplified. As the aryloxy group, aryloxy groups having 6 to 18 carbon atoms such as a phenoxy group, a tolyloxy group, a xylyloxy group, a mesityloxy group, a cumenyl oxy group, a methoxyphenyloxy group, an ethoxyphenyloxy group, a chlorophenyloxy group, a bromophenyloxy group, and a naphthyloxy group are exemplified. As the acyl group, acyl groups having 2 to 24 carbon atoms such as an acetyl group, a propanoyl group, a butanoyl group, a benzoyl group, and a naphthoyl group are exemplified. As the amide group, amide groups having 2 to 24 carbon atoms such as an acetamide group, a propionic acid amide group, a dodecanoic acid amide group, a palmitic acid amide group, a stearic acid amide group, a benzoic acid amide group, and a naphthoic acid amide group are exemplified. As the acyloxy group, acyloxy groups having 2 to 20 carbon atoms such as an acetoxy group, a propanoyloxy group, a benzoyloxy group, and a naphthoyloxy group are exemplified. As the ester group, ester groups having 1 to 24 carbon atoms such as a methyl ester group, an ethyl ester group, a propyl ester group, a hexyl ester group, an octyl ester group, a dodecyl ester group, and a stearyl ester group are exemplified. The substituent may be a substituent formed of a combination of two or more substituents described above.

$X^1$ represents a sulfonate group, a sulfuric acid monoester salt group, a carboxylate group, or a phosphate group.

$Y^1$ represents a single bond, $—C_nH_{2n}—$, $—C_{n-m}H_{2(n-m)}OC_mH_{2m}—$, $—O—(CH_2CH_2O)_n—$, $—O—(CH_2CH_2CH_2O)_n—$, $—CO—NH—$, or a divalent linking group formed of a combination of two or more thereof and satisfies n≥1 and n≥m≥0.

Among compounds represented by Formula (I), a compound represented by Formula (I-A) or (I-B) is preferred from the viewpoint of scratch stain resistance.

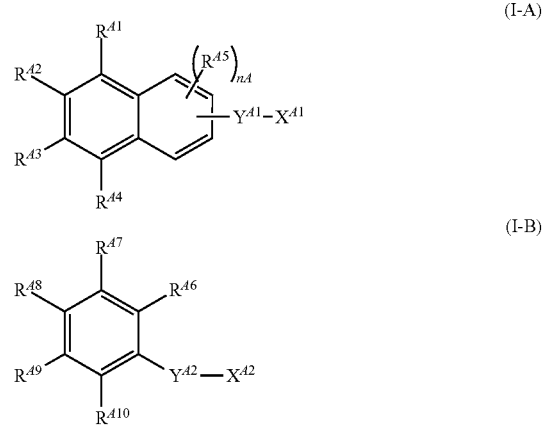

In Formula (I-A) and Formula (I-B), $R^{41}$ to $R^{410}$ each independently represent a hydrogen atom or an alkyl group, nA represents an integer of 1 to 3, $X^{41}$ and $X^{42}$ each independently represents a sulfonate group, a sulfuric acid monoester salt group, a carboxylate group, or a phosphate group, $Y^{41}$ and $Y^{42}$ each independently represents a single bond, $—C_nH_{2n}—$, $—C_{n-m}H_{2(n-m)}OC_mH_{2m}—$, $—O—(CH_2CH_2O)_n—$, $—O—(CH_2CH_2CH_2O)_n—$, $—CO—NH—$, or a divalent linking group formed of a combination of two or more thereof and satisfies n≥1 and n≥m≥0, and the total of the numbers of the carbon atoms in $R^{41}$ to $R^{45}$ or $R^{46}$ to $R^{410}$ and $Y^{41}$ or $Y^{42}$ is three or more.

In the compound represented by Formula (I-A) or Formula (I-B), the total number of carbon atoms in $R^{41}$ to $R^{45}$ and $Y^{14}$ to $R^{46}$ and $R^{410}$ and $Y^{42}$ is preferably 25 or less and more preferably 4 to 20. The structure of the above-described alkyl group may be linear or branched.

$X^{41}$ and $X^{42}$ in the compound represented by Formula (I-A) or Formula (I-B) are preferably a sulfonate group or a carboxylate group. In addition, the salt structure in $X^{41}$ and $X^{42}$ is preferably an alkali metal salt since the alkali metal salt has a favorable solubility particularly in water-based solvents. Among them, a sodium salt or a potassium salt is particularly preferred.

Regarding the compound represented by Formula (I-A) or Formula (I-B), it is possible to refer to the description of Paragraphs 0019 to 0037 of JP2007-206348A.

As the anionic surfactant, it is possible to preferably use compounds described in Paragraphs 0023 to 0028 of JP2006-065321A.

The amphoteric surfactant that is used in the developer is not particularly limited, and amine oxide-based surfactants such as alkyldimethylamine oxide, betaine-based surfactants such as alkyl betaine, aliphatic acid amidopropyl betaine, and alkyl imidazole, and amino acid-based surfactants such as sodium alkylamino aliphatic acid.

Particularly, alkyldimethylamine oxide that may have a substituent, alkylcarboxybetaine that may have a substituent, and alkyl sulfobetaine that may have a substituent are preferably used. As specific examples thereof, a compound represented by Formula (2) in Paragraph 0256 of JP2008-203359A, compounds represented by Formula (I), Formula (II), and Formula (VI) in Paragraphs 0028 of JP2008-276166A, and compounds described in Paragraphs 0022 to 0029 of JP2009-047927A can be exemplified.

As an amphoteric ionic surfactant that is used in the developer, a compound represented by General Formula (1) or a compound represented by General Formula (2) is preferred.

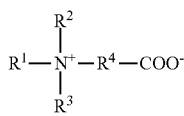

(1)

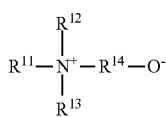

(2)

In General Formulae (1) and (2), $R^1$ and $R^{11}$ each independently represent an alkyl group having 8 to 20 carbon atoms or an alkyl group having a linking group having 8 to 20 carbon atoms in total.

$R^2$, $R^3$, $R^{12}$, and $R^{13}$ each independently represent a hydrogen atom or a group containing an alkyl group or an ethylene oxide group.

$R^4$ and $R^{14}$ each independently represent a single bond or an alkylene group.

In addition, two groups of $R^1$, $R^2$, $R^3$, and $R^4$ may be bonded to each other to form a ring structure, and two groups of $R^{11}$, $R^{12}$, $R^{13}$, and $R^{14}$ may be bonded to each other to form a ring structure.

In the compound represented by General Formula (1) or the compound represented by General Formula (2), in a case in which the total number of carbon atoms becomes large, a hydrophobic portion becomes large, and the solubility in water-based developers degrades. In this case, the solubility is improved by mixing an organic solvent such as an alcohol that aids dissolution as a dissolution aid into water; however, in a case in which the total number of carbon atoms becomes too large, it is not possible to dissolve the surfactant in an appropriate mixing range. Therefore, the total of the numbers of carbon atoms in $R^1$ to $R^4$ or $R^{11}$ to $R^{14}$ is preferably 10 to 40 and more preferably 12 to 30.

The alkyl group having a linking group represented by $R^1$ or $R^{11}$ represents a structure in which a linking group is present between alkyl groups. That is, in a case in which the number of linking groups is one, the alkyl group can be represented by "-an alkylene group-a linking group-an alkyl group". As the linking group, an ester bond, a carbonyl bond, and an amide bond are exemplified. The number of the linking groups may be two or more, but is preferably one, and an amide bond is particularly preferred. The total number of carbon atoms in the alkylene group that bonds to the linking group is preferably 1 to 5. This alkylene group may be linear or branched, but is preferably a linear alkylene group. The number of carbon atoms in the alkyl group that bonds to the linking group is preferably 3 to 19, and the alkyl group may be linear or branched, but is preferably linear alkyl group.

In a case in which $R^2$ or $R^{12}$ is an alkyl group, the number of carbon atoms is preferably 1 to 5 and particularly preferably 1 to 3. The alkyl group may be any of linear or branched, but is preferably a linear alkyl group.

In a case in which $R^3$ or $R^{13}$ is an alkyl group, the number of carbon atoms is preferably 1 to 5 and particularly preferably 1 to 3. The alkyl group may be any of linear or branched, but is preferably a linear alkyl group.

As the group containing an ethylene oxide represented by $R^3$ or $R^{13}$, groups represented by $-R^a(CH_2CH_2O)_nR^b$ can be exemplified. Here, $R^a$ represents a single bond, an oxygen atom, or a divalent organic group (preferably having 10 or less carbon atoms), $R^b$ represents a hydrogen atom or an organic group (preferably having 10 or less carbon atoms), and n represents an integer of 1 to 10.

In a case in which $R^4$ or $R^{14}$ is an alkylene group, the number of carbon atoms is preferably 1 to 5 and particularly preferably 1 to 3. The alkylene group may be any of linear or branched, but is preferably a linear alkylene group.

The compound represented by General Formula (1) or the compound represented by General Formula (2) preferably has an amide bond and more preferably has an amide bond as the linking group as $R^1$ or $R^{11}$.

Representative examples of the compound represented by General Formula (1) or the compound represented by General Formula (2) will be illustrated below, but the present invention is not limited thereto.

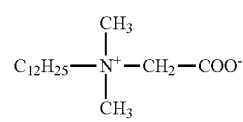

I-a)

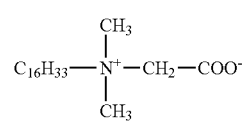

I-b)

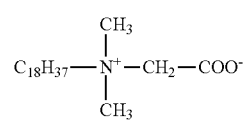

I-c)

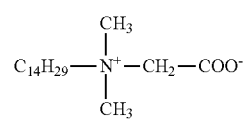

I-d)

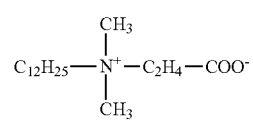

I-e)

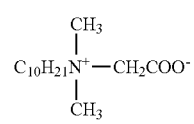

I-f)

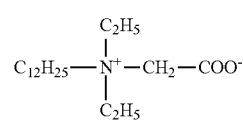

I-g)

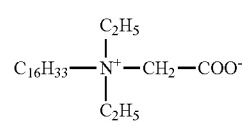

I-h)

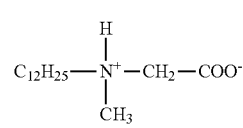

I-i)

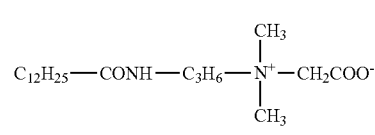

I-j)

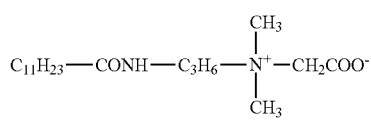
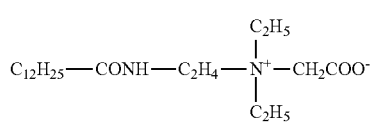

I-m)

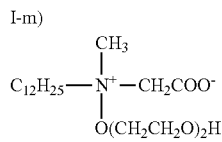

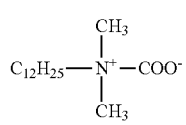

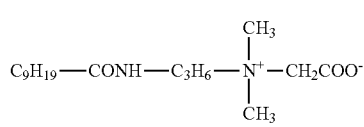

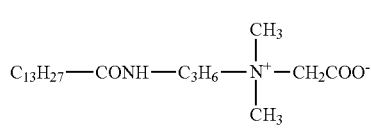

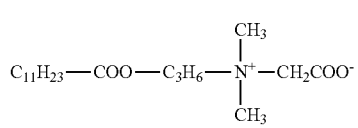

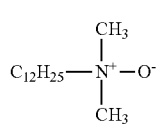

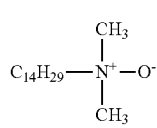

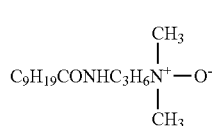

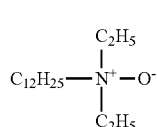

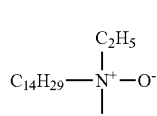

I-k)

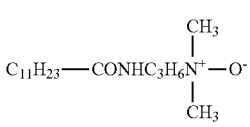

I-l)

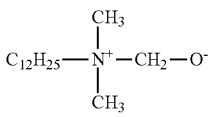

The compound represented by General Formula (1) or (2) can be synthesized using a well-known method. In addition, it is also possible to use commercially available compounds. As the commercially available products of the compound represented by General Formula (1), SOFTAZOLINE LPB, SOFTAZOLINE LPB-R, and BISTA MAP manufactured by Kawaken Fine Chemicals Co., Ltd., TAKESURF C-157L manufactured by Takemoto Oil & Fat Co., Ltd., and the like are exemplified. As the commercially available products of the compound represented by General Formula (2), SOFTAZOLINE LAO manufactured by Kawaken Fine Chemicals Co., Ltd., AMOGEN AOL manufactured by DKS Co., Ltd., and the like are exemplified.

In the developer, one amphoteric ionic surfactant may be singly used or two or more amphoteric ionic surfactants may be used in combination.

As nonionic surfactant, polyoxyethylene alkyl ethers, polyoxyethylene alkyl phenyl ethers, polyoxyethylene polystyryl phenyl ether, glycerin aliphatic acid partial esters, sorbitan aliphatic acid partial esters, pentaerythritol aliphatic acid partial esters, propylene glycol mono aliphatic acid ester, sucrose aliphatic acid partial ester, polyoxyethylene sorbitan aliphatic acid partial esters, polyoxyethylene sorbitol aliphatic acid partial esters, polyethylene glycol aliphatic acid esters, polyglycerin aliphatic acid partial esters, polyoxyethylene glycerin aliphatic acid partial esters, polyoxyethylene diglycerins, aliphatic acid diethanolamides, N,N-bis-2-hydroxyalkylamines, polyoxyethylene alkylamine, triethanolamine aliphatic acid ester, trialkylamine oxide, polyoxyethylene alkyl phenyl ethers, polyoxyethylene-polyoxypropylene blocked copolymers, and the like are exemplified.

In addition, acetylene glycol-based and acetylene alcohol-based oxyethylene adducts and fluorine-based and other surfactants can also be used in the same manner. Two or more surfactants described above can be jointly used.

As the nonionic surfactant, a nonionic aromatic ether-based surfactant represented by Formula (N1) is particularly preferably exemplified.

$$X^N-Y^N-O-(A^1)_{nB}-(A^2)_{mB}-H \quad (N1)$$

In the formula, $X^N$ represents an aromatic group that may have a substituent, $Y^N$ represents a single bond or an alkylene group having 1 to 10 carbon atoms, $A^1$ and $A^2$ are mutually different groups and are represented by any of —$CH_2CH_2O$— or —$CH_2CH(CH_3)O$—, nB and mB each independently represent an integer of 0 to 100; here, nB and mB are not zero at the same time, and, in a case in which any of nB or mB is zero, nB and mB are not one.

In the formula, as the aromatic group as $X^N$, a phenyl group, a naphthyl group, an anthranyl group, and the like are exemplified. These aromatic groups may have a substituent. As the substituent, organic groups having 1 to 100 carbon atoms are exemplified. Meanwhile, in the formula, in a case in which both A and B are present, the surfactant may be a random or blocked copolymer.

As specific examples of the organic group having 1 to 100 carbon atoms, aliphatic hydrocarbon groups and aromatic hydrocarbon groups which may be saturated or unsaturated and may be linear or branched, for example, an alkyl group, an alkenyl group, an alkynyl group, an aryl group, an aralkyl group, and the like, additionally, an alkoxy group, an aryloxy group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an acylamino group, an N-alkylacylamino group, an N-arylacylamino group, an acyl group, an alkoxycarbonylamino group, an alkoxycarbonyl group, an aryloxycarbonyl group, a carbamoyl group, an N-alkylcarbamoyl group, an N,N-dialkylcarbamoyl group, an N-arylcarbamoyl group an N,N-diarylcarbamoyl group, an N-alkyl-N-arylcarbamoyl group, a polyoxyalkylene chain, the above-described organic groups to which a polyoxyalkylene chain bonds, and the like. The alkyl group may be linear or branched.

In addition, as the nonionic surfactant, it is possible to preferably use compounds described in Paragraphs 0030 to 0040 of JP2006-065321A.

The cationic surfactant is not particularly limited, and well-known cationic surfactants in the related art can be used. For example, alkylamine salts, quaternary ammonium salts, alkylimidazolinium salts, polyoxyethylene alkylamine salts, polyethylene polyamine derivatives, and the like are exemplified.

The surfactant may be singly used or two or more surfactants may be jointly used.

The content of the surfactant is preferably 1% by mass to 25% by mass, more preferably 2% by mass to 20% by mass, still more preferably 3% by mass to 15% by mass, and particularly preferably 5% by mass to 10% by mass of the total mass of the developer. In a case in which the content of the surfactant is in the above-described range, the scratch stain resistance is superior, the dispersibility of development scum is excellent, and the ink-absorbing property of lithographic printing plates to be obtained is excellent.

[Water-Soluble Polymer Compound]

From the viewpoint of adjusting the viscosity of the developer and protecting the plate surface of a lithographic printing plate to be obtained, the developer may include a water-soluble polymer.

As a water-soluble polymer, the developer may contain a water-soluble polymer compound such as a soy polysaccharide, modified starch, gum arabic, dextrin, a fibrin derivative (for example, carboxymethyl cellulose, carboxyethyl cellulose, methyl cellulose, or the like) and a modified product thereof, pullulan, polyvinyl alcohol and a derivative thereof, polyvinyl pyrrolidone, polyacrylamide and an acrylamide copolymer, a vinyl methyl ether/maleic anhydride copolymer, a vinyl acetate/maleic anhydride copolymer, or a styrene/maleic anhydride copolymer.

As the soy polysaccharide, soy polysaccharides known in the related art can be used, and, for example, as commercially available products, there is SOYAFIBE (trade name, manufactured by Fuji Oil Co., Ltd.), and it is possible to use a variety of grades of soy polysaccharides. Soy polysaccharides that can be preferably used have a viscosity of a 10% by mass aqueous solution in a range of 10 mPa·s to 100 mPa·s.

As the modified starch, starch represented by Formula (III) is preferred. As the starch represented by Formula (III), any starch such as corn, potato, tapioca, rice, or wheat can be used. The starch can be modified using a method in which starch is decomposed using an acid, an enzyme, or the like to the number of glucose residues per molecule in a range of 5 to 30 and, furthermore, oxypropylene is added thereto in an alkali.

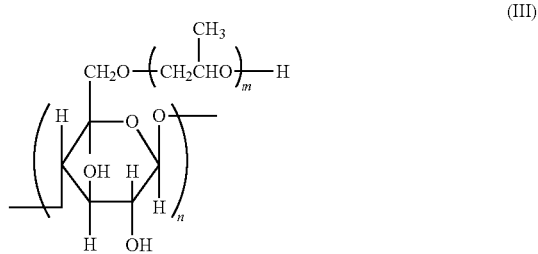

(III)

In the formula, the degree of etherification (degree of substitution) is in a range of 0.05 to 1.2 per glucose unit, n represents an integer of 3 to 30, and m represents an integer of 1 to 3.

Among water-soluble polymer compounds, soy polysaccharides, modified starch, gum Arabic, dextrin, carboxymethyl cellulose, polyvinyl alcohol, and the like are particularly preferred.

Two or more water-soluble polymer compounds can also be jointly used.

It is preferable that the developer does not include a water-soluble polymer compound or the content of the water-soluble polymer compound is more than 0% by mass and 1% by mass or less of the total mass of the developer, it is more preferable that the developer does not include a water-soluble polymer compound or the content of the water-soluble polymer compound is more than 0% by mass and 0.1% by mass or less of the total mass of the developer, it is still more preferable that the developer does not include a water-soluble polymer compound or the content of the water-soluble polymer compound is more than 0% by mass and 0.05% by mass or less of the total mass of the developer, and it is particularly preferable that the developer does not contain a water-soluble polymer compound. In the above-described aspect, the viscosity of the developer is appropriate, and it is possible to suppress the deposition of development scum or the like in a roller member such as an automatic developing machine.

[Other Additives]

The developer that is used in the present disclosure may contain, in addition to the above-described components, a wetting agent, a preservative, a chelate compound, a defoamer, an organic acid, an organic solvent, an inorganic acid, an inorganic salt, or the like.

As the wetting agent, ethylene glycol, propylene glycol, triethylene glycol, butylene glycol, hexylene glycol, diethylene glycol, dipropylene glycol, glycerin, trimethylolpropane, diglycerin, and the like are preferably used. The wetting agent may be singly used or two or more wetting agents may be jointly used. The content of the wetting agent is preferably 0.1% by mass to 5% by mass of the total mass of the developer.

As the preservative, phenol or a derivative thereof, formalin, an imidazole derivative, sodium dehydroacetate, a 4-isothiazolin-3-one derivative, benzisothiazolin-3-one, 2-methyl-4-isothiazolin-3-one, a benzotriazole derivative, an amidine guanidine derivative, a quaternary ammonium salt, a derivative of pyridine, quinoline, guanidine, or the like, diazine, a triazole derivative, oxazole, an oxazine derivative, nitrobromo alcohol-based 2-bromo-2-nitropropane-1,3-diol, 1,1-dibromo-1-nitro-2-ethanol, 1,1-dibromo-1-nitro-2-propanol, or the like can be preferably used.

The amount of the preservative added needs to be an amount in which the preservative stably exhibits an effect with respect to bacteria, fungi, yeast, and the like and which varies depending on the kind of bacteria, fungi, and yeast and is preferably in a range of 0.01% by mass to 4% by mass of the total mass of the developer. In addition, two or more preservatives are preferably jointly used so as to be effective to a variety of fungi and bacteria.

As the chelate compound, for example, ethylenediaminetetraacetic acid, potassium salts thereof, and sodium salts thereof, diethylenetriaminepentaacetic acid, potassium salts thereof, and sodium salts thereof, triethylenetetraminehexaacetic acid, potassium salts thereof, and sodium salts thereof, hydroxyethylethylenediaminetriacetic acid, potassium salts thereof, and sodium salts thereof, nitrilotriacetic acid, and sodium salts thereof, 1-hydroxyethane-1,1-diphosphonic acid, potassium salts thereof, and sodium salts thereof, and organic phosphonic acids such as aminotri (methylene phosphonate), potassium salts thereof, and sodium salts thereof can be exemplified. Instead of sodium salts and potassium salts of chelating agents, salts of organic amines are also effective.

The chelating agent is preferably a chelating agent that is stably present in a process liquid composition and does not impair a printing property. The content of the chelating agent is preferably 0.001% by mass to 1.0% by mass of the total mass of the developer.

As the defoamer, it is possible to use an ordinary silicone-based self-emulsification-type, emulsification-type, or non-ionic compound having a hydrophilic-lipophilic balance (HLB) of 5 or less. A silicone defoamer is preferred.

Meanwhile, a silicone-based surfactant is regarded as the defoamer.

The content of the defoamer is preferably in a range of 0.001% by mass to 1.0% by mass of the total mass of the developer.

As the organic acid, citric acid, acetic acid, oxalic acid, malonic acid, salicylic acid, caprylic acid, tartaric acid, malic acid, lactic acid, levulinic acid, p-toluenesulfonic acid, xylenesulfonic acid, phytic acid, organic phosphonic acid, and the like are exemplified. The organic acid can also be used in a form of an alkali metal salt or ammonium salt thereof. The content of the organic acid is preferably 0.01% by mass to 0.5% by mass of the total mass of the developer.

As the organic solvent, for example, aliphatic hydrocarbons (hexane, heptane, "ISOPAR E, H, G" (manufactured by Esso Chemical Co., Ltd.) and the like), aromatic hydrocarbons (toluene, xylene, and the like), halogenated hydrocarbons (methylene dichloride, ethylene dichloride, trichloroethylene, monochlorobenzene, and the like), polar solvents, and the like are exemplified.

As the polar solvents, alcohols (methanol, ethanol, propanol, isopropanol, benzyl alcohol, ethylene glycol monomethyl ether, 2-ethoxyethanol, diethylene glycol monoethyl ether, diethylene glycol monohexyl ether, triethylene glycol monomethyl ether, propylene glycol monoethyl ether, propylene glycol monomethyl ether, polyethylene glycol monomethyl ether, polypropylene glycol, tetraethylene glycol, ethylene glycol monobutyl ether, ethylene glycol monobenzyl ether, ethylene glycol monophenyl ether, methyl phenyl carbinol, n-amyl alcohol, methyl amyl alcohol, and the like), ketones (acetone, methyl ethyl ketone, ethyl butyl ketone, methyl isobutyl ketone, cyclohexanone, and the like), esters (ethyl acetate, propyl acetate, butyl acetate, amyl acetate, benzyl acetate, methyl lactate, butyl lactate, ethylene glycol monobutyl acetate, propylene glycol monomethyl ether acetate, diethylene glycol acetate, diethyl phthalate, butyl levulinate, and the like), other polar solvents (triethyl phosphate, tricresyl phosphate, N-phenylethanolamine, N-phenyldiethanolamine, and the like), and the like are exemplified.

In a case in which the organic solvent is not soluble in water, it is also possible to make the organic solvent soluble in water using a surfactant or the like and then use the organic solvent, and, in a case in which the developer contains the organic solvent, from the viewpoint of safety and inflammability, the concentration of the solvent in the developer is preferably less than 40% by mass.

As the inorganic acid and the inorganic salt, phosphoric acid, metaphosphoric acid, primary ammonium phosphate, secondary ammonium phosphate, primary sodium phosphate, secondary sodium phosphate, primary potassium phosphate, secondary potassium phosphate, sodium tripolyphosphate, potassium pyrophosphate, sodium hexametaphosphate, magnesium nitrate, sodium nitrate, potassium nitrate, ammonium nitrate, sodium sulfate, potassium sulfate, ammonium sulfate, sodium sulfite, ammonium sulfite, sodium hydrogen sulfate, nickel sulfate, and the like are exemplified. The content of the inorganic salt is preferably 0.01% by mass to 0.5% by mass of the total mass of the developer.

The developer is prepared by dissolving or dispersing the respective components described above in water as necessary. The concentration of the solid content of the developer is preferably 2% by mass to 25% by mass. As the developer, it is also possible to produce a concentrated liquid and, at the time of being used, dilute the concentrated liquid with water.

The developer is preferably an aqueous developer.

From the viewpoint of the dispersibility of development scum, the developer preferably contains an alcohol compound.

As the alcohol compound, methanol, ethanol, propanol, isopropanol, benzyl alcohol, and the like are exemplified. Among these, benzyl alcohol is preferred.

The content of the alcohol compound is preferably 0.01% to 5% by mass, more preferably 0.1% to 2% by mass, and particularly preferably 0.2% to 1% by mass of the total mass of the developer from the viewpoint of the dispersibility of development scum.

EXAMPLES

Hereinafter, the present invention will be described in detail using examples, but the present invention is not limited thereto. Meanwhile, for polymer compounds, unless particularly otherwise regulated, the molecular weight refers to the mass average molecular weight (Mw) as a polystyrene equivalent value using a gel permeation chromatography (GPC) method, and the ratio of a repeating unit is the molar percentage. In addition, unless particularly otherwise described, "parts" and "parts by mass" refer to "% by mass".

Synthesis examples of a specific polymerizable compound according to the present invention will be described below. Other specific polymerizable compounds can also be synthesized in the same manner by appropriately changing a raw material.

Synthesis Example 1: Synthesis of Specific Polymerizable Compound 1

Specific Polymerizable Compound 1

The following compound B-1 (12.61 g, 0.025 mol) was added dropwise for one hour to a solution consisting of the following compound A-1 (39.33 g, 0.075 mol) and methyl ethyl ketone (600 ml) under stirring at 45° C., and then a reaction was caused for four hours. Next, NEOSTAN U-600 (bismuth catalyst, manufactured by Nitto Kasei Co., Ltd.) (0.2 g) was added dropwise thereto for 30 minutes while maintaining a reaction temperature at 10° C. or lower, the solution was stirred and reacted at 45° C. for three hours, then, ethanol (50 g) was further added thereto, and then the solution was stirred for 10 minutes. A specific polymerizable compound 1 was obtained by the subsequent operations of precipitation in water, filtration, drying, and column purification. The molecular weight, double bond equivalent, and CLog P of the specific polymerizable compound 1 are shown in Table 1.

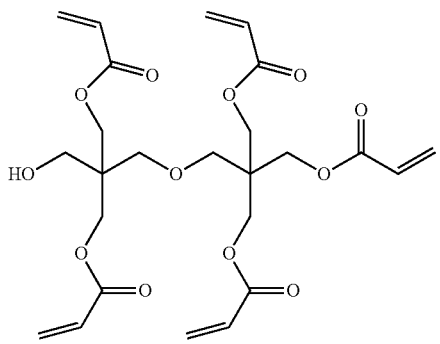

Compound A-1

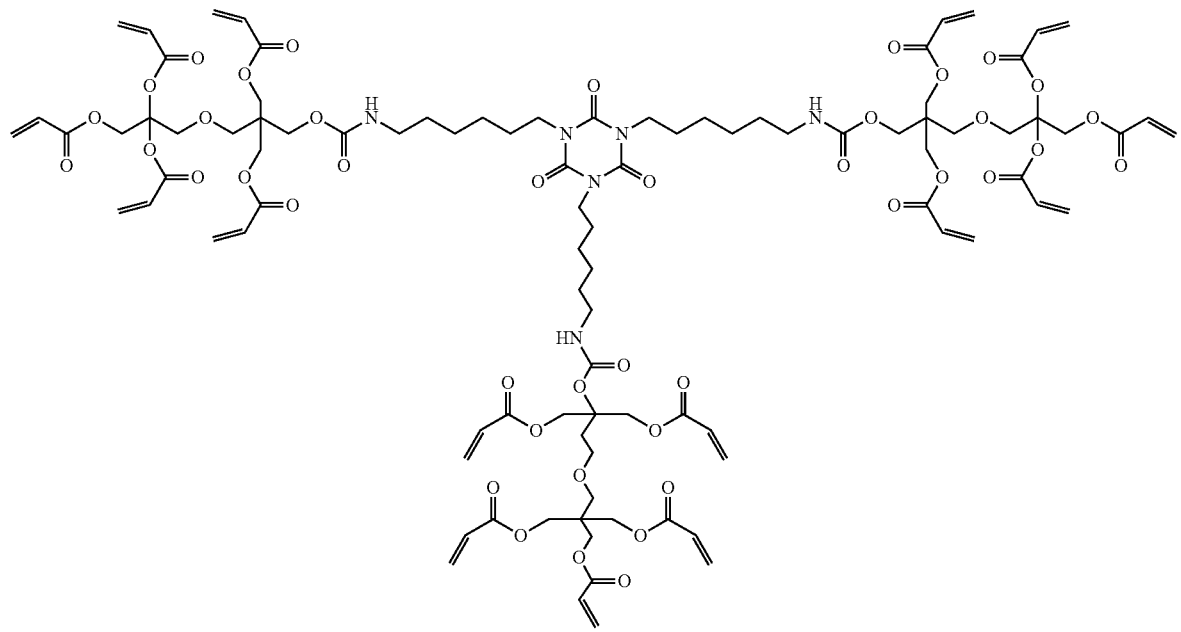 [SMILES: C=CC(=O)OCC(COCCC(COC(=O)C=C)(COC(=O)C=C)OC(=O)NCCCCCCn1c(=O)n(CCCCCCNC(=O)OCC(COCC(COC(=O)C=C)(OC(=O)C=C)OC(=O)C=C)(COC(=O)C=C)COC(=O)C=C)c(=O)n(CCCCCCNC(=O)OCC(COCC(COC(=O)C=C)(OC(=O)C=C)OC(=O)C=C)(COC(=O)C=C)COC(=O)C=C)c1=O)(COC(=O)C=C)COC(=O)C=C]

Compound B-1

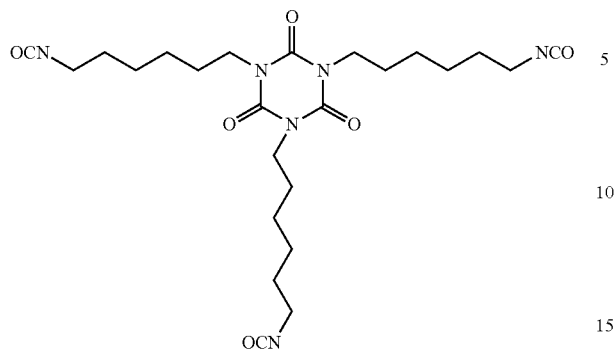

Synthesis Example 2: Synthesis of Specific Polymerizable Compound 2

Specific Polymerizable Compound 2

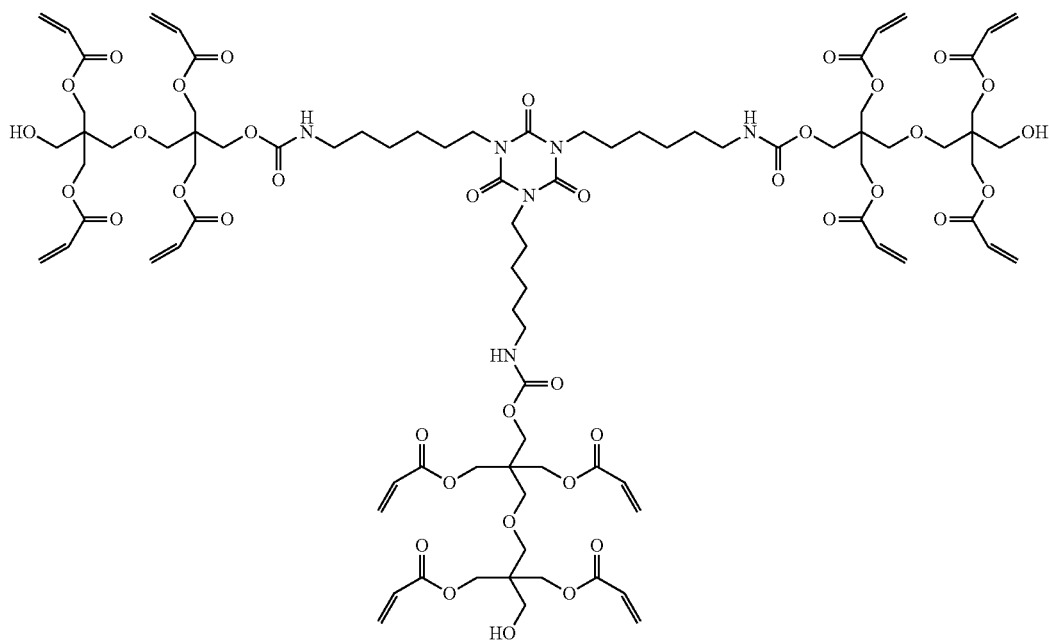 [SMILES: C=CC(=O)OCC(CO)(COCC(COC(=O)C=C)(COC(=O)C=C)COC(=O)NCCCCCCn1c(=O)n(CCCCCCNC(=O)OCC(COCC(CO)(COC(=O)C=C)COC(=O)C=C)(COC(=O)C=C)COC(=O)C=C)c(=O)n(CCCCCCNC(=O)OCC(COCC(CO)(COC(=O)C=C)COC(=O)C=C)(COC(=O)C=C)COC(=O)C=C)c1=O)COC(=O)C=C]

A specific polymerizable compound 2 was obtained in the same manner as in Synthesis Example 1 except for the fact that the following compound A-2 (42.34 g, 0.09 mol) and the compound B-1 (5.04 g, 0.01 mol) were used. The molecular weight, double bond equivalent, and CLog P of the specific polymerizable compound 2 are shown in Table 1.

Compound A-2

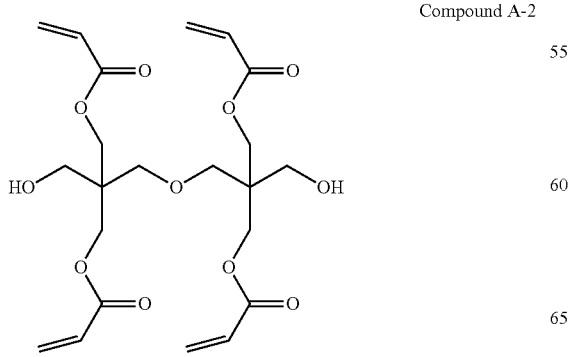

Synthesis Example 3: Synthesis of Specific Polymerizable Compound 3

Specific Polymerizable Compound 3

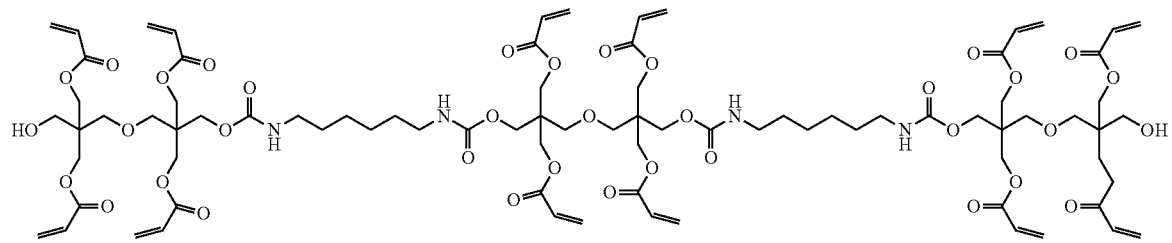 [SMILES: C=CC(=O)CCC(CO)(COCC(COC(=O)C=C)(COC(=O)C=C)COC(=O)NCCCCCCNC(=O)OCC(COCC(COC(=O)C=C)(COC(=O)C=C)COC(=O)NCCCCCCNC(=O)OCC(COCC(CO)(COC(=O)C=C)COC(=O)C=C)(COC(=O)C=C)COC(=O)C=C)(COC(=O)C=C)COC(=O)C=C)COC(=O)C=C]

A specific polymerizable compound 3 was obtained in the same manner as in Synthesis Example 1 except for the fact that the foregoing compound A-2 (42.34 g, 0.09 mol) and the following compound B-2 (1.68 g, 0.01 mol) were used. The molecular weight, double bond equivalent, and CLog P of the specific polymerizable compound 3 are shown in Table 1.

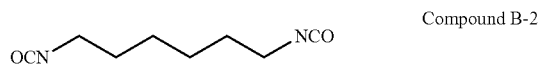

Compound B-2

Hereinafter, comparative polymerizable compounds 1 to 4 used as comparative examples will be described.

A comparative polymerizable compound 1 is a polymerizable compound corresponding to "urethane oligomer 1" obtained by a reaction of the following components according to the description of Paragraph 0137 of JP2011-161872A. The molecular weight, double bond equivalent, and CLog P of the comparative polymerizable compound 1 are shown in Table 1. Meanwhile, the molecular weight refers to a molecular weight described in Paragraph 0137 of the above-described publication.

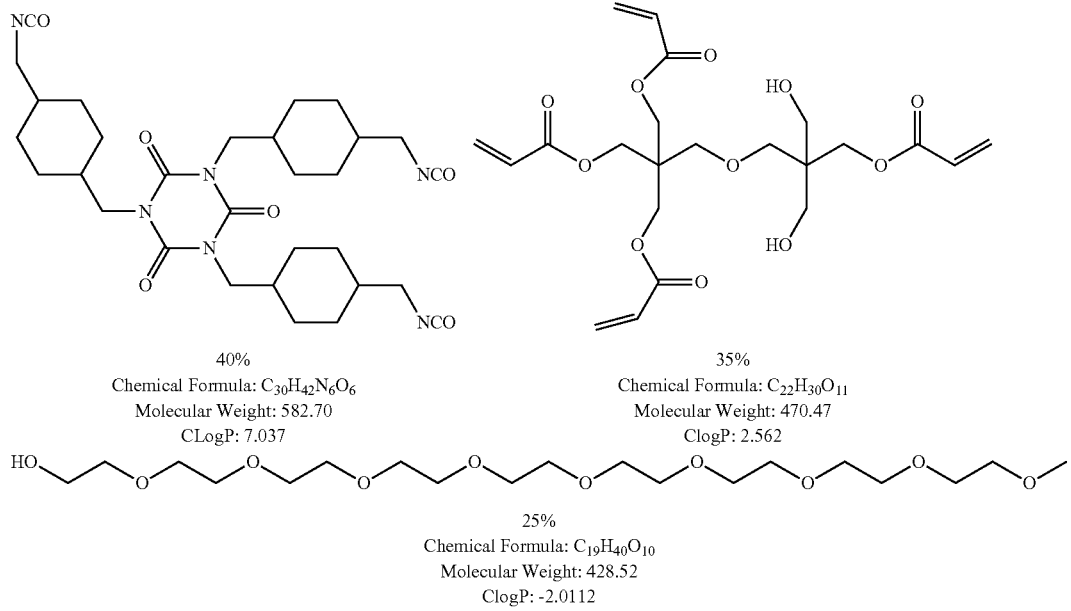

40%
Chemical Formula: $C_{30}H_{42}N_6O_6$
Molecular Weight: 582.70
CLogP: 7.037

35%
Chemical Formula: $C_{22}H_{30}O_{11}$
Molecular Weight: 470.47
ClogP: 2.562

25%
Chemical Formula: $C_{19}H_{40}O_{10}$
Molecular Weight: 428.52
ClogP: -2.0112

A comparative polymerizable compound 2 is a polymerizable compound corresponding to "oligomer ml" obtained by a reaction of the following components according to the description of Paragraphs 0159 to 0161 of JP2009-522609A. The molecular weight, double bond equivalent, and CLog P of the comparative polymerizable compound 2 are shown in Table 1. Meanwhile, the molecular weight refers to a molecular weight described in Paragraph 0161 of the above-described publication.

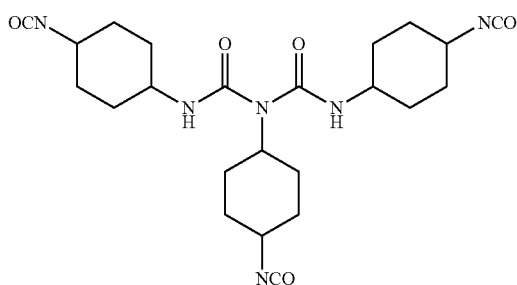

Desmodur 100
Chemical Formula: $C_{23}H_{32}N_6O_5$
Molecular Weight: 472.55
ClogP: 3.82

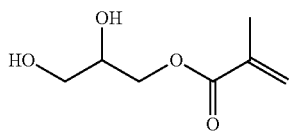

GMMA
Chemical Formula: $C_7H_{12}O_4$
Molecular Weight: 160.17
CLogP: -0.522

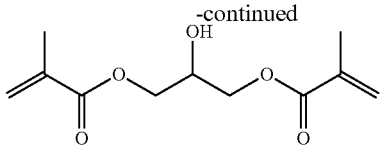

-continued

GDMA
Chemical Formula: $C_{11}H_{16}O_5$
Molecular Weight: 228.24
CLogP: 1.1504

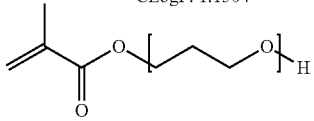

PPGMA
Chemical Formula: $C_7H_{12}O_3$
Molecular Weight: 144.17
CLogP: 0.681

A comparative polymerizable compound 3 is dipentaerythritol pentaacrylate obtained by the column purification of a commercially available product SARTOMER SR399 (manufactured by Sartomer). The molecular weight, double bond equivalent, and CLog P of the comparative polymerizable compound 3 are shown in Table 1.

A comparative polymerizable compound 4 is a polymerizable compound corresponding to "polymerizable dendrimer (M-1)" obtained according to the description of Paragraphs 0277 to 0279 of JP2005-134893A. The molecular weight, double bond equivalent, and CLog P of the comparative polymerizable compound 4 are shown in Table 1.

Comparative Polymerizable Compound 4

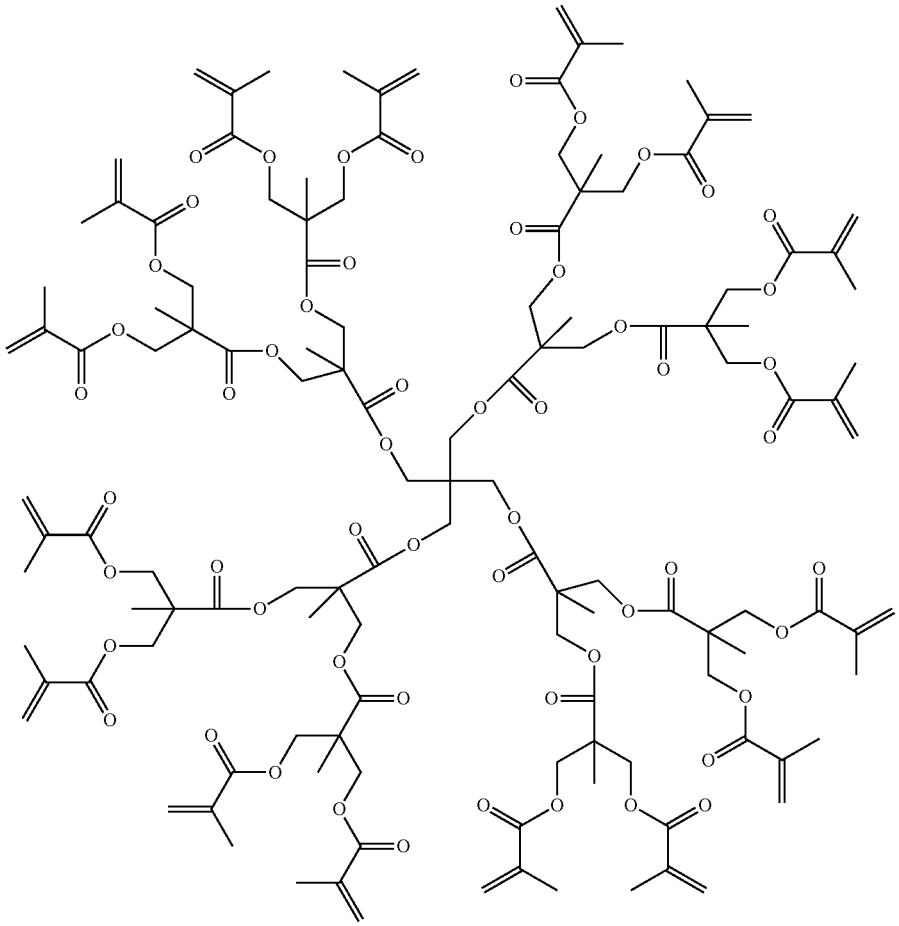 [SMILES: C=C(C)C(=O)OCC(C)(COC(=O)C(=C)C)C(=O)OCC(C)(COC(=O)C(C)(COC(=O)C(=C)C)COC(=O)C(=C)C)C(=O)OCC(COC(=O)C(C)(COC(=O)C(C)(COC(=O)C(=C)C)COC(=O)C(=C)C)COC(=O)C(C)(COC(=O)C(=C)C)COC(=O)C(=C)C)(COC(=O)C(C)(COC(=O)C(C)(COC(=O)C(=C)C)COC(=O)C(=C)C)COC(=O)C(C)(COC(=O)C(=C)C)COC(=O)C(=C)C)COC(=O)C(C)(COC(=O)C(C)(COC(=O)C(=C)C)COC(=O)C(=C)C)COC(=O)C(C)(COC(=O)C(=C)C)COC(=O)C(=C)C]

TABLE 1

| Polymerizable compound | Molecular weight | Double bond equivalent | CLogP |
|---|---|---|---|
| Specific polymerizable compound 1 | 2078 | 139 | 8.34 |
| Specific polymerizable compound 2 | 1748 | 146 | 4.66 |
| Specific polymerizable compound 3 | 1916 | 160 | 4.45 |
| Comparative polymerizable compound 1 | 3000 | 1272 | 1.07 |
| Comparative polymerizable compound 2 | 5600 | 221 | 1.51 |
| Comparative polymerizable compound 3 | 524 | 105 | 3.82 |
| Comparative polymerizable compound 4 | 2617 | 164 | 10.96 |

Example 1

[Production of Lithographic Printing Plate Precursor A]
<Production of Support>

In order to remove rolling oil on the surface of a 0.3 mm-thick aluminum plate (material JIS A 1050), a defatting process was carried out thereon using a 10% by mass aqueous solution of sodium aluminate at 50° C. for 30 seconds, and then the surface of the aluminum plate was grained using three implanted nylon brushes having a hair diameter of 0.3 mm and a suspension of pumice having a median diameter of 25 μm and water (specific gravity: 1.1 g/cm³) and well washed with water. The aluminum plate was etched by being immersed in a 25% by mass aqueous solution of sodium hydroxide at 45° C. for nine seconds, was washed with water, then, was further immersed in a 20% by mass aqueous solution of nitric acid at 60° C. for 20 seconds, and was washed with water. The etched amount of the grained surface was approximately 3 g/m².

Next, an electrochemical roughening process was continuously carried out thereon using an alternating current voltage of 60 Hz. An electrolytic solution was a 1% by mass aqueous solution of nitric acid (including 0.5% by mass of aluminum ions), and the liquid temperature was 50° C. The electrochemical roughening process was carried out thereon using an alternating current power supply waveform in which the time TP taken for the current value to reach the peak from zero was 0.8 msec and the duty ratio was 1:1, and the electrochemical roughening process was carried out using a trapezoidal rectangular wave alternating current and a carbon electrode as a counter electrode. As an auxiliary anode, ferrite was used. The current density was 30 A/dm² in terms of the peak value of the current, and 5% of the current coming from the power supply was divided into the auxiliary anode. Regarding the quantity of electricity during nitric acid electrolysis, the quantity of electricity was 175 C/dm² in a case in which the aluminum plate served as the positive electrode. After that, the plate was washed with water by means of spraying.

Subsequently, an electrochemical roughening process was carried out thereon using the same method as nitric acid electrolysis in a 0.5% by mass aqueous solution of hydrochloric acid (including 0.5% by mass of aluminum ions), and an electrolytic solution having a liquid temperature of 50° C. under a condition of the quantity of electricity of 50 C/dm² in a case in which the aluminum plate served as the positive electrode, and then, the plate was washed with water by means of spraying.

Next, 2.5 g/m² of a direct current anodized film was formed on the aluminum plate at a current density of 15 A/dm² using a 15% by mass aqueous solution of sulfuric acid (including 0.5% by mass of aluminum ions) as an electrolytic solution, and then washed with water and dried, thereby producing a support A. The average pore diameter of the surface layer of the anodized film (surface average pore diameter) was 10 nm.

The pore diameter of the surface layer of the anodized film was measured using a method in which the surface was observed an ultrahigh resolution SEM (S-900 manufactured by Hitachi, Ltd.) at a relatively low acceleration voltage of 12 V at a magnification of 150,000 times without carrying out a vapor deposition process or the like for imparting conductive properties, 50 pores were randomly extracted, and the average value was obtained. The standard deviation error was ±10% or less.

After that, in order to ensure the hydrophilicity of a non-image area, a silicate process was carried out on the support A using a 2.5% by mass aqueous solution of No. 3 sodium silicate at 60° C. for ten seconds and washed with water, thereby producing a support B. The attached amount of Si was 10 mg/m². The center line average roughness (Ra) of the support B was measured using a needle having a diameter of 2 μm and was found to be 0.51 μm.

A support C was produced in the same manner as in the method for producing the support A except for the fact that, in the production of the support A, the electrolytic solution in the formation of the direct current anodized film was changed to an aqueous solution of 22% by mass of phosphoric acid. The average pore diameter of the surface layer of the anodized film (surface average pore diameter) was measured using the same method as described above and found out to be 25 nm.

After that, a silicate process was carried out on the support C using an aqueous solution of 2.5% by mass of No. 3 sodium silicate at 60° C. for 10 seconds in order to ensure the hydrophilicity of a non-image area and then washed with water, thereby producing a support D. The amount of Si attached was 10 mg/m². The center line average roughness (Ra) of the support D was measured using a needle having a diameter of 2 μm and found out to be 0.52

<Formation of Image-Recording Layer>

A coating fluid for an image-recording layer (1) having the following composition was applied onto the support D by means of bar coating and was dried in an oven at 70° C. for 60 seconds, thereby forming an image-recording layer having a dried coating amount of 0.6 g/m² and producing a lithographic printing plate precursor A. The lithographic printing plate precursor A is a lithographic printing plate precursor not having a protective layer.

<Coating Fluid for Image-Recording Layer (1)>

| | |
|---|---|
| Infrared absorber (1) [illustrated below] | 0.046 g |
| Polymerization initiator (1) [illustrated below] | 0.245 g |
| Borate compound | 0.010 g |
| Sodium tetraphenyl borate | |
| Water dispersion liquid of polymer fine particle (1) (22% by mass) [illustrated below] | 10.0 g |
| Specific polymerizable compound 1 | 1.50 g |
| Mercapto-3-triazole | 0.2 g |
| Byk 336 (manufactured by Byk Chemie) | 0.4 g |
| Klucel M (manufactured by Hercules Inc.) | 4.8 g |
| ELVACITE 4026 (manufactured by Ineos Acrylics) | 2.5 g |
| n-Propanol | 55.0 g |
| 2-Butanone | 17.0 g |

The structures of the infrared absorber (1) and the polymerization initiator (1) used for the coating fluid for an image-recording layer (1) will be illustrated below.

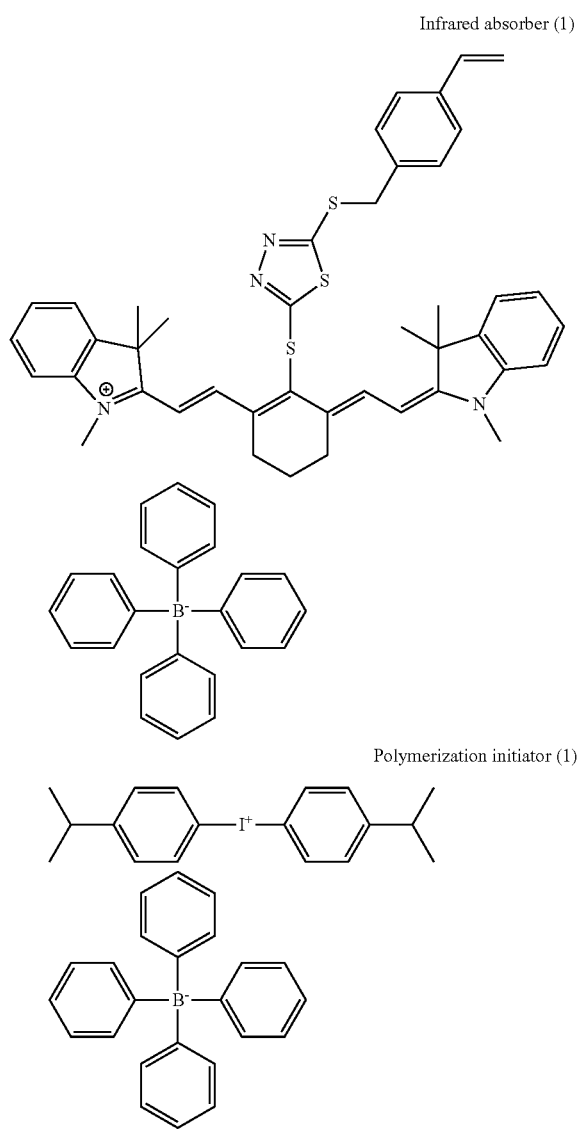

Infrared absorber (1)

Polymerization initiator (1)

The compounds described using trade names which were used for the coating fluid for an image-recording layer (1) are as described below.

Byk 336: Modified dimethyl polysiloxane copolymer (25% by mass xylene/methoxypropyl acetate solution)
Klucel M: Hydroxypropyl cellulose (2% by mass aqueous solution)
ELVACITE 4026: Hyperbranched polymethyl methacrylate (10% by mass 2-butanone solution)

A method for preparing a water dispersion liquid for a fine polymer particle (1) used in the coating fluid for an image-recording layer (1) will be described below.

<Preparation of Water Dispersion Liquid for Fine Polymer Particle (1)>

A stirrer, a thermometer, a dropping funnel, a nitrogen introduction pipe, and a reflux cooler were provided to a 1,000 ml four-neck flask, nitrogen gas was introduced thereinto, polyethylene glycol methyl ether methacrylate (PEGMA, the average repeating unit number of ethylene glycol: 50) (10 g), distilled water (200 g), and n-propanol (200 g) were added thereto while carrying out deoxidation by introducing nitrogen gas, and the components were heated until the inner temperature reached 70° C. Next, a mixture obtained by mixing styrene (St) (10 g), acrylonitrile (AN) (80 g), and 2,2'-azobisisobutyronitrile (0.8 g) in advance was added dropwise thereto for one hour. A reaction continued for five hours after the end of the dropwise addition, then, 2,2'-azobisisobutyronitrile (0.4 g) was added thereto, and the inner temperature was increased up to 80° C. Subsequently, 2,2'-azobisisobutyronitrile (0.5 g) was added thereto for six hours. At a stage of continuing the reaction for a total of 20 hours, 98% or more of polymerization had progressed, and a water dispersion liquid (1) of a fine polymer particle including PEGMA/St/AN in a mass ratio of 10/10/80 was prepared. The particle size distribution of the fine polymer particles had the maximum value at a particle diameter of 150 nm.

The particle size distribution was obtained by capturing an electron micrograph of the fine polymer particles, measuring the particle diameters of a total of 5,000 fine particles on the photograph, dividing the range of the obtained particle diameter measurement values from zero to the maximum value into 50 sections using a logarithmic scale, and plotting the appearance frequency of the respective particle diameters. Meanwhile, for a non-spherical particle, the particle diameter value of a spherical particle having the same particle area as the particle area on the photograph was considered as the particle diameter.

Example 2

A lithographic printing plate precursor was produced in the same manner as in Example 1 except for the fact that the specific polymerizable compound 1 used for the coating fluid for an image-recording layer (1) was changed to the specific polymerizable compound 2.

Example 3

A lithographic printing plate precursor was produced in the same manner as in Example 1 except for the fact that the specific polymerizable compound 1 used for the coating fluid for an image-recording layer (1) was changed to the specific polymerizable compound 3.

Comparative Example 1

A lithographic printing plate precursor was produced in the same manner as in Example 1 except for the fact that the specific polymerizable compound 1 used for the coating fluid for an image-recording layer (1) was changed to the comparative polymerizable compound 1.

Comparative Example 2

A lithographic printing plate precursor was produced in the same manner as in Example 1 except for the fact that the specific polymerizable compound 1 used for the coating fluid for an image-recording layer (1) was changed to the comparative polymerizable compound 2.

Comparative Example 3

A lithographic printing plate precursor was produced in the same manner as in Example 1 except for the fact that the specific polymerizable compound 1 used for the coating fluid for an image-recording layer (1) was changed to the comparative polymerizable compound 3.

Comparative Example 4

A lithographic printing plate precursor was produced in the same manner as in Example 1 except for the fact that the specific polymerizable compound 1 used for the coating fluid for an image-recording layer (1) was changed to the comparative polymerizable compound 4.

Example 4

A lithographic printing plate precursor was produced in the same manner as in Example 1 except for the fact that the specific polymerizable compound 1 used for the coating fluid for an image-recording layer (1) was changed to a mixture of the specific polymerizable compound 1 and dipentaerythritol pentaacrylate (in a molar ratio of 6:4).

Example 5

[Production of Lithographic Printing Plate Precursor B]
<Formation of Undercoat Layer>
A coating fluid for an undercoat layer (1) having the following composition was applied onto the support B so that the dried coating amount reached 20 mg/m², thereby forming an undercoat layer.
<Coating Fluid for Undercoat Layer (1)>

| Polymer (P-1) [illustrated below] | 0.18 g |
|---|---|
| Hydroxyethyl iminodiacetic acid | 0.10 g |
| Water | 61.4 g |

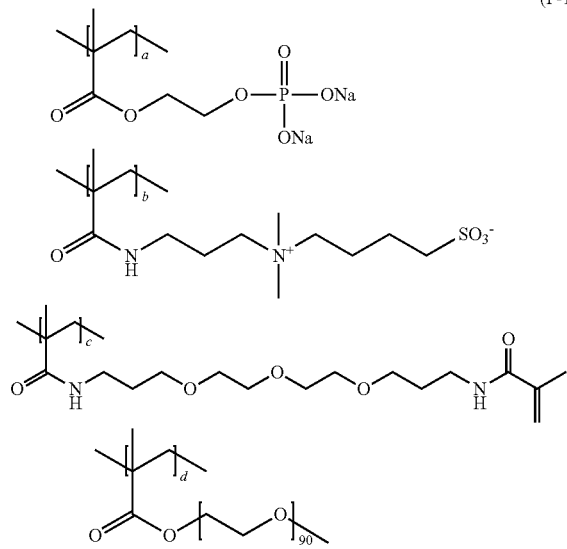

a/b/c/d = 14.2/71.8/9.0/5.0 ( % by weight)
a/b/c/d = 19.0/72.8/7.8/.04 (% of mol)
Mass average molecular weight = 200,000

A method for synthesizing the polymer P-1 will be described below.
(Synthesis of Monomer M-1)
ANCAMINE 1922A (diethylene glycol di(aminopropyl) ether, manufactured by Air Products) (200 g, 0.91 mol), distilled water (435 g), and methanol (410 g) were added to a 3 L three-neck flask and cooled to 5° C. Next, benzoic acid (222.5 g, 1.82 mol) and 4-hydroxy-2,2,6,6-tetramethylpiperidine-1-oxyl (4-OH-TEMPO) (25 mg, 0.15 mmol) were added thereto, and a methacrylic anhydride (280 g, 1.82 mmol) was added dropwise thereto so that the inner temperature of the reaction liquid reached 10° C. or lower. The reaction liquid was stirred at 5° C. for six hours and, subsequently, stirred at 25° C. for 12 hours, and then phosphoric acid (70 g) was added thereto so as to adjust the pH to 3.3. The reaction liquid was moved to a 10 L stainless steel beaker, ethyl acetate (3.7 L), methyl-tert butyl ether (MTBE) (1.5 L), and distilled water (0.65 L) were added thereto, and the components were strongly stirred and then left to stand. The upper layer (organic phase) was disposed of, then, ethyl acetate (1.8 L) was added thereto, the components were strongly stirred and then left to stand, and the upper layer was disposed of. Furthermore, ethyl acetate (1.5 L) was added thereto, the components were strongly stirred and then left to stand, and the upper layer was disposed of Next, MTBE (1.6 L) was added thereto, the components were strongly stirred and then left to stand, and the upper layer was disposed of. 4-OH-TEMPO (62.5 mg, 0.36 mmol) was added to the obtained aqueous solution, thereby obtaining an aqueous solution of a monomer M-1 (1.2 kg, 20.1% by mass in terms of the solid content).
(Purification of Monomer M-2)
LIGHT ESTER P-1M (2-methacryloyloxyethyl acid phosphate, manufactured by Kyoeisha Chemical Co., Ltd.) (420 g), diethylene glycol dibutyl ether (1,050 g), and distilled water (1,050 g) were added to a separating funnel, strongly stirred, and then left to stand. The upper layer was disposed of, diethylene glycol dibutyl ether (1,050 g) was added thereto, and the components were strongly stirred and then left to stand. The upper layer was disposed of, thereby obtaining an aqueous solution of a monomer M-2 (1.3 kg, 10.5% by mass in terms of the solid content).
(Synthesis of Polymer P-1)
Distilled water (600.6 g), the aqueous solution of the monomer M-1 (33.1 g), and a monomer M-3 described below (46.1 g) were added to a 3 L three-neck flask and heated to 55° C. in a nitrogen atmosphere. Next, a dropwise addition liquid (1) described below was added dropwise thereto for two hours, the components were stirred for 30 minutes, then, VA-046B (manufactured by Wako Pure Chemical Corporation) (3.9 g) was added thereto, and the components were heated to 80° C. and stirred for 1.5 hours. The reaction liquid was returned to room temperature, and then an aqueous solution of 30% by mass of sodium hydroxide (175 g) was added thereto, thereby adjusting the pH to 8.3. Next, 4-OH-TEMPO (152.2 mg) was added thereto, and the components were heated to 53° C. A methacrylic anhydride (66.0 g) was added thereto, and the components were stirred at 53° C. for three hours. The components were returned to room temperature, then, the reaction liquid was moved to a 10 L stainless steel beaker, MTBE (1,800 g) was added thereto, the components were strongly stirred and then left to stand, and the upper layer was disposed of A washing operation using MTBE (1,800 g) was further repeated twice in the same manner, and then distilled water (1,700 g) and 4-OH-TEMPO (212 mg) were added to the obtained water phase, thereby obtaining a polymer P-1 (4.1 kg, 11.0% in terms of the solid content) as a homogeneous solution. The mass average molecular weight (Mw) converted to a polyethylene glycol equivalent value by the gel permeation chromatography (GPC) method was 200,000.

Dropwise Addition Liquid (1)

| | |
|---|---|
| The aqueous solution of the monomer M-1 | 132.4 g |
| The aqueous solution of the monomer M-2 | 376.9 g |
| Monomer M-3 [illustrated below] | 184.3 g |
| BREMMER PME 4000 (manufactured by NOF Corporation) | 15.3 g |
| VA-046B (manufactured by Wako Pure Chemical Corporation) | 3.9 g |
| Distilled water | 717.4 g |

BREMMER PME 4000: Methoxy polyethylene glycol methacrylate (the number of the oxyethylene unit repeated: 90)

VA-046B: 2,2'-Azobis[2-(2-imidazolin-2-yl)propane] disulfate dihydrate

Monomer M-3

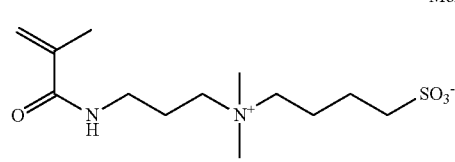

<Formation of Image-Recording Layer>

A coating fluid for an image-recording layer (2) having the following composition was applied onto the undercoat layer by means of bar coating and was dried in an oven at 100° C. for 60 seconds, thereby forming an image-recording layer having a dried coating amount of 1.0 g/m².

The coating fluid for the image-recording layer (2) was prepared by mixing and stirring the following photosensitive liquid and a micro gel liquid immediately before the coating.

<Photosensitive Liquid>

| | |
|---|---|
| Binder polymer (1) [illustrated below] | 0.240 g |
| Polymerization initiator (2) [illustrated below] | 0.245 g |
| Infrared absorber (2) [illustrated below] | 0.046 g |
| Borate compound | 0.010 g |
| Sodium tetraphenyl borate | |
| Specific polymerizable compound 1 | 0.192 g |
| Low-molecular-weight hydrophilic compound | 0.062 g |
| Tris(2-hydroxyethyl)isocyanurate | |
| Low-molecular-weight hydrophilic compound (1) [illustrated below] | 0.050 g |
| Sensitization agent | 0.055 g |
| Phosphonium compound (1) [illustrated below] | |
| Sensitization agent | 0.018 g |
| Benzyl-dimethyl-octylammonium•PF₆ salt | |
| Sensitization agent | 0.035 g |
| Ammonium group-containing polymer (1) [illustrated below, reducing specific viscosity of 44 ml/g] | |
| Fluorine-based surfactant (1) [illustrated below] | 0.008 g |
| 2-Butanone | 1.091 g |
| 1-Methoxy-2-propanol | 8.609 g |

<Micro Gel Liquid>

| | |
|---|---|
| Micro gel (1) | 2.640 g |
| Distilled water | 2.425 g |

The structures of the binder polymer (1), the polymerization initiator (2), the infrared absorber (2), the low-molecular-weight hydrophilic compound (1), the phosphonium compound (1), the ammonium group-containing polymer (1), and the fluorine-based surfactant (1) which were used for the photosensitive liquid will be illustrated below.

Binder polymer (1)

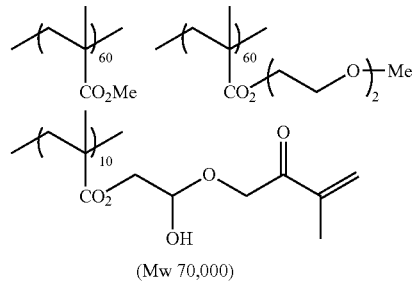

(Mw 70,000)

Polymerization initiator (2)

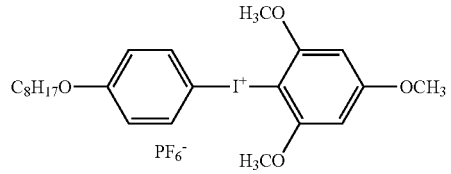

Infared absorbent (2)

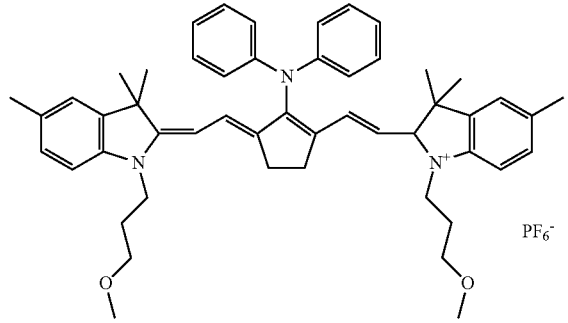

Low-molecular-weight hydrophilic compound (1)

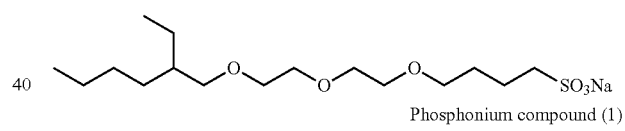

Phosphonium compound (1)

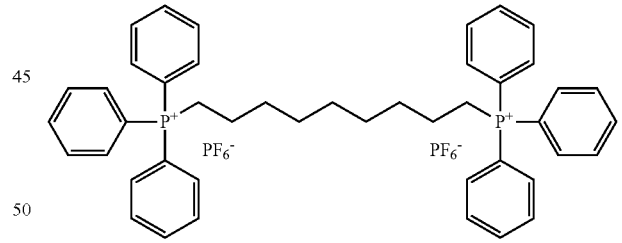

Ammonium group-containing polymer (1)

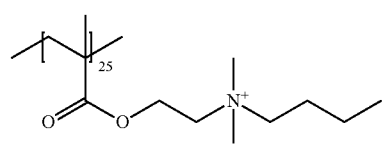

Fluorine-based surfactant (1)

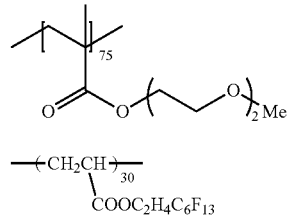

-continued

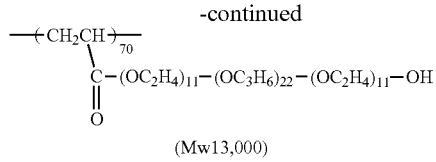

(Mw 13,000)

A method for preparing a micro gel (1) used for the micro gel liquid will be described below.

<Preparation of Polyhydric Isocyanate Compound (1)>

Bismuth tris(2-ethylhexanoate) (NEOSTAN U-600, manufactured by Nitto Kasei Co., Ltd.) (43 mg) was added to an ethyl acetate (25.31 g) suspended solution of isophorone diisocyanate (17.78 g, 80 mmol) and the following polyhydric phenol compound (1) (7.35 g, 20 mmol), and the components were stirred. The reaction temperature was set to 50° C. in a case in which the generation of heat settled, and the components were stirred for three hours, thereby obtaining an ethyl acetate solution of a polyhydric isocyanate compound (1) (50% by mass).

Polyhydric phenol compound (1)

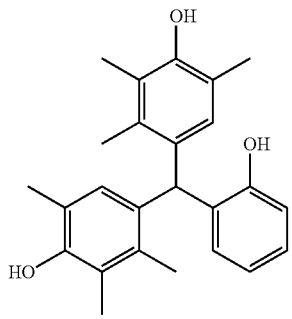

<Preparation of Micro Gel (1)>

Oil-phase components described below and a water-phase component described below were mixed together and emulsified at 12,000 rpm for 10 minutes using a homogenizer. The obtained emulsion was stirred at 45° C. for four hours, a 10% by mass aqueous solution of 1,8-diazabicyclo[5.4.0]undec-7-ene-octanoic acid salt (U-CAT SA102, manufactured by San-Apro Ltd.) (5.20 g) was added thereto, and the components were stirred at room temperature for 30 minutes and left to stand at 45° C. for 24 hours. Adjustment was made using distilled water so that the concentration of the solid content reached 20% by mass, thereby obtaining a water dispersion liquid of a micro gel (1). The average particle diameter was measured using a light scattering method and found out to be 0.28 μm.

(Oil-Phase Components)

(Component 1) Ethyl acetate: 12.0 g (Component 2) An adduct obtained by adding trimethylolpropane (6 mol) and xylene diisocyanate (18 mol) and adding methyl single terminated polyoxyethylene (1 mol, the number of the oxyethylene unit repeated: 90) thereto (a solution of 50% by mass of ethyl acetate, manufactured by Mitsui Chemicals Inc.): 3.76 g (Component 3) Polyhydric isocyanate compound (1) (as a solution of 50% by mass of ethyl acetate): 15.0 g (Component 4) An ethyl acetate solution of 65% by mass of dipentaerythritol pentaacrylate (SR-399, Sartomer Japan Inc.): 11.54 g (Component 5) An ethyl acetate solution of 10% of a sulfonate-type surfactant (BIONINE A-41-C, manufactured by Takemoto Oil & Fat Co., Ltd.): 4.42 g (Water-Phase Component)

Distilled Water: 46.87 g

<Formation of Protective Layer>

A coating fluid for a protective layer having the following composition was applied onto the image-recording layer by means of bar coating and dried in an oven at 120° C. for 60 seconds, thereby forming a protective layer having a dried coating amount of 0.15 g/m² and thus respectively producing lithographic printing plate precursors B.

<Coating Fluid for Protective Layer>

| | |
|---|---|
| Inorganic lamellar compound dispersion liquid (1) [described below] | 1.5 g |
| Aqueous solution of 6% by mass of polyvinyl alcohol (CKS50 manufactured by The Nippon Synthetic Chemical Industry Co., Ltd., sulfonic acid-modified, degree of saponification of 99% by mol or higher, degree of polymerization of 300) | 0.55 g |
| Aqueous solution of 6% by mass of polyvinyl alcohol (PVA-405 manufactured by Kuraray Co., Ltd., degree of saponification of 81.5% by mol, degree of polymerization of 500) | 0.03 g |
| Aqueous solution of 1% by mass of a surfactant (polyoxyethylene lauryl ether, EMALEX 710, manufactured by Nihon Emulsion Co., Ltd.) | 0.86 g |
| Ion exchange water | 6.0 g |

A method for preparing the inorganic lamellar compound dispersion liquid (1) used for the coating fluid for a protective layer will be described below.

<Preparation of Inorganic Lamellar Compound Dispersion Liquid (1)>

Synthetic mica (SOMASIF ME-100 manufactured by Co-op Chemical Co., Ltd.) (6.4 g) was added to ion exchange water (193.6 g) and was dispersed using a homogenizer until the average particle diameter (the laser scattering method) reached 3 μm. The aspect ratio of the obtained dispersed particles was 100 or higher.

[Evaluation of Lithographic Printing Plate Precursors]

For the respective lithographic printing plate precursors described above, the on-machine developability (immediately after manufactured), the on-machine developability (after one hour of natural aging), the printing resistance, and the transfer were evaluated as described below. The evaluation results are shown in Table 2.

(1) On-Machine Developability (Immediately after Manufactured)

The lithographic printing plate precursors (immediately after manufactured) were exposed using a LUXEL PLATESETTER T-6000III manufactured by Fujifilm Corporation which was equipped with an infrared semiconductor laser under conditions of an external surface drum rotation speed of 1,000 rpm, a laser output of 70%, and a resolution of 2,400 dpi. Exposed images were provided with solid images and 50% halftone dot charts of 20 μm dot FM screens.

Without carrying out a development process on the exposed lithographic printing plate precursors, the lithographic printing plate precursors were attached to the plate trunk of a printer LITHRONE 26 manufactured by Komori Corporation. Dampening water and ink were supplied using dampening water of ECOLITY-2 (manufactured by Fujian Corporation)/tap water=2/98 (capacity ratio) and Values-G (N) BLACK INK (manufactured by DIC Graphics Corporation) and using the standard automatic printing start method of LITHRONE 26, and then printing was carried out on 100 pieces of TOKUBISHI art paper (76.5 kg) (manufactured by Mitsubishi Paper Mills limited) at a printing rate of 10,000 pieces per hour.

The on-machine development of non-exposed portions in the image-recording layer was completed on the printer, and the number of pieces of printing paper required until ink was not transferred to the non-image areas was measured and evaluated as the on-machine developability. A smaller number of pieces of printing paper indicates superior on-machine developability.

(2) On-Machine Developability (after One Year of Natural Aging)

A forcible aging condition corresponding to after one year of natural aging (in an environment of a temperature of 25° C. and a humidity of 50%) was used. That is, a lithographic printing plate precursor that had been stored for three days in an environment of a temperature of 45° C. and a humidity of 70% was used, and the on-machine developability was evaluated in the same manner as in the above-described (1). As the number of pieces decreases, the on-machine developability is more favorable.

(3) Printing Resistance

After the above-described on-machine developability (1) was evaluated, printing was further continued. As the number of pieces of printed paper increased, the image-recording layer gradually wore, and thus the ink density on printed matters decreased. The number of pieces of printed paper until the value of the halftone dot area ratio of FM screen 50% halftone dots on printed matters measured using a gretag density meter decreased to be 5% lower than the measurement value of a 100th printed piece of paper was measured, and the printing resistance was evaluated. As the number of pieces increases, the printing resistance is more favorable.

(4) Transfer

A 3 mm-thick stainless steel sheet (SUS sheet) was brought into contact with an image-recording layer-applied surface of a sample that had been left to stand for one minute without being subjected to a drying step after the application of the image-recording layer in the manufacturing process of the lithographic printing plate precursor for three seconds and peeled off, and the presence or absence of the transfer of the polymerizable compound to the SUS sheet was visually observed, thereby evaluating transfer to a manufacturing device. The evaluation was carried out according to the following standards. Standards A and B are in a practically permissible range.

A: No transfer is observed.
B: Slight transfer is observed.
C: Transfer is clearly observed.

TABLE 2

| | On-machine developability (immediately after manufacturing) | On-machine developability (after one year of natural aging) | Printing resistance | Transfer |
|---|---|---|---|---|
| Example 1 | 15 pieces | 20 pieces | 100,000 pieces | A |
| Example 2 | 10 pieces | 15 pieces | 100,000 pieces | A |
| Example 3 | 10 pieces | 15 pieces | 100,000 pieces | A |
| Example 4 | 10 pieces | 15 pieces | 90,000 pieces | B |
| Example 5 | 12 pieces | 15 pieces | 100,000 pieces | A |
| Comparative Example 1 | 10 pieces | 15 pieces | 70,000 pieces | A |
| Comparative Example 2 | 20 pieces | 80 pieces | 90,000 pieces | A |
| Comparative Example 3 | 10 pieces | 10 pieces | 70,000 pieces | C |
| Comparative Example 4 | 20 pieces | 80 pieces | 100,000 pieces | A |

From the results shown in Table 2, it is found that the lithographic printing plate precursor according to the embodiment of the present invention having the image-recording layer containing the specific polymerizable compound satisfying the three requirements of a) a molecular weight of 1,500 to 3,000, b) a double bond equivalent of 200 or less, and c) a CLog P of 9 or less is capable of producing a lithographic printing plate that is excellent in terms not only of on-machine developability immediately after manufacturing but also of on-machine developability after one year of natural aging and has excellent printing resistance. In contrast, the lithographic printing plate precursors of the comparative examples having an image-recording layer containing a polymerizable compound not satisfying at least one of the above-described three requirements are poor in terms of any of on-machine developability immediately after manufacturing, on-machine developability after one hour of natural aging, printing resistance, and transfer.

Example 6

[Production of Lithographic Printing Plate Precursor C]
<Production of Support E>

On a 0.3 mm-thick aluminum plate (material: JIS A 1050), individual processes of (a) to (i) below were continuously carried out, thereby carrying out a surface treatment. Meanwhile, after each process and water washing, liquid was drained using a nip roller.

(A) Alkali Etching Process

On the aluminum plate, an etching process was carried out by means of spraying using an aqueous solution having a sodium hydroxide concentration of 2.6% by mass, an aluminum ion concentration of 6.5% by mass, and a temperature of 70° C., thereby dissolving 6 g/m² of the aluminum plate. After that, the plate was washed with water by means of spraying.

(b) Desmut Process

On the aluminum plate, a desmut process was carried out by means of spraying using an aqueous solution having a temperature of 30° C. and a nitric acid concentration of 1% by mass (including 0.5% by mass of aluminum ions) and then the plate was washed with water by means of spraying. As the nitric acid aqueous solution used in the desmut process, a waste liquid of a step of carrying out an electrochemical roughening process in a nitric acid aqueous solution using an alternating current was used.

(c) Electrochemical Roughening Process

An electrochemical roughening process was continuously carried out using an alternating current voltage of 60 Hz. An electrolytic solution was a 10.5 g/L aqueous solution of nitric acid (including 5 g/L of aluminum ions and 0.007% by mass of ammonium ions), and the liquid temperature was 50° C. The electrochemical roughening process was carried out thereon using an alternating current power supply waveform in which the time TP taken for the current value to reach the peak from zero was 0.8 msec and the duty ratio was 1:1, and the electrochemical roughening process was carried out using a trapezoidal rectangular wave alternating current and a carbon electrode as a counter electrode. As the auxiliary anode, ferrite was used. The current density was 30 A/dm$^2$ in terms of the peak value of the current, and the quantity of electricity was 220 C/dm$^2$ in terms of the sum of the quantities of electricity in a case in which the aluminum plate was the positive electrode. Five percent of the current coming from the power supply was divided into the auxiliary anode. After that, the plate was washed with water by means of spraying.

(d) Alkali Etching Process

On the aluminum plate, an etching process was carried out at 32° C. by spraying an aqueous solution having a sodium hydroxide concentration of 26% by mass, an aluminum ion concentration of 6.5% by mass, 0.25 g/m$^2$ of the aluminum plate was dissolved, a smut component including, as a main body, aluminum hydroxide generated at the time of the electrochemical roughening process was removed, and, additionally, the edge portion of the generated pit was dissolved to smoothen the edge portion. After that, the plate was washed with water by means of spraying.

(e) Desmut Process

A desmut process was carried out by spraying an aqueous solution having a sulfuric acid concentration of 15% by mass of a temperature of 30° C. (including 4.5% by mass of aluminum ions) and then the plate was washed with water by means of spraying. As the nitric acid aqueous solution used in the desmut process, the waste liquid of the step of carrying out the electrochemical roughening process in the nitric acid aqueous solution using an alternating current was used.

(f) Electrochemical Roughening Process

An electrochemical roughening process was continuously carried out using an alternating current voltage of 60 Hz. An electrolytic solution was a 2.5 g/L aqueous solution of hydrochloric acid (including 5 g/L of aluminum ions), and the temperature was 35° C. The electrochemical roughening process was carried out thereon using an alternating current power supply waveform in which the time TP taken for the current value to reach the peak from zero was 0.8 msec and the duty ratio was 1:1, and the electrochemical roughening process was carried out using a trapezoidal rectangular wave alternating current and a carbon electrode as a counter electrode. As the auxiliary anode, ferrite was used. The current density was 25 A/dm$^2$ in terms of the peak value of the current, and the quantity of electricity was 50 C/dm$^2$ in terms of the sum of the quantities of electricity in a case in which the aluminum plate was the positive electrode. After that, the plate was washed with water by means of spraying.

(g) Alkali Etching Process

On the aluminum plate, an etching process was carried out at 32° C. by spraying an aqueous solution having a sodium hydroxide concentration of 26% by mass, an aluminum ion concentration of 6.5% by mass, 0.1 g/m$^2$ of the aluminum plate was dissolved, a smut component including, as a main body, aluminum hydroxide generated at the time of the electrochemical roughening process was removed, and, additionally, the edge portion of the generated pit was dissolved to smoothen the edge portion. After that, the plate was washed with water by means of spraying.

(h) Anodization Process 2.5 g/m$^2$ of a direct current anodized film was formed on the aluminum plate at a current density of 15 A/dm$^2$ using a 15% by mass aqueous solution of sulfuric acid (including 0.5% by mass of aluminum ions) as an electrolytic solution, washed with water, and dried. The average pore diameter of the surface layer of the anodized film (surface-average pore diameter) was 10 nm.

The pore diameter of the surface layer of the anodized film was measured using a method in which the surface was observed an ultrahigh resolution SEM (S-900 manufactured by Hitachi, Ltd.) at a relatively low acceleration voltage of 12 V at a magnification of 150,000 times without carrying out a vapor deposition process or the like for imparting conductive properties, 50 pores were randomly extracted, and the average value was obtained. The standard deviation error was ±10% or less.

(i) Hydrophilization Process

In order to ensure the hydrophilicity of a non-image area, a silicate process was carried out on the aluminum plate using a 2.5% by mass aqueous solution of No. 3 sodium silicate at 60° C. for ten seconds and washed with water, thereby producing a support E. The attached amount of Si was 9.5 mg/m$^2$. The center line average roughness (Ra) of the support E was measured using a needle having a diameter of 2 μm and was found to be 0.27 μm.

<Formation of Undercoat Layer>

The coating fluid for an undercoat layer (2) having the following composition was applied onto the support E so that the dried coating amount reached 20 mg/m$^2$, thereby forming an undercoat layer.

<Coating Fluid for Undercoat Layer (2)>

| | |
|---|---|
| Polymer (P-1) [illustrated above] | 0.18 g |
| Tetrasodium ethylenediaminetetraacetate | 0.10 g |
| Polyoxyethylene lauryl ether | 0.03 g |
| Water | 61.39 g |

<Formation of Image-Recording Layer>

The coating fluid for an image-recording layer (3) having the following composition was applied onto the undercoat layer by means of bar coating and dried in an oven at 100° C. for 60 seconds, thereby forming an image-recording layer having a dried coating amount of 1.0 g/m$^2$.

The coating fluid for the image-recording layer (3) was prepared by mixing and stirring the polymer particle immediately before the application of the following photosensitive liquid and the following micro gel liquid.

<Photosensitive Liquid>

| | |
|---|---|
| Binder polymer (2) [illustrated below] | 0.240 g |
| Polymerization initiator (2) [illustrated above] | 0.245 g |
| Infrared absorber (2) [illustrated above] | 0.046 g |
| Borate compound | 0.010 g |
| Sodium tetraphenyl borate | |
| Specific polymerizable compound 1 | 0.192 g |
| Low-molecular-weight hydrophilic compound | 0.062 g |
| Tris(2-hydroxyethyl)isocyanurate | |
| Low-molecular-weight hydrophilic compound (1) [illustrated above] | 0.050 g |
| Sensitization agent | 0.055 g |
| Phosphonium compound (1) [illustrated above] | |
| Sensitization agent | 0.018 g |
| Benzyl-dimethyl-octylammonium•PF$_6$ salt | |
| Sensitization agent | 0.035 g |
| Ammonium group-containing polymer (1) [illustrated above, reducing specific viscosity of 44 ml/g] | |
| Coloring agent [illustrated below] | 0.030 g |
| Fluorine-based surfactant (1) [illustrated above] | 0.008 g |
| 2-Butanone | 1.091 g |
| 1-Methoxy-2-propanol | 8.609 g |

<Micro Gel Liquid>

| | |
|---|---|
| Micro gel (1) [illustrated above]: | 2.640 g |
| Distilled water: | 2.425 g |

The structures of the binder polymer (2) and the coloring agent which were used for the photosensitive liquid will be illustrated below.

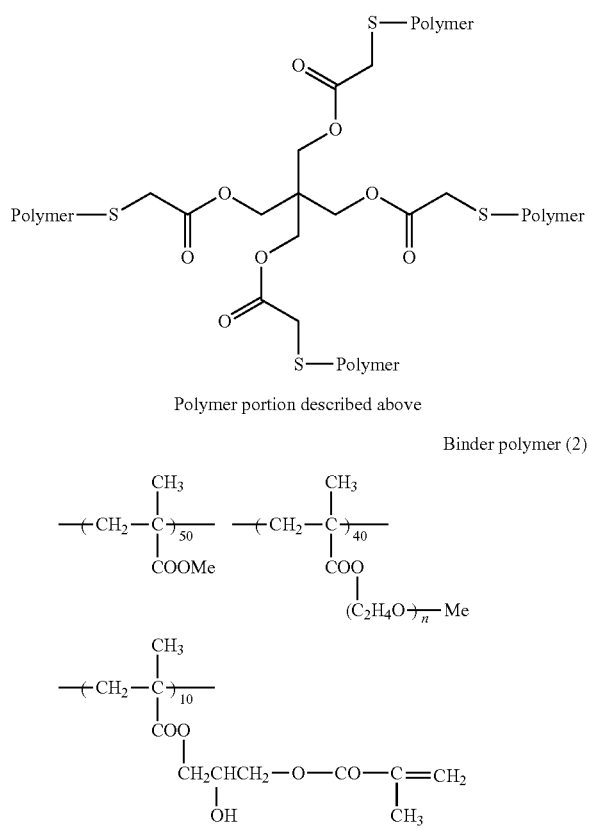

Binder polymer (2)

In the binder polymer (2), Me represents a methyl group, and numerical values on the lower right side of parentheses of individual constituent units represent molar ratios.

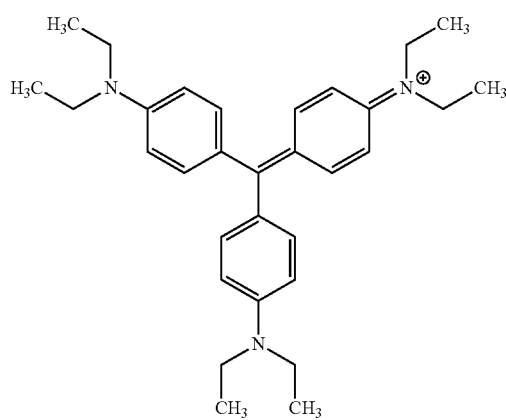

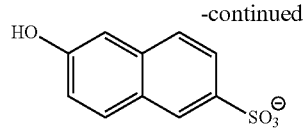

Coloring agent

<Formation of Protective Layer>

The same coating fluid for a protective layer as the lithographic printing plate precursor B was applied onto the image-recording layer by means of bar coating and dried in an oven at 120° C. for 60 seconds, thereby forming a protective layer having a dried coating amount of 0.15 g/m² and producing a lithographic printing plate precursor C.

Example 7

A lithographic printing plate precursor was produced in the same manner as in Example 6 except for the fact that the specific polymerizable compound 1 used for the coating fluid for an image-recording layer (3) was changed to the specific polymerizable compound 2.

Example 8

A lithographic printing plate precursor was produced in the same manner as in Example 6 except for the fact that the specific polymerizable compound 1 used for the coating fluid for an image-recording layer (3) was changed to the specific polymerizable compound 3.

Comparative Example 5

A lithographic printing plate precursor was produced in the same manner as in Example 6 except for the fact that the specific polymerizable compound 1 used for the coating fluid for an image-recording layer (3) was changed to the comparative polymerizable compound 1.

Comparative Example 6

A lithographic printing plate precursor was produced in the same manner as in Example 6 except for the fact that the specific polymerizable compound 1 used for the coating fluid for an image-recording layer (3) was changed to the comparative polymerizable compound 2.

Comparative Example 7

A lithographic printing plate precursor was produced in the same manner as in Example 6 except for the fact that the specific polymerizable compound 1 used for the coating fluid for an image-recording layer (3) was changed to the comparative polymerizable compound 3.

Comparative Example 8

A lithographic printing plate precursor was produced in the same manner as in Example 6 except for the fact that the specific polymerizable compound 1 used for the coating fluid for an image-recording layer (3) was changed to the comparative polymerizable compound 4.

[Evaluation of Lithographic Printing Plate Precursors]

For the respective lithographic printing plate precursors of Examples 6 to 8 and Comparative Examples 5 to 8, developability (immediately after manufacturing), developability (after one year of natural aging), printing resistance, and transfer were evaluated as described below. The evaluation results are shown in Table 3.

(1) Developability (Immediately after Manufacturing)

The lithographic printing plate precursors (immediately after manufactured) were exposed using a LUXEL PLATE-SETTER T-6000III manufactured by Fujifilm Corporation which was equipped with an infrared semiconductor laser under conditions of an external surface drum rotation speed of 1,000 rpm, a laser output of 70%, and a resolution of 2,400 dpi. Exposed images were provided with solid images and 50% halftone dot charts of FM screens.

A development process was carried out on the exposed lithographic printing plates using Clean Out Unit+ C85 manufactured by Glunz & Jensen at a transportation rate of 60 cm/min and 20° C., thereby producing lithographic printing plates. In the development process, a developer having the following composition was used. This developer is a developer capable of carrying out the removal of the protective layer, development, and gum pulling with a single liquid.

<Developer>

| | |
|---|---|
| PELEX NBL | 4.9 parts by mass |
| Sodium alkyl naphthalene sulfonate | |
| (anionic surfactant manufactured by KAO | |
| Corporation) | |
| NEWCOL B13 | 4.9 parts by mass |
| Polyoxyethylene aryl ether | |
| (nonionic surfactant manufactured by | |
| Nippon Nyukazai Co., Ltd.) | |
| SURFYNOL 2502 | 0.6 parts by mass |
| (manufactured by Air Products and | |
| Chemicals, Inc.) | |
| Benzyl alcohol (manufactured by Wako | 0.8 parts by mass |
| Pure Chemical Corporation): | |
| Sodium gluconate (manufactured by Fuso | 3.0 parts by mass |
| Chemical Co., Ltd.): | |
| Sodium hydrogen phosphate (manufactured | 0.3 parts by mass |
| by Wako Pure Chemical Corporation): | |
| Sodium hydrogen carbonate (manufactured | 0.3 parts by mass |
| by Wako Pure Chemical Corporation): | |
| Defoamer | 0.01 parts by mass |
| (SILCOLAPSE 432 manufactured by | |
| Bluester Silicones) | |
| Water: | 85.49 parts by mass |
| | (pH: 8.6) |

The concentration in a non-exposed portion of the obtained lithographic printing plate was measured, and the developability was evaluated. That is, the cyan concentration in the non-exposed portion of the lithographic printing plate was measured using a spectrophotometer (SpectroEye manufactured by X-Rite, Incorporated). The difference (AD) between the value of the cyan concentration of the obtained non-exposed portion and the value of the cyan concentration of the support E was computed, and the developability was evaluated according to the following standards. A lower AD indicates a smaller area of the image-recording layer remaining in the non-image area after the development process and more favorable developability. Standards A and B are in a practically permissible range.

A: ΔD≤0.01
B: 0.01<ΔD≤0.03
C: 0.03<ΔD (2) Developability (after One Year of Natural Aging)

A forcible aging condition corresponding to after one year of natural aging (in an environment of a temperature of 25° C. and a humidity of 50%) was used. That is, a lithographic printing plate precursor that had been stored for three days in an environment of a temperature of 45° C. and a humidity of 70% was used, and the developability was evaluated in the same manner as in the above-described (1).

(3) Printing Resistance

The developed lithographic printing plates obtained in the same manner as in the above-described (1) were attached to the plate trunk of a printer LITHRONE 26 manufactured by Komori Corporation. Dampening water and ink were supplied using dampening water of ECOLITY-2 (manufactured by Fujifilm Corporation)/tap water-2/98 (capacity ratio) and Values-G(N) BLACK INK (manufactured by DIC Graphics Corporation) and using the standard automatic printing start method of LITHRONE 26, and then printing was carried out on TOKUBISHI art paper (76.5 kg) (manufactured by Mitsubishi Paper Mills limited) at a printing rate of 10,000 pieces per hour. As the number of printed pieces increased, the image-recording layer gradually wore, and thus the ink density on printed matters decreased. The number of pieces of printed paper until the value of the halftone dot area ratio of FM screen 50% halftone dots on printed matters measured using a gretag density meter decreased to be 5% lower than the measurement value obtained in a case in which printing was carried out on a 100th piece of paper was measured, and the printing resistance was evaluated. As the number of pieces increases, the printing resistance is more favorable.

(4) Transfer

A 3 mm-thick stainless steel sheet (SUS sheet) was brought into contact with an image-recording layer-applied surface of a sample that had been left to stand for one minute without being subjected to a drying step after the application of the image-recording layer in the manufacturing process of the lithographic printing plate precursor for three seconds and peeled off, and the presence or absence of the transfer of the polymerizable compound to the SUS sheet was visually observed, thereby evaluating transfer to a manufacturing device. The evaluation was carried out according to the following standards. Standards A and B are in a practically permissible range.

A: No transfer is observed.
B: Slight transfer is observed.
C: Transfer is clearly observed.

TABLE 3

| | Developability (immediately after manufacturing) | Developability (after one year of natural aging) | Printing resistance | Transfer |
|---|---|---|---|---|
| Example 6 | A | A | 95,000 pieces | A |
| Example 7 | A | A | 90,000 pieces | A |
| Example 8 | A | A | 90,000 pieces | A |
| Comparative Example 5 | A | A | 60,000 pieces | A |
| Comparative Example 6 | A | C | 80,000 pieces | A |
| Comparative Example 7 | A | A | 60,000 pieces | C |
| Comparative Example 8 | B | C | 90,000 pieces | A |

From the results shown in Table 3, it is found that the lithographic printing plate precursor according to the embodiment of the present invention including the image-recording layer containing the specific polymerizable compound satisfying the three requirements of a) a molecular weight of 1,500 to 3,000, b) a double bond equivalent of 200 or less, and c) a CLog P of 9 or less is capable of producing a lithographic printing plate that is excellent in terms not only of developability immediately after manufacturing but also of developability after one year of natural aging and has excellent printing resistance. In contrast, the lithographic printing plate precursors of the comparative examples having an image-recording layer containing a polymerizable compound not satisfying at least one of the above-described three requirements are poor in terms of any of developability immediately after manufacturing, developability after one hour of natural aging, printing resistance, and transfer.

According to the present invention, it is possible to provide a lithographic printing plate precursor from which a lithographic printing plate that is excellent in terms not only of on-machine developability immediately after manufacturing but also of on-machine developability after one year of natural aging and has excellent printing resistance can be produced.

Furthermore, according to the present invention, it is possible to provide a lithographic printing plate precursor from which a lithographic printing plate that is excellent in terms not only of developability immediately after manufacturing but also of developability after one year of natural aging and has excellent printing resistance can be produced.

Furthermore, according to the present invention, it is possible to provide a method for producing a lithographic printing plate for which the lithographic printing plate precursor is used.

The present invention has been described in detail with reference to specific embodiments, but it is clear to a person skilled in the related art that a variety of modifications or corrections can be added thereto within the concept and scope of the present invention.

The present application claims priority on the basis of a Japanese Patent Application filed on May 31, 2017 (JP2017-108565) and a Japanese Patent Application filed on Sep. 27, 2017 (JP2017-186808), the contents of which are incorporated herein by reference.

What is claimed is:

1. A lithographic printing plate precursor comprising:
   an image-recording layer on an aluminum support,
   wherein the image-recording layer contains a polymerization initiator, an infrared absorber, a polymer particle, and a first polymerizable compound, and the first polymerizable compound has a) a molecular weight of 1,500 to 3,000, b) a double bond equivalent of 200 or less, and c) a CLog P of 5 or less.

2. The lithographic printing plate precursor according to claim 1,
   wherein the first polymerizable compound is a polymerizable compound having a urethane bond.

3. The lithographic printing plate precursor according to claim 1,
   wherein the image-recording layer further contains a second polymerizable compound different from the first polymerizable compound.

4. The lithographic printing plate precursor according to claim 3,
   wherein the second polymerizable compound is a polymerizable compound having an acrylic group or a methacrylic group.

5. The lithographic printing plate precursor according to claim 3,
   wherein a molecular weight of the second polymerizable compound is 1,500 or less.

6. The lithographic printing plate precursor according to claim 4,
   wherein a molecular weight of the second polymerizable compound is 1,500 or less.

7. The lithographic printing plate precursor according to claim 1,
   wherein the polymer particle is a polymer particle comprising at least one of a monomer unit derived from a styrene compound and a monomer unit derived from a (meth)acrylonitrile compound.

8. The lithographic printing plate precursor according to claim 7,
   wherein the polymer particle further comprises a monomer unit derived from a poly(ethylene glycol) alkyl ether methacrylate compound.

9. The lithographic printing plate precursor according to claim 1,
   wherein the image-recording layer further contains a borate compound.

10. The lithographic printing plate precursor according to claim 1,
    wherein the image-recording layer further contains an acid color developing agent.

11. The lithographic printing plate precursor according to claim 1 which is for on-machine development.

12. A method for producing a lithographic printing plate comprising:
    image-exposing the lithographic printing plate precursor according to claim 1; and
    removing a non-exposed portion of the image-recording layer of the lithographic printing plate precursor using at least one of printing ink and dampening water.

13. A method for producing a lithographic printing plate comprising:
    image-exposing the lithographic printing plate precursor according to claim 1; and
    removing a non-exposed portion of the image-recording layer of the lithographic printing plate precursor using a developer having a pH of 2 to 11.

* * * * *